(12) United States Patent
Yamazaki

(10) Patent No.: US 7,635,617 B2
(45) Date of Patent: Dec. 22, 2009

(54) MANUFACTURING METHOD OF SEMICONDUCTOR SUBSTRATE AND MANUFACTURING METHOD OF SEMICONDUCTOR DEVICE

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 22 days.

(21) Appl. No.: 12/053,912

(22) Filed: Mar. 24, 2008

(65) Prior Publication Data

US 2008/0268618 A1   Oct. 30, 2008

(51) Int. Cl.
*H01L 21/84* (2006.01)

(52) U.S. Cl. ............... 438/149; 438/455; 257/E21.561

(58) Field of Classification Search ......... 438/151–166, 438/455–459; 257/E21.561
See application file for complete search history.

(56) References Cited

U.S. PATENT DOCUMENTS

| | | | |
|---|---|---|---|
| 5,236,850 A * | 8/1993 | Zhang | .......................... 438/166 |
| 5,254,208 A * | 10/1993 | Zhang | .......................... 438/479 |
| 5,374,564 A | 12/1994 | Bruel | |
| 5,492,843 A | 2/1996 | Adachi et al. | |
| 5,837,619 A | 11/1998 | Adachi et al. | |
| 5,876,497 A | 3/1999 | Atoji | |
| 6,008,076 A | 12/1999 | Codama et al. | |
| 6,103,009 A | 8/2000 | Atoji | |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,479,334 B1 | 11/2002 | Codama et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 6,908,797 B2 | 6/2005 | Takano | |
| 7,119,365 B2 | 10/2006 | Takafuji et al. | |
| 7,176,525 B2 | 2/2007 | Fukunaga | |
| 7,199,024 B2 | 4/2007 | Yamazaki | |
| 7,256,776 B2 | 8/2007 | Yamazaki et al. | |

(Continued)

FOREIGN PATENT DOCUMENTS

JP      02-054532      2/1990

(Continued)

*Primary Examiner*—Richard A. Booth
(74) *Attorney, Agent, or Firm*—Fish & Richardson P.C.

(57) ABSTRACT

In a process of forming a single-crystalline semiconductor layer bonded to a glass substrate by low-temperature heat treatment, before a bonding and separation step in which the single-crystalline semiconductor layer is bonded to the glass substrate, the glass substrate is heated at a temperature higher than a heat temperature in the bonding and separation step. In a bonding step between the single-crystalline semiconductor layer and the glass substrate, the single-crystalline semiconductor layer is heated at a temperature close to a strain point of the glass substrate, specifically at a temperature in a range from minus 50° C. to plus 50° C. of a strain point. Accordingly, the glass substrate is subjected to heat treatment in advance at a temperature higher than the temperature close to the strain point, specifically, at a temperature higher than the temperature in a range from minus 50° C. to plus 50° C. of the strain point.

18 Claims, 31 Drawing Sheets

U.S. PATENT DOCUMENTS

| | | |
|---|---|---|
| 2004/0104424 A1 | 6/2004 | Yamazaki |
| 2005/0009252 A1 | 1/2005 | Yamazaki et al. |
| 2005/0260800 A1 | 11/2005 | Takano |
| 2007/0063281 A1 | 3/2007 | Takafuji et al. |
| 2007/0087488 A1 | 4/2007 | Moriwaka |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0281440 A1 | 12/2007 | Cites et al. |
| 2007/0291022 A1 | 12/2007 | Yamazaki et al. |
| 2008/0246109 A1 | 10/2008 | Ohnuma et al. |

FOREIGN PATENT DOCUMENTS

| | | |
|---|---|---|
| JP | 11-163363 | 6/1999 |
| JP | 2004-87606 | 3/2004 |

\* cited by examiner

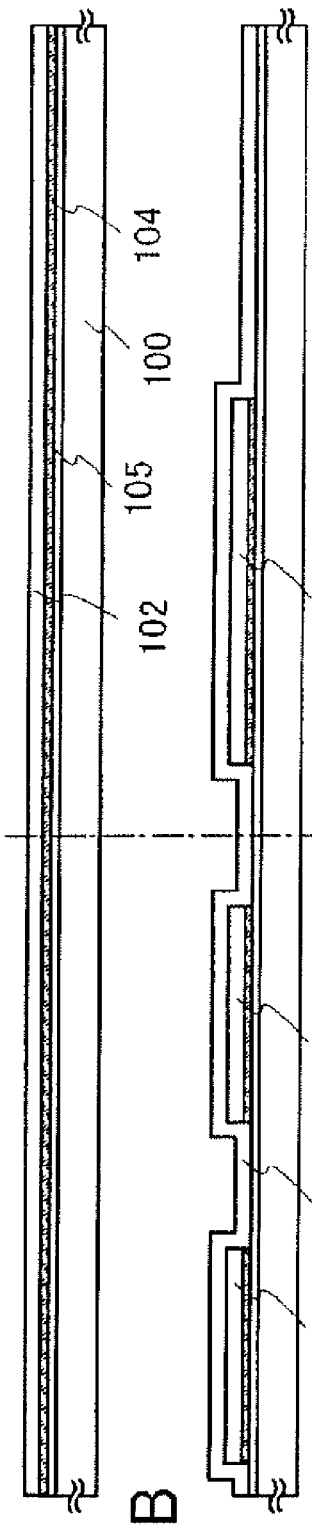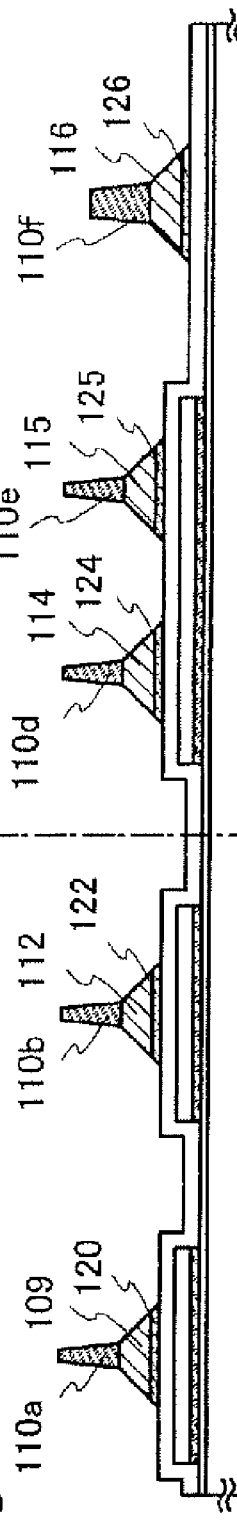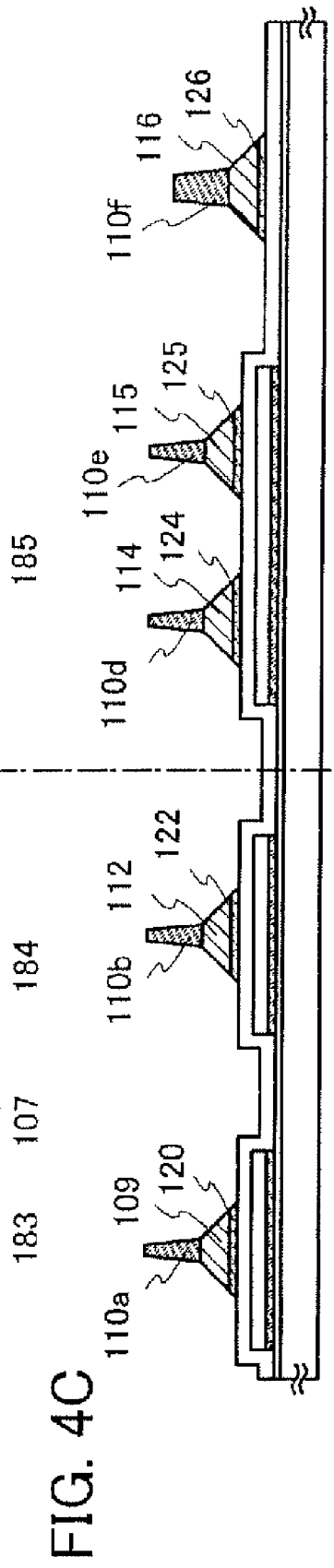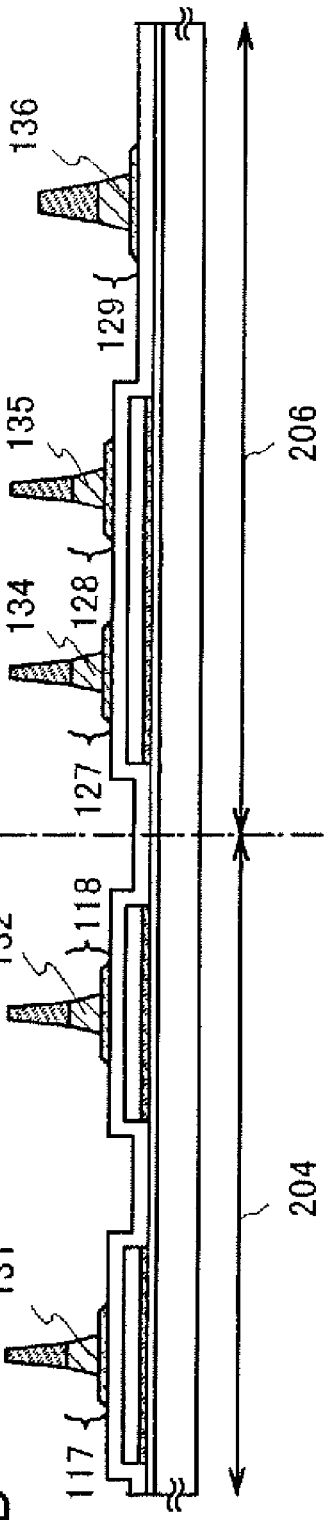

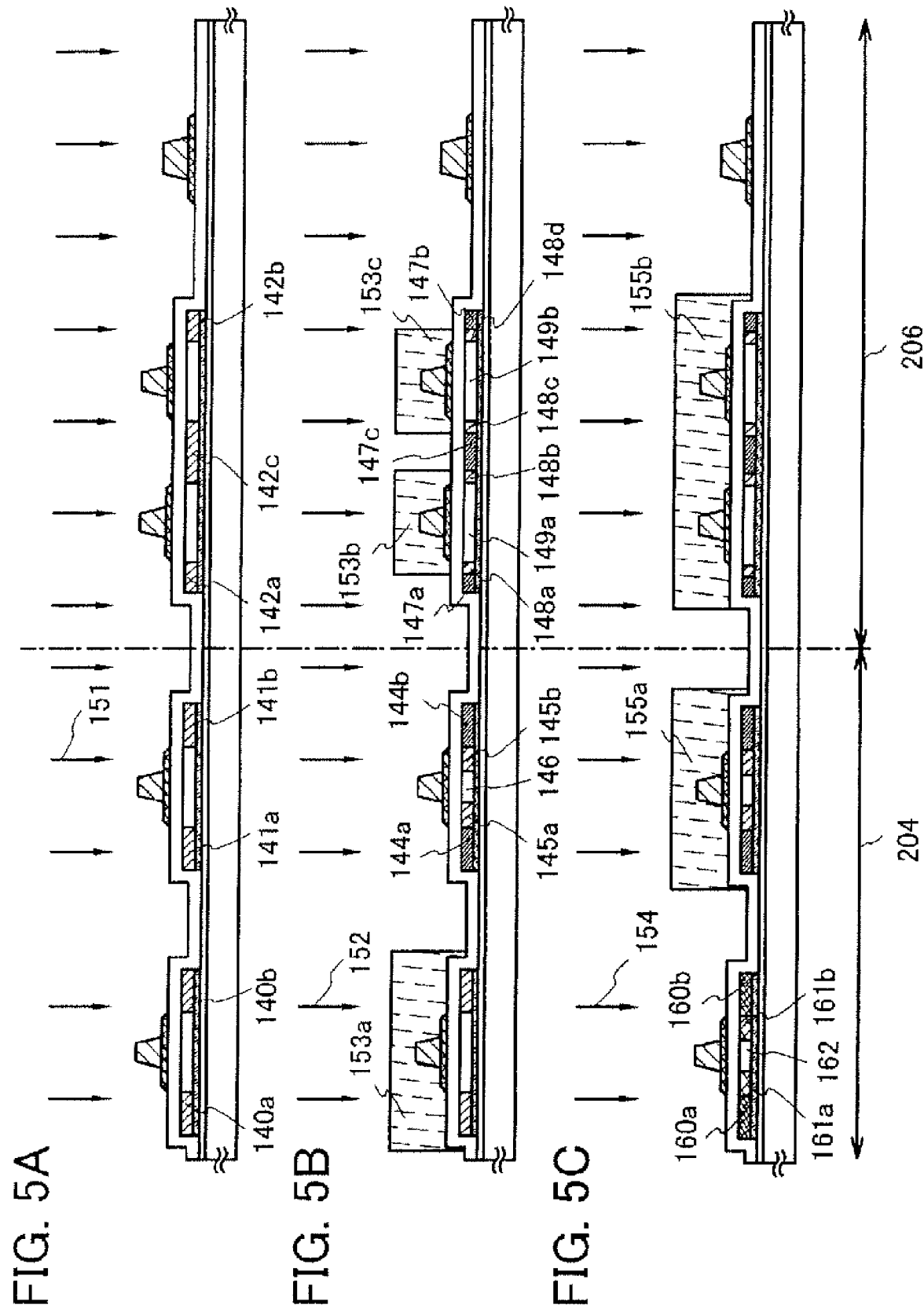

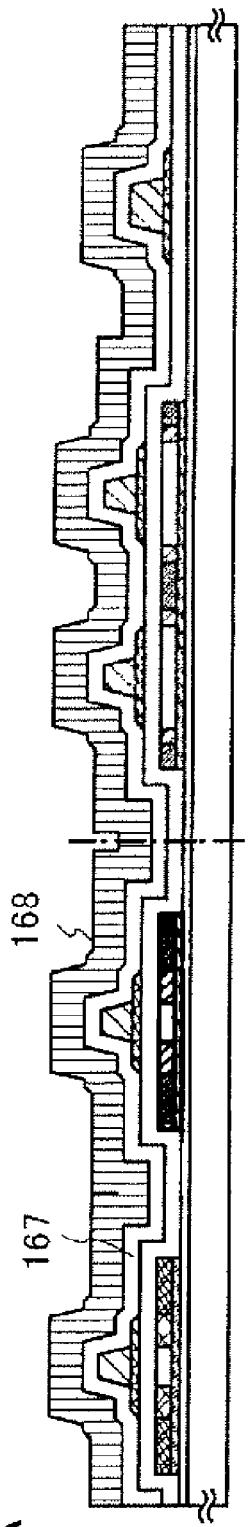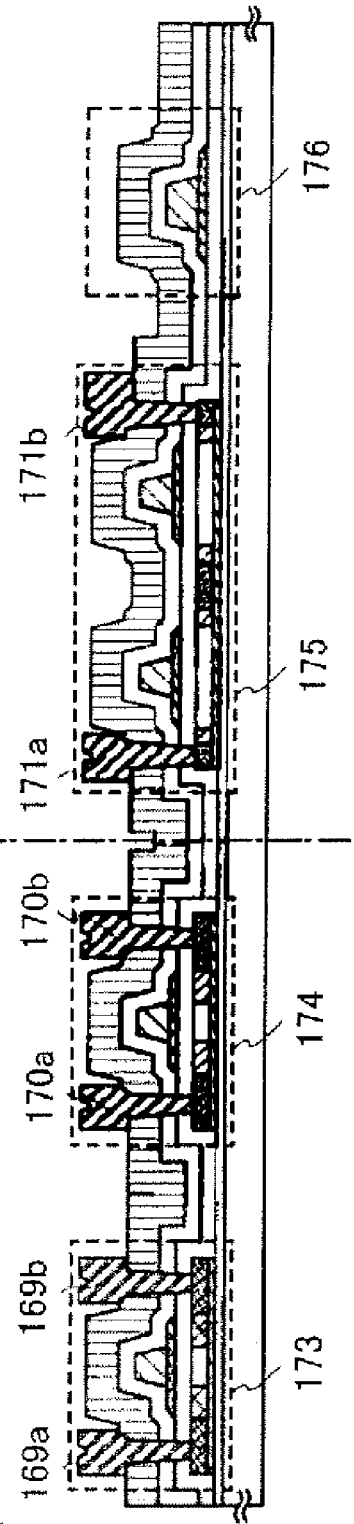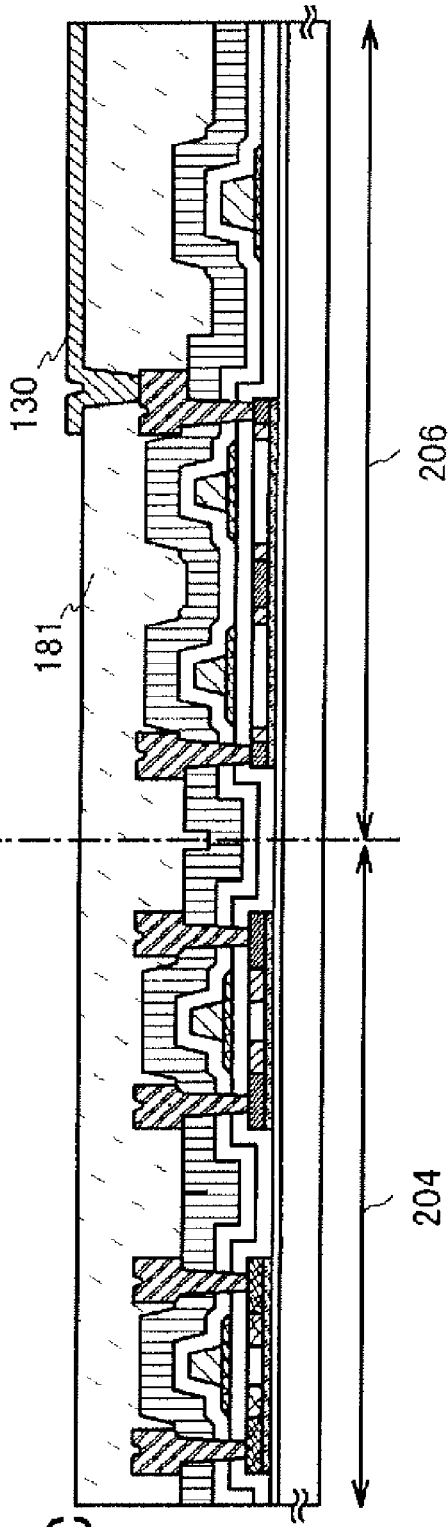

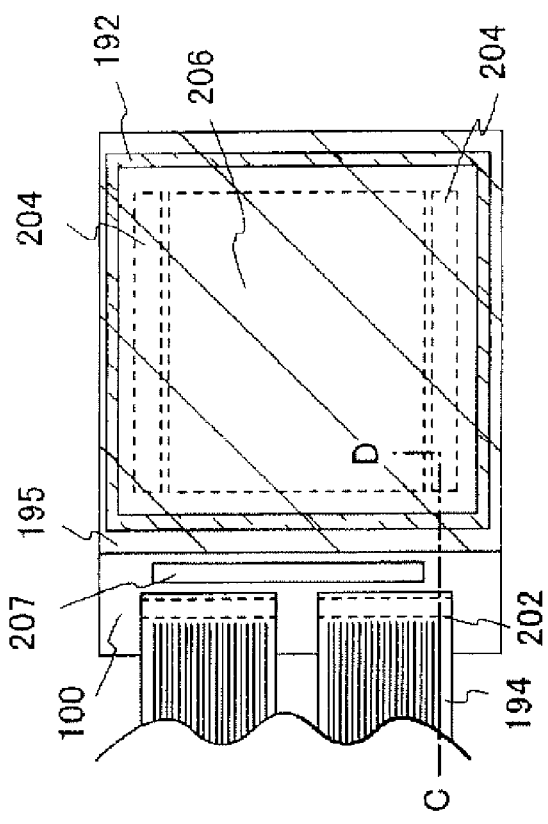
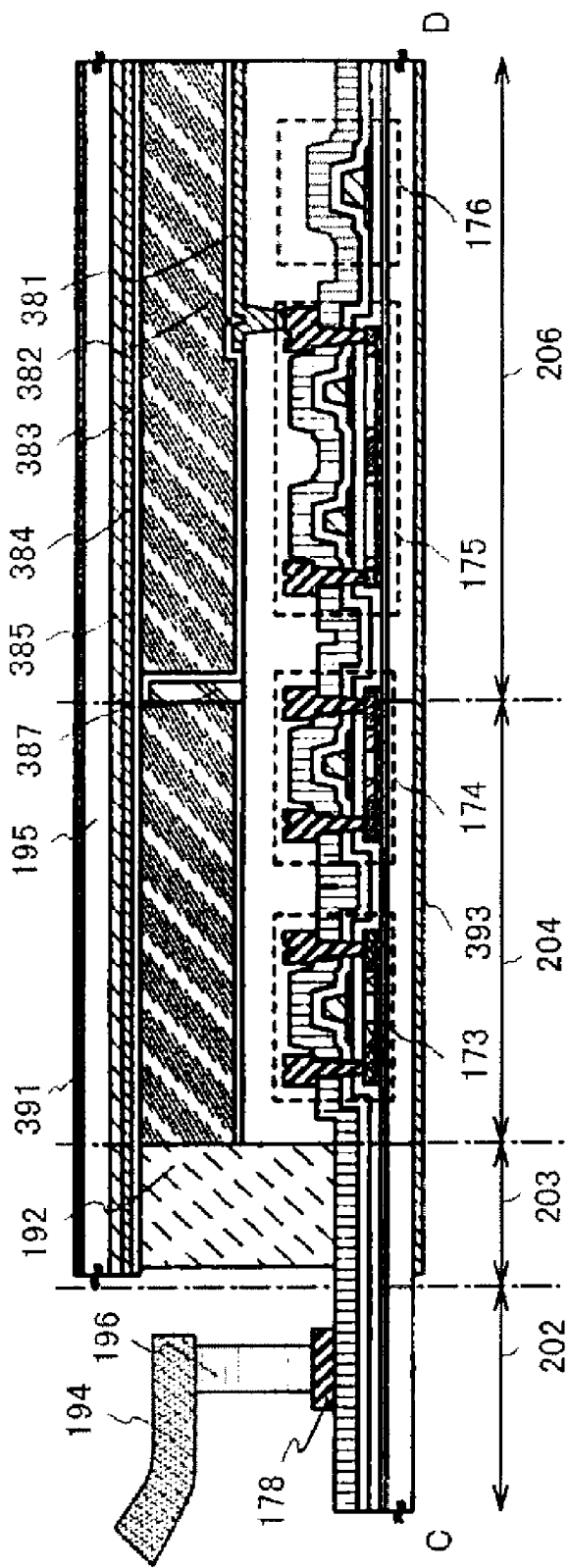
FIG. 7A
FIG. 7B

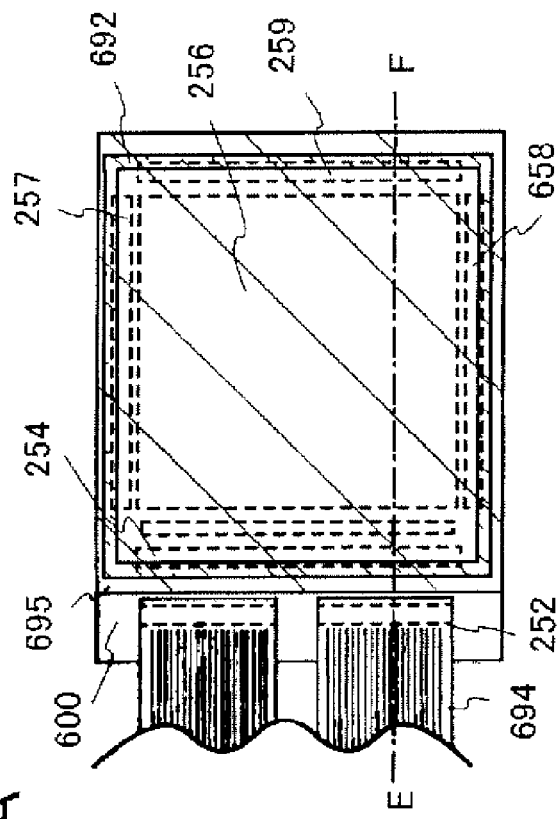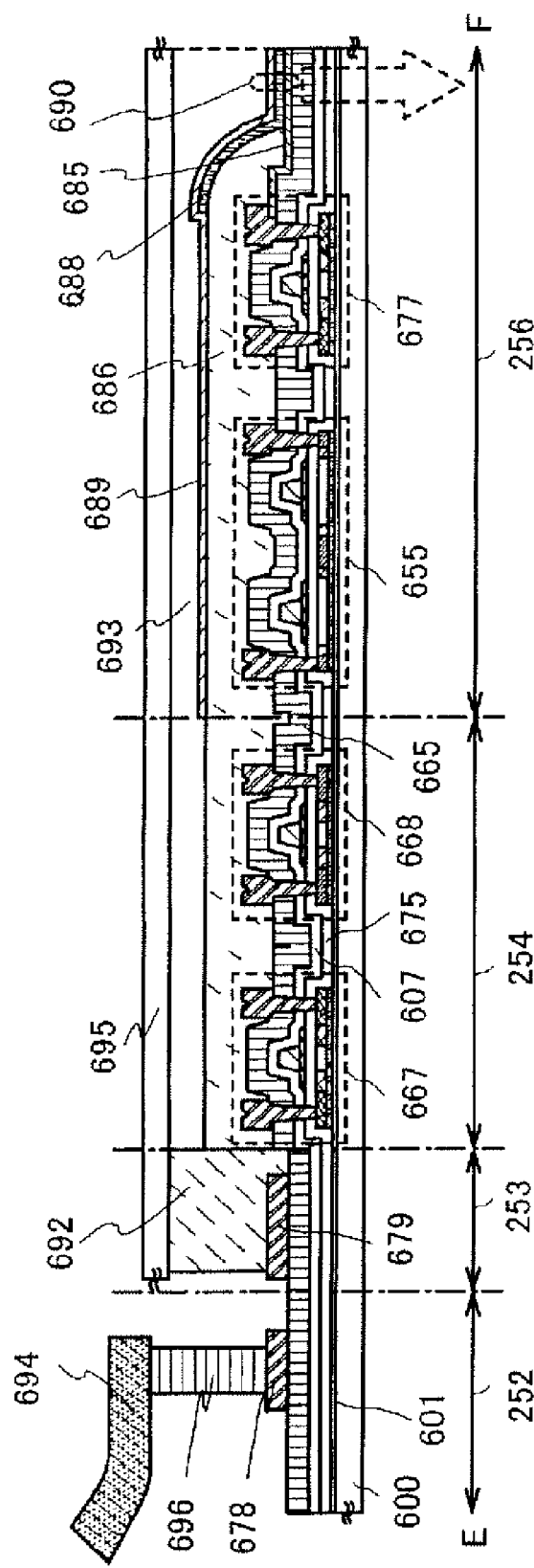

FIG.31

| Accelerating voltage | Ratio of hydrogen atom (H) (X : Y) | Ratio of hydrogen ion species (X : Y / 3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

MANUFACTURING METHOD OF SEMICONDUCTOR SUBSTRATE AND MANUFACTURING METHOD OF SEMICONDUCTOR DEVICE

BACKGROUND OF THE INVENTION

1. Field of the Invention

The present invention relates to a manufacturing method of a semiconductor substrate having a so-called SOI (silicon on insulator) structure in which a semiconductor layer is provided on an insulating surface, and a manufacturing method of a semiconductor device.

2. Description of the Related Art

Integrated circuits using semiconductor substrates called silicon on insulator (hereinafter also referred to as "SOI") in which a thin single-crystalline semiconductor layer is formed on an insulating surface instead of using silicon wafers that are manufactured by thinly slicing an ingot of single-crystalline semiconductor are developed. By provision of transistors which form the integrated circuits using the SOI substrates, parasitic capacitance between drains of the transistors and the substrates can be reduced and performance of the semiconductor integrated circuits can be improved. Therefore, the SOI substrates attract attention.

There are various manufacturing methods of SOI substrates, and an SOI substrate formed by a method called Smart Cut (registered trademark) is known as an SOI substrate with both quality of an SOI layer and easiness in production (throughput). This SOI substrate is formed in the following manner. Hydrogen ions are implanted to a wafer (bond wafer) of a silicon layer and the wafer is bonded to another base wafer which serves as a base. The silicon layer bonded to the base wafer is subjected to heat treatment at a temperature of about 500° C., so that the silicon layer is separated from the bond wafer.

A technique of forming a single-crystalline silicon thin film that is obtained by such a smart cut method over a glass substrate is known (Patent Document 1: Japanese Published Patent Application No. H11-163363).

In order to prevent film separation between a single-crystalline silicon thin film and a glass substrate, which is generated at heat treatment due to difference in the coefficient of thermal expansion between the single-crystalline silicon thin film and the glass substrate, a method using a glass substrate having a coefficient of thermal expansion which is higher than that of the single-crystalline silicon thin film is reported (e.g., Patent Document 2: Japanese Published Patent Application No. 2004-87606).

SUMMARY OF THE INVENTION

In Patent Document 2, film separation is prevented by making the glass substrate and the single-crystalline silicon thin film warp in the same direction by heat treatment. However, both the glass substrate and the single-crystalline silicon thin film are warped and deformation is caused.

Accordingly, in the technique of bonding a single-crystalline semiconductor layer and a glass substrate, a technique is demanded, by which film separation of the single-crystalline semiconductor layer and the glass substrate due to heat treatment is prevented and deformation of the single-crystalline semiconductor layer and the glass substrate is also prevented.

Considering the above-described situation, it is an object of the present invention to manufacture a semiconductor element and an integrated circuit with high reliability and high performance with high yield, in which defects such as deformation and film separation of a single-crystalline semiconductor layer and a glass substrate are prevented.

In the present invention, a single-crystalline semiconductor (low temperature single crystal semiconductor: LTSS) layer which is bonded to a glass substrate by low-temperature heat treatment is formed. One feature of the present invention is that before a bonding and separation step, the glass substrate to be bonded to the single-crystalline semiconductor layer is heated at a temperature higher than a heat temperature at heat treatment in the bonding and separation step.

In the present invention, the heat treatment in the bonding and separation step means heat treatment used in a step in which an LTSS layer and a glass substrate are bonded and the LTSS layer is separated from a semiconductor substrate. Further, the bonding and separation step also involves heat treatment performed to strongly bond the glass substrate to the LTSS layer after separation of the LTSS layer from the semiconductor substrate and formation of the LTSS layer over the glass substrate.

Heat treatments may be separately performed for a step of separating the LTSS layer from the semiconductor substrate to the glass substrate and a step of strongly bonding the glass substrate and the LTSS layer, or one-time heat treatment may be performed for the steps at the same time.

In the present invention, the single-crystalline semiconductor layer is heated at a temperature close to a strain point of the glass substrate, specifically at a temperature in a range from minus 50° C. to plus 50° C. of the strain point of the glass substrate in the bonding and separation step in which the single-crystalline semiconductor layer is bonded to the glass substrate. Accordingly, the glass substrate is subjected to heat treatment in advance at a temperature higher than the temperature close to the strain point, specifically, at a temperature which is higher than the temperature in a range from minus 50° C. to plus 50° C. of the strain point. Specifically, the heat treatment at a temperature close to the strain point of the glass substrate may be conducted at a temperature equal to or greater than 580° C. and equal to or less than 680° C.

The glass substrate shrinks by heating. Therefore, by making the glass substrate shrink in advance by heating at a temperature higher than a temperature close to a strain point of the glass substrate, specifically at a temperature higher than a temperature in a range from minus 50° C. to plus 50° C. of the strain point, shrink of the glass substrate at the heat treatment in the later bonding and separation step can be suppressed. Thus, even when heat treatment is conducted to the glass substrate to which a single-crystalline semiconductor layer having a different coefficient of thermal expansion is bonded, shrink of the glass substrate can be suppressed; therefore, film separation between the glass substrate and the single-crystalline semiconductor layer can be prevented and deformation such as warping of the glass substrate and the single-crystalline semiconductor layer can be prevented. Since defects in the above-described step can be prevented, a semiconductor device can be manufactured with high yield.

In addition, after heating the glass substrate, the glass substrate is preferably cooled down slowly. Preferably, after the heat treatment at a temperature higher than the temperature close to the strain point, specifically at a temperature which is higher than the temperature in a range from minus 50° C. to plus 50° C. of the strain point, the glass substrate may be slowly cooled down to a temperature lower than the strain point, preferably at a rate of 2° C./min or lower, more preferably at a rate of 0.5° C./min or lower, and further preferably at 0.3° C./min or lower. The temperature reduction rate may vary as appropriate depending on the kind of the substrate; however, when the temperature reduction rate is low, the local stress in the glass substrate can be eased at the same time as substantial shrinkage of the glass substrate. As the glass substrate shrinks more substantially, the shrinkage of the glass substrate in later heat treatment becomes smaller. This heat treatment may be conducted under either a reduced pressure or an atmospheric pressure, and the atmosphere may be a nitrogen atmosphere, an oxygen atmosphere, or the like.

In this manner, by using the present invention, defects such as deformation and film separation of a single-crystalline semiconductor layer (LTSS layer) and a glass substrate can be prevented, and a semiconductor element and an integrated circuit with high reliability and high performance can be manufactured with high yield.

As the glass substrate, non-alkali glass or the like can be used, and a glass substrate having a strain point of equal to or greater than 580° C. and equal to or less than 680° C. may be used.

In bonding a single-crystalline semiconductor layer to a glass substrate, a silicon oxide film formed using organic silane as a material is preferably used for one or both surfaces which form a bond. As the organic silane gas, a compound containing silicon such as tetraethoxysilane (TEOS: chemical formula, $Si(OC_2H_5)_4$), trimethylsilane $((CH_3)_3SiH)$, tetramethylsilane (TMS), tetramethylcyclotetrasiloxane (TMCTS), octamethylcyclotetrasiloxane (OMCTS), hexamethyldisilazane (HMDS), triethoxysilane $(SiH(OC_2H_5)_3)$, or trisdimethylaminosilane $(SiH(N(CH_3)_2)_3)$ can be used. In other words, in an SOI substrate having a structure for bonding a single-crystalline semiconductor (LTSS), which is bonded to a glass substrate at a low temperature, a layer which forms a smooth surface and has a hydrophilic surface may be provided for one or both of the surfaces which form a bond, as a bonding surface.

The LTSS layer bonded to the glass substrate can be obtained by separating an ion added layer (separation layer) that is formed in the single-crystalline semiconductor substrate. The separation layer is formed by irradiation of the single-crystalline semiconductor substrate with ions of hydrogen, helium, or halogen typified by fluorine. In this case, irradiation with ions of one kind of atom with different masses or ions of plural kinds of atoms with different masses may be conducted. In the case of irradiation of the single-crystalline semiconductor substrate with hydrogen ions, it is preferable that $H^+$, $H_2^+$, and $H_3^+$ ions be contained and the proportion of $H_3^+$ ions be made higher.

In the present invention, an ion added layer is a region which is made fragile so as to have microcavities by ions with which a single-crystalline semiconductor substrate is irradiated, and hereinafter also referred to as an "ion added layer" or a "separation layer." This separation layer is separated by later heat treatment, so that a single-crystalline semiconductor layer can be separated from the single-crystalline semiconductor substrate.

It is preferable that a barrier layer be provided on a glass substrate to which an LTSS layer is bonded. By the barrier layer, contamination of the LTSS layer can be prevented.

In the present invention, the semiconductor device refers to all types of devices which can function by using semiconductor characteristics. By using the invention, a device having a circuit including semiconductor elements (e.g., transistors, memory elements, and/or diodes) or a semiconductor device such as a chip including a processor circuit can be manufactured.

The present invention can also be applied to a semiconductor device (also referred to as a display device) that is a device having a display function, and the semiconductor device using the present invention includes a semiconductor device (light-emitting display device) in which a light-emitting element including a layer containing an organic material, an inorganic material, or a mixture of an organic material and an inorganic material which exhibits light emission called electroluminescence (hereinafter also refereed to as EL) interposed between electrodes is connected to a TFT, a semiconductor device (liquid crystal display device) using a liquid crystal element containing a liquid crystal material as a display element; and the like. In the present invention, a semiconductor device having a display function means a device having a display element (e.g., a liquid crystal element or a light-emitting element). Note that the semiconductor device having a display function may be a main body of a display panel in which a plurality of pixels including a display element such as a liquid crystal element or an EL element and a peripheral driver circuit for driving the pixels are formed over a substrate. Moreover, the semiconductor device may indicates a device provided with a flexible printed circuit (FPC) or a printed wiring board (PWB) which has an IC, a resistance element, a capacitance element, an inductor, a transistor, or the like. The semiconductor device may also include an optical sheet such as a polarizing plate or a retardation plate. Further, it may include a backlight (which may include a light guiding plate, a prism sheet, a diffusion sheet, a reflective sheet, and a light source (e.g., an LED or a cold-cathode tube)).

Note that as a display element or a semiconductor device, various modes and various elements can be used. For example, a display medium the contrast of which changes by an electromagnetic action, such as an EL element (e.g., an organic EL element, an inorganic EL element, or an EL element including both organic and inorganic materials), an electron-emissive element, a liquid crystal element, electronic ink, a grating light valve (GLV), a plasma display panel (PDP), a digital micromirror device (DMD), a piezoelectric ceramic display, or a carbon nanotube can be employed. Note that the semiconductor devices that use an EL element include an EL display; semiconductor devices that use an electron-missive element include a field-emission display (FED), an SED-type flat panel display (SED: Surface-conduction Electron-emitter Display), and the like; semiconductor devices that use a liquid crystal element include a liquid crystal display, a transmissive liquid crystal display, a semi-transmissive liquid crystal display, a reflective liquid crystal display, and the like; and semiconductor devices that use electronic ink include electronic paper.

One aspect of the present invention is that a manufacturing method of a semiconductor device includes: conducting first heat treatment to a glass substrate; forming a separation layer at a predetermined depth from a surface of a single-crystalline semiconductor substrate; forming a silicon oxide film over the single-crystalline semiconductor substrate by chemical vapor deposition using an organic silane gas; superposing the single-crystalline semiconductor substrate and the glass substrate to which the first heat treatment is conducted on each other with the silicon oxide film interposed therebetween and bonding the single-crystalline semiconductor substrate to the glass substrate; conducting second heat treatment at a temperature close to a strain point of the glass substrate with the single-crystalline semiconductor substrate and the glass substrate superposed on each other, to generate a crack at the separation layer, and separating the single-crystalline semiconductor substrate from the glass substrate in the state that a single-crystalline semiconductor layer remains on the glass substrate to which the first heat treatment is conducted, so that the single-crystalline semiconductor layer is formed over the glass substrate. The first heat treatment is conducted at a temperature higher than that of the second heat treatment.

One aspect of the present invention is that a manufacturing method of a semiconductor device includes: conducting first heat treatment to a glass substrate; forming a separation layer at a predetermined depth from a surface of a single-crystalline semiconductor substrate; forming a silicon oxide film over the single-crystalline semiconductor substrate by chemical vapor deposition using an organic silane gas; superposing the single-crystalline semiconductor substrate and the glass substrate to which the first heat treatment is conducted on each other with the silicon oxide film interposed therebetween and bonding the single-crystalline semiconductor substrate to the glass substrate; conducting second heat treatment at a temperature in a range from minus 50° C. to plus 50° C. of a strain point of the glass substrate with the single-crystalline semiconductor substrate and the glass substrate superposed on each other, to generate a crack at the separation layer; and separating the single-crystalline semiconductor substrate from the glass substrate in the state that a single-crystalline semiconductor layer remains on the glass substrate to which the first heat treatment is conducted, so that the single-crystalline semiconductor layer is formed over the glass substrate. The first heat treatment is conducted at a temperature higher than that of the second heat treatment.

One aspect of the present invention is that a manufacturing method of a semiconductor device includes: conducting first heat treatment to a glass substrate; forming a separation layer at a predetermined depth from a surface of a single-crystalline semiconductor substrate; forming a silicon oxide film over the single-crystalline semiconductor substrate by chemical vapor deposition using an organic silane gas; superposing the single-crystalline semiconductor substrate and the glass substrate to which the first heat treatment is conducted on each other with the silicon oxide film interposed therebetween and bonding the single-crystalline semiconductor substrate to the glass substrate; conducting second heat treatment at a temperature equal to or greater than 580° C. and equal to or less than 680° C. with the single-crystalline semiconductor substrate and the glass substrate superposed on each other, to generate a crack at the separation layer; and separating the single-crystalline semiconductor substrate from the glass substrate in the state that a single-crystalline semiconductor layer remains on the glass substrate to which the first heat treatment is conducted, so that the single-crystalline semiconductor layer is formed over the glass substrate. The first heat treatment is conducted at a temperature higher than that of the second heat treatment.

In the above-described structures, after formation of the single-crystalline semiconductor layer over the glass substrate, third heat treatment may be conducted to the glass substrate and the single-crystalline semiconductor layer at a temperature lower than that of the first heat treatment. By the third heat treatment, a bond between the glass substrate and the single-crystalline semiconductor layer can be further strengthened.

In the above-described structures, a temperature in formation of the silicon oxide film over the single-crystalline semiconductor substrate by chemical vapor deposition using the organic silane gas is such that an element introduced to form the separation layer is not separated, and the second heat treatment is conducted at a temperature by which the element introduced to form the separation layer is separated. For example, the temperature in formation of the silicon oxide film over the single-crystalline semiconductor substrate by chemical vapor deposition using the organic silane gas is equal to or less than 350° C., and the second heat treatment is conducted at equal to or greater than 400° C.

Using the single-crystalline semiconductor layer provided over the glass substrate in the bonding and separation step, various semiconductor elements, memory elements, integrated circuits, and the like with high performance can be manufactured.

By making the glass substrate to be bonded to the single-crystalline semiconductor layer shrink in advance by heating at a temperature higher than a temperature close to a strain point of the glass substrate, specifically at a temperature higher than a temperature in a range from minus 50° C. to plus 50° C. of the strain point, shrink of the glass substrate at the heat treatment in the later bonding and separation step in which the single-crystalline semiconductor layer is bonded to the glass substrate can be suppressed. Thus, even when heat treatment is conducted to the glass substrate to which a single-crystalline semiconductor layer having a different coefficient of thermal expansion is bonded, shrink of the glass substrate can be suppressed; therefore, film separation between the glass substrate and the single-crystalline semiconductor layer can be prevented and deformation such as warping of the glass substrate and the single-crystalline semiconductor layer can be prevented. Since defects in the above-described process can be prevented, a semiconductor device can be manufactured with high yield.

In this manner, by using the present invention, defects such as deformation and film separation of a single-crystalline semiconductor layer (LTSS layer) and a glass substrate can be prevented, and a semiconductor element and an integrated circuit with high reliability and high performance can be manufactured with high yield.

BRIEF DESCRIPTION OF THE DRAWINGS

In the accompanying drawings:

FIGS. 4A to 4D show a manufacturing method of a semiconductor device according to the present invention;

FIGS. 5A to 5C show a manufacturing method of a semiconductor device according to the present invention;

FIG. 6A to 6C show a manufacturing method of a semiconductor device according to the present invention;

FIGS. 7A and 7B show a semiconductor device according to the present invention;

FIGS. 8A and 8B show a semiconductor device according to the present invention;

FIG. 31 is a list of ratios of fitting parameters (hydrogen atom ratios and hydrogen ion species ratios).

DETAILED DESCRIPTION OF THE INVENTION

Figure 1A:
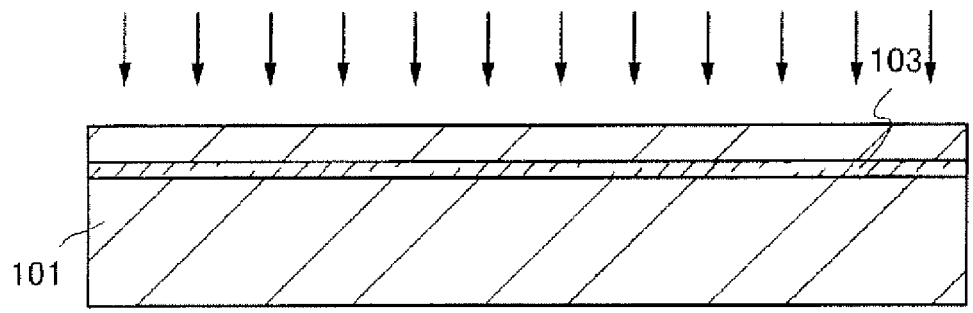
FIGS. 1A to 1D show a manufacturing method of a semiconductor device according to the present invention.

Embodiment modes of the present invention will be described with reference to the drawings. It is easily understood by those skilled in the art that various changes may be made in forms and details without departing from the spirit and the scope of the invention. Therefore, the present invention should not be interpreted as being limited to the descriptions of the embodiment modes below. In structures of the present invention described below, the same reference numerals are commonly given to the same components or components having similar functions throughout the drawings, and repeated description thereof is omitted.

Embodiment Mode 1

A manufacturing method of a semiconductor substrate according to the present invention will be described with reference to FIGS. 1A to 3B.

A semiconductor substrate 101 shown in FIG. 1A is cleaned, and irradiation with ions accelerated by electric field is conducted, so that a separation layer 103 is formed at a predetermined depth from a surface. Irradiation with the ions is carried out in consideration of the thickness of an LTSS layer to be transferred to a base substrate. The thickness of the LTSS layer is set at 5 to 500 nm, preferably 10 to 200 nm. The accelerating voltage at irradiation with ions is set in consideration of such a thickness; accordingly, the semiconductor substrate 101 is irradiated with the ions.

The separation layer may be formed by irradiation with ions by an ion doping method or an ion implantation method. The separation layer is formed by irradiation with ions of hydrogen, helium, or halogen typified by fluorine. In the case of irradiation with fluorine ions as the halogen element, $BF_3$ may be used as a source gas. Note that the ion implantation method means a method in which an ionized gas is mass-separated and a semiconductor is irradiated with the ionized gas.

In the case of irradiating a single-crystalline silicon substrate with halogen ions such as fluorine ions by an ion irradiation method, the introduced fluorine knocks out (displace) silicon atoms in a silicon crystal lattice, thereby effectively producing empty spaces and forming microcavities in the separation layer. In this case, the volume of the microcavities, which are formed in the separation layer, is changed by heat treatment at a relatively lower temperature, and separation along the separation layer is performed; thus, a thin LTSS layer can be formed. After irradiation with the fluorine ions, irradiation with hydrogen ions may be conducted so that the hydrogen ions are contained in the cavities. Separation is performed in the separation layer formed to separate a thin semiconductor layer from a semiconductor substrate by utilizing change in the volume of the microcavities formed in the separation layer, therefore, it is preferable to efficiently utilize the effect of the fluorine ions or hydrogen ions in the above-described manner.

Irradiation with ions of one kind of atom with different masses or ions of plural kinds of atoms with different masses may be conducted. For example, in the case of irradiation with hydrogen ions, it is preferable that $H^+$, $H_2^+$, and $H_3^+$ ions are contained and the proportion of $H_3^+$ ions is made higher. When the rate of $H_3^+$ ions is made higher, the irradiation efficiency can be improved, so that the time for irradiation can be shortened. With this structure, separation can be conducted easily.

An ion irradiation method, which is one aspect of the present invention, is considered below.

In the present invention, a single-crystalline semiconductor substrate is irradiated with ions that are derived from hydrogen (H) (hereafter referred to as "hydrogen ion species"). More specifically, a hydrogen gas or a gas which contains hydrogen in its composition is used as a source material; a hydrogen plasma is generated; and a single-crystalline semiconductor substrate is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ are present. Here are listed reaction equations for reaction processes (formation processes, destruction processes) of the hydrogen ion species.

  (1)

  (2)

  (3)

  (4)

  (5)

  (6)

  (7)

  (8)

  (9)

Figure 24:
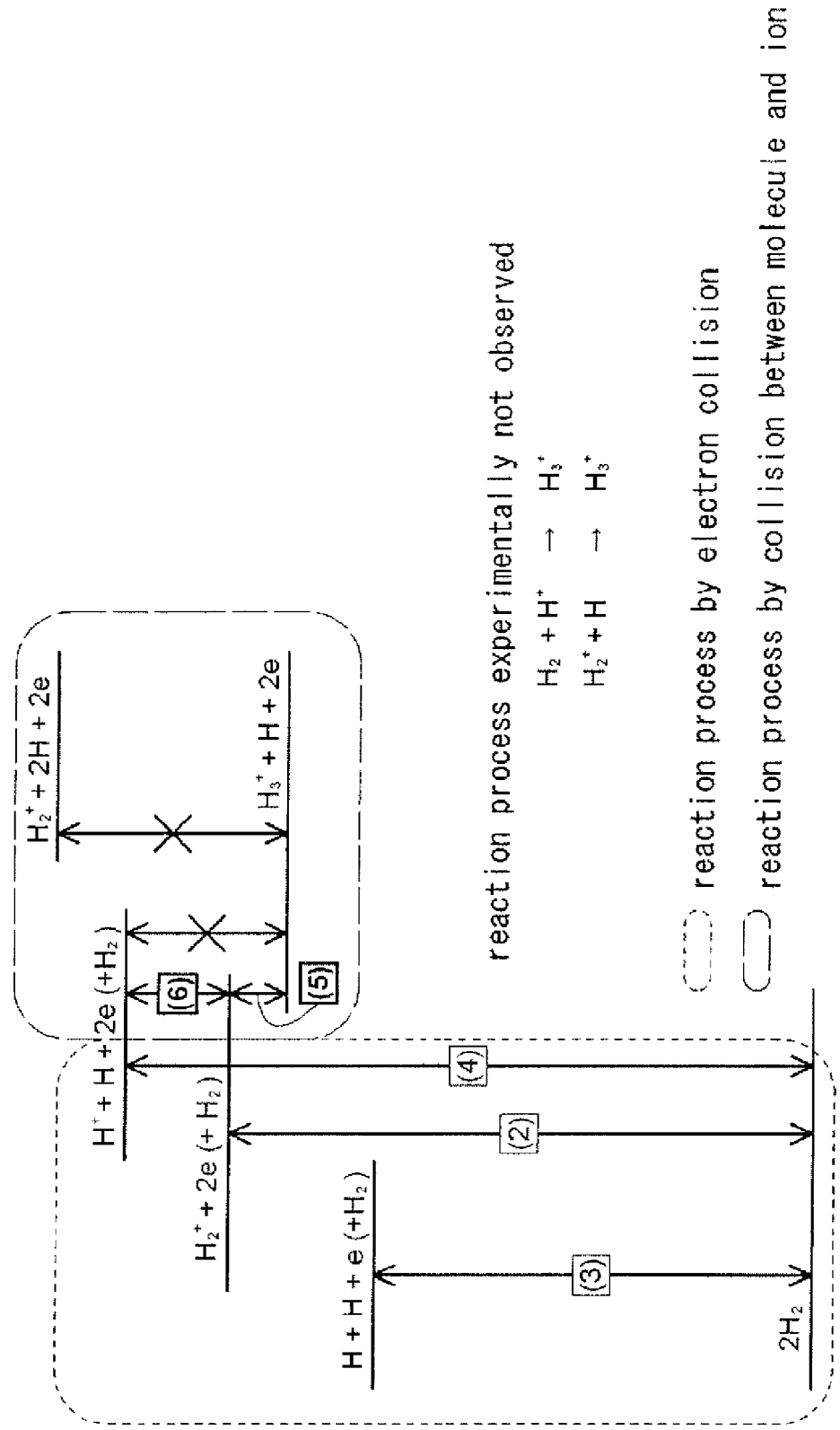
FIG. 24 is an energy diagram of hydrogen ion species.

FIG. 24 is an energy diagram which schematically shows some of the above reactions. Note that the energy diagram shown in FIG. 24 is merely a schematic diagram and does not depict the relationships of energies of the reactions exactly.

($H_3^+$ Formation Process)

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to a potential energy lost by transfer of the charged particle. That is, in a situation where a charged particle can transfer a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 25:
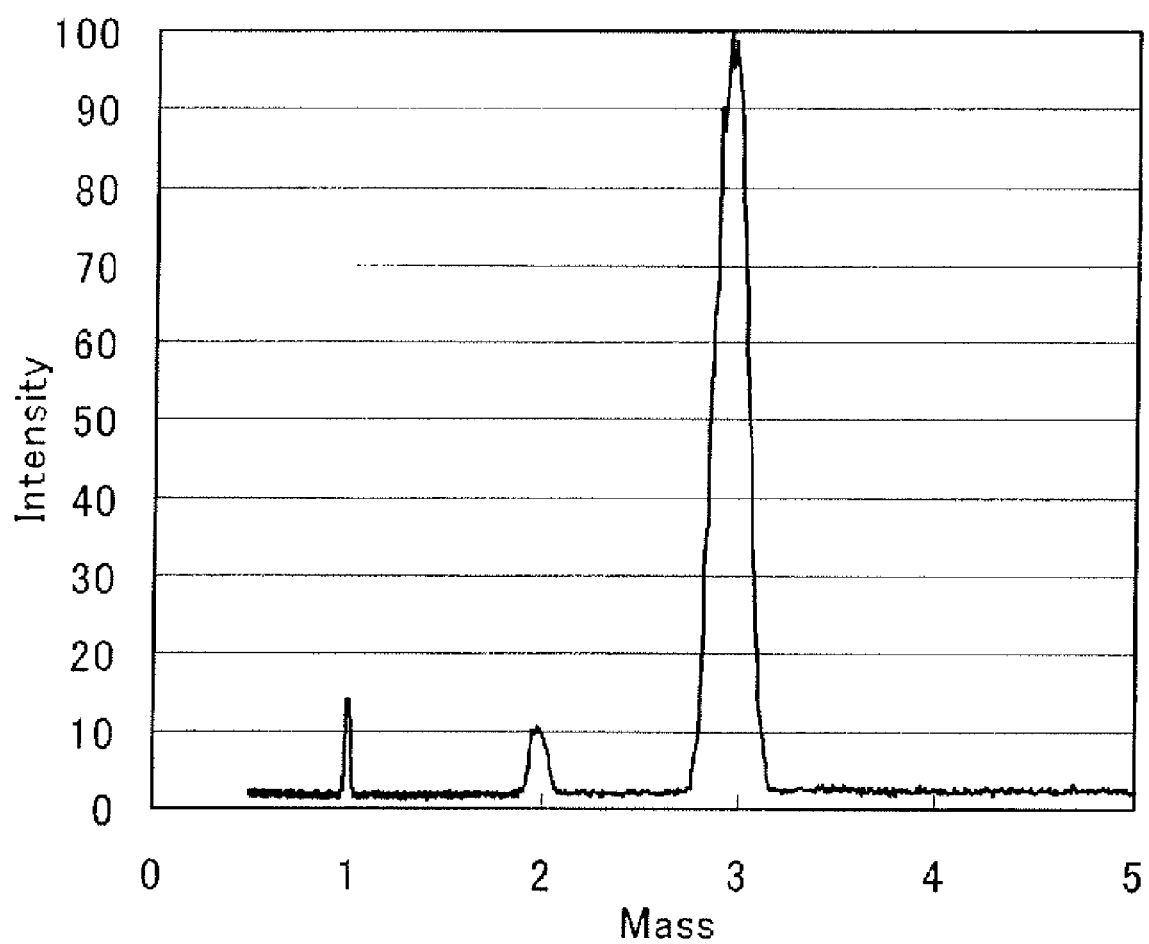
FIG. 25 is a diagram showing the results of ion mass spectrometry.

Here, an example, in which the proportions of ion species (particularly, the proportion of $H_3^+$) are different, is described. FIG. 25 is a graph showing the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 25, the number of ions with different masses is expressed as a relative proportion where the number of ions with a mass of 3 is defined as 100. It can be seen from FIG. 25 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates a plasma, an extraction electrode that extracts an ion beam from the plasma, and the like.

Figure 26:
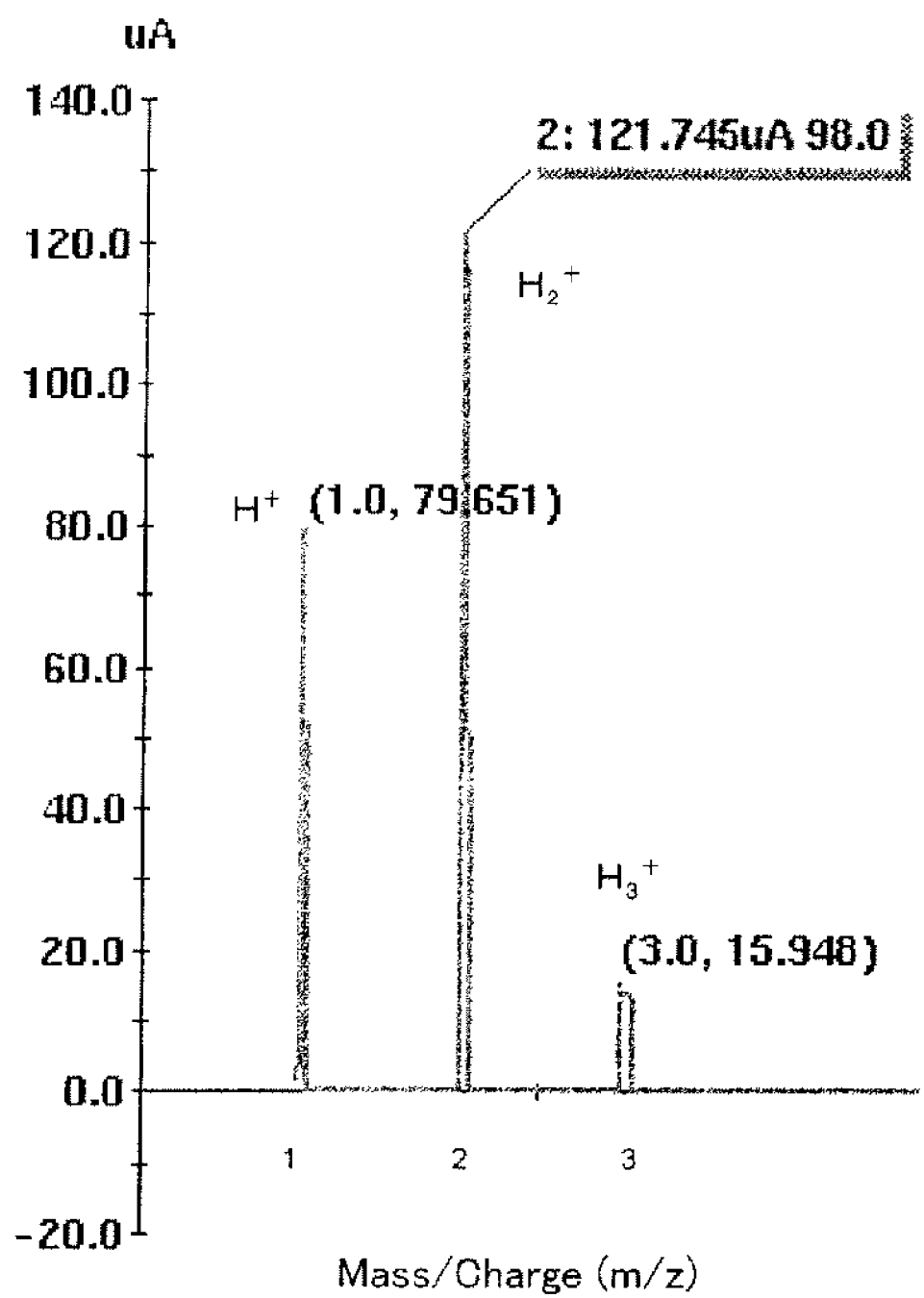
FIG. 26 is a diagram showing the results of ion mass spectrometry.

FIG. 26 is a graph showing the results of mass spectrometry of ions that are generated from $PH_3$ when an ion source different from that for the case of FIG. 25 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 25, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 26 that the ratio between ion species in a plasma, i.e., the ratio between $H^+$, $H_2^+$, and $H_3^+$, is about 37:56:7. Note that, although FIG. 26 shows the data obtained when the source gas is $PH_3$, the ratio between the hydrogen ion species is about the same when a 100% hydrogen gas is used as a source gas, as well.

In the case of the ion source from which the data shown in FIG. 26 is obtained, $H_3^+$, of $H^+$, $H_2^+$, and $H_3^+$, is generated at a proportion of only about 7%. On the other hand, in the case of the ion source from which the data shown in FIG. 25 is obtained, the proportion of $H_3^+$ can be up to 50% or higher (under the aforementioned conditions, about 80%). This is thought to result from the pressure and electric field inside a chamber, which is clearly shown in the above consideration.

($H_3^+$ Irradiation Mechanism)

When a plasma that contains a plurality of ion species as shown in FIG. 25 is generated and a single-crystalline semiconductor substrate is irradiated with the generated ion species without any mass separation being performed, the surface of the single-crystalline semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ (H2) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ (H3) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 27:
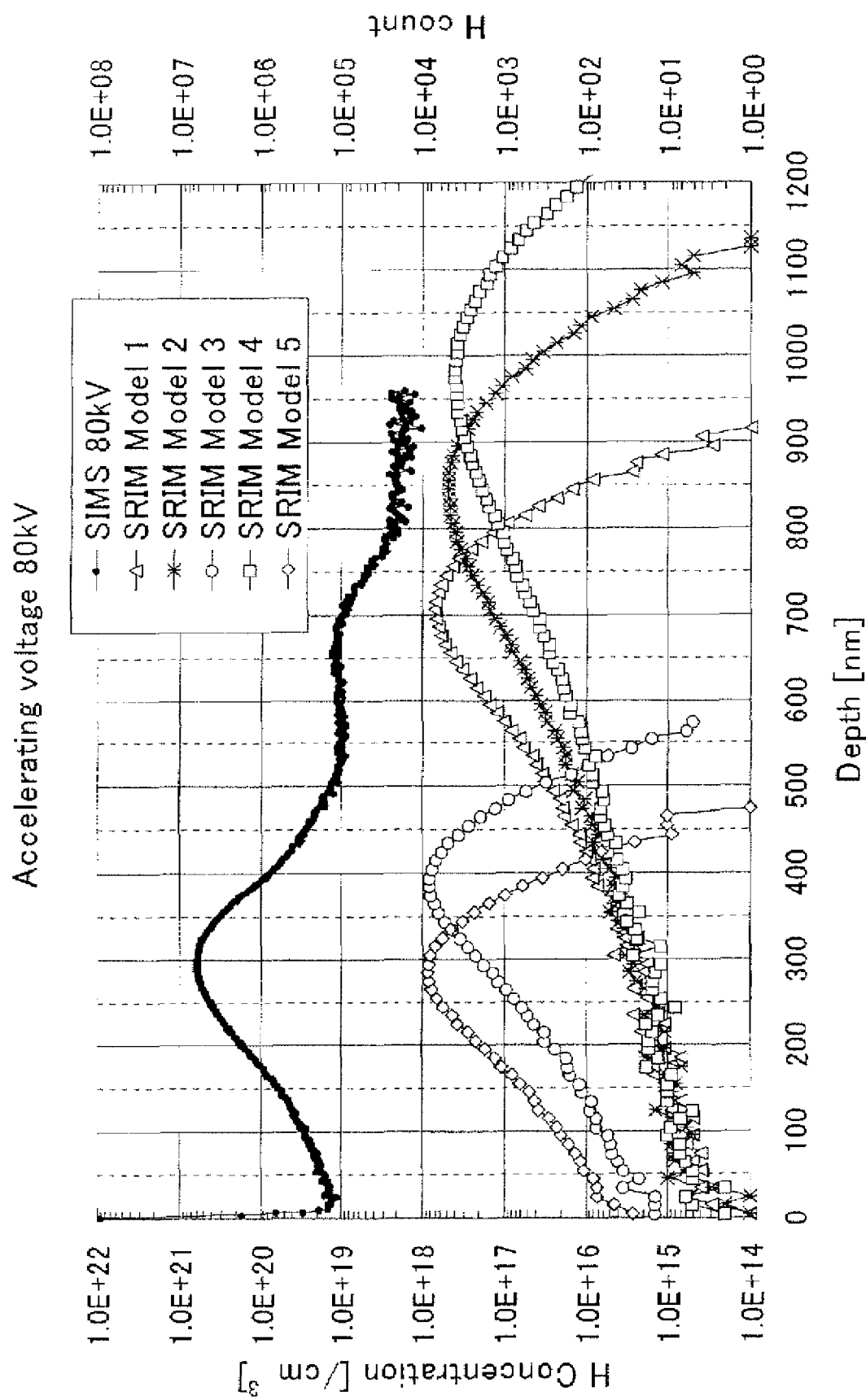
FIG. 27 is a diagram showing the profile (measured values and calculated values) of hydrogen in the depth direction when the accelerating voltage is 80 kV.

FIG. 27 shows the calculation results obtained when irradiation with the hydrogen ion species (irradiation with 100,000 atoms for H) is performed using Models 1 to 5. FIG. 27 also shows the hydrogen concentration (secondary ion mass spectrometry (SIMS) data) in an Si substrate irradiated with the hydrogen ion species of FIG. 25. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Figure 28:
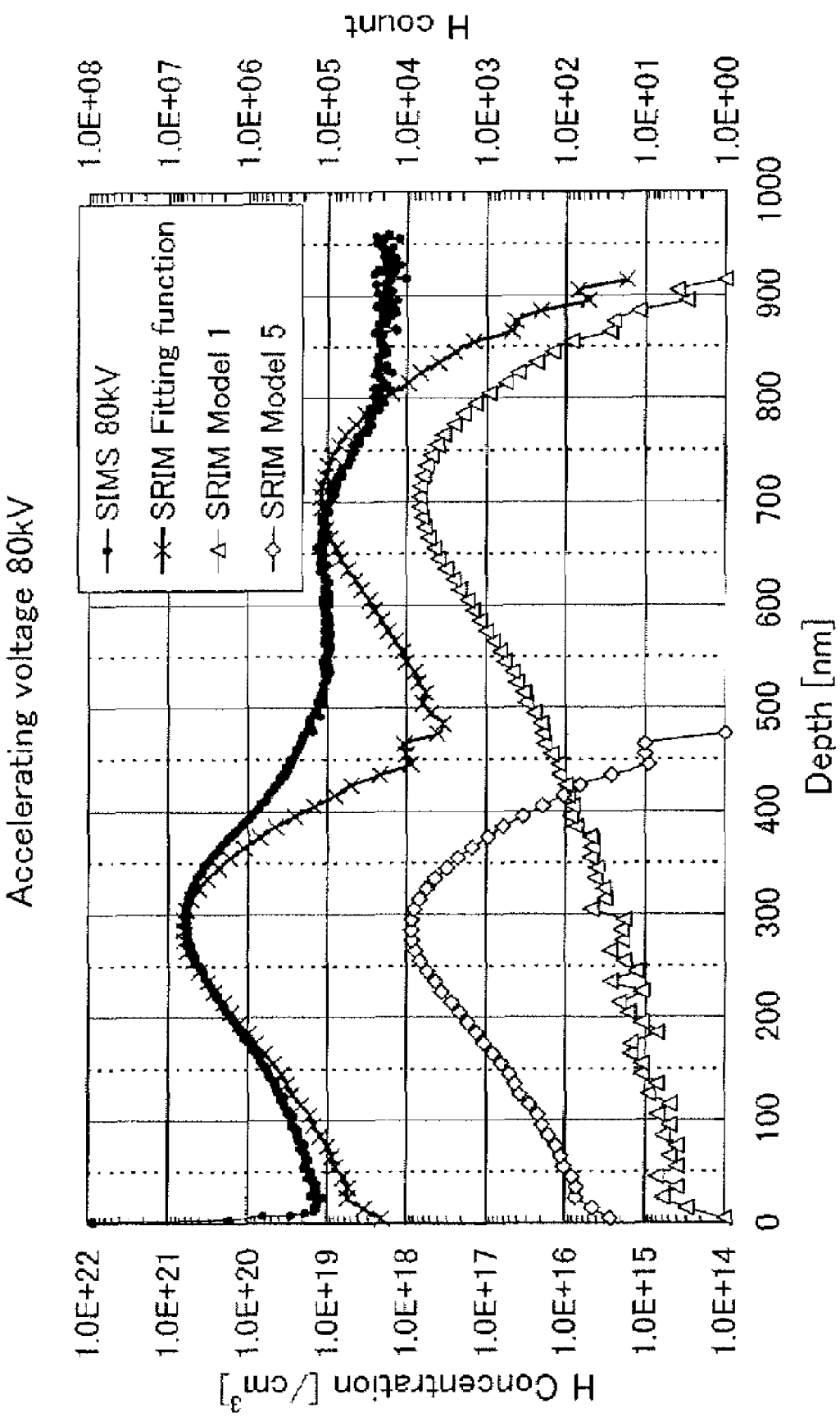
FIG. 28 is a diagram showing the profile (measured values, calculated values, and fitting functions) of hydrogen in the depth direction when the accelerating voltage is 80 kV.
Figure 29:
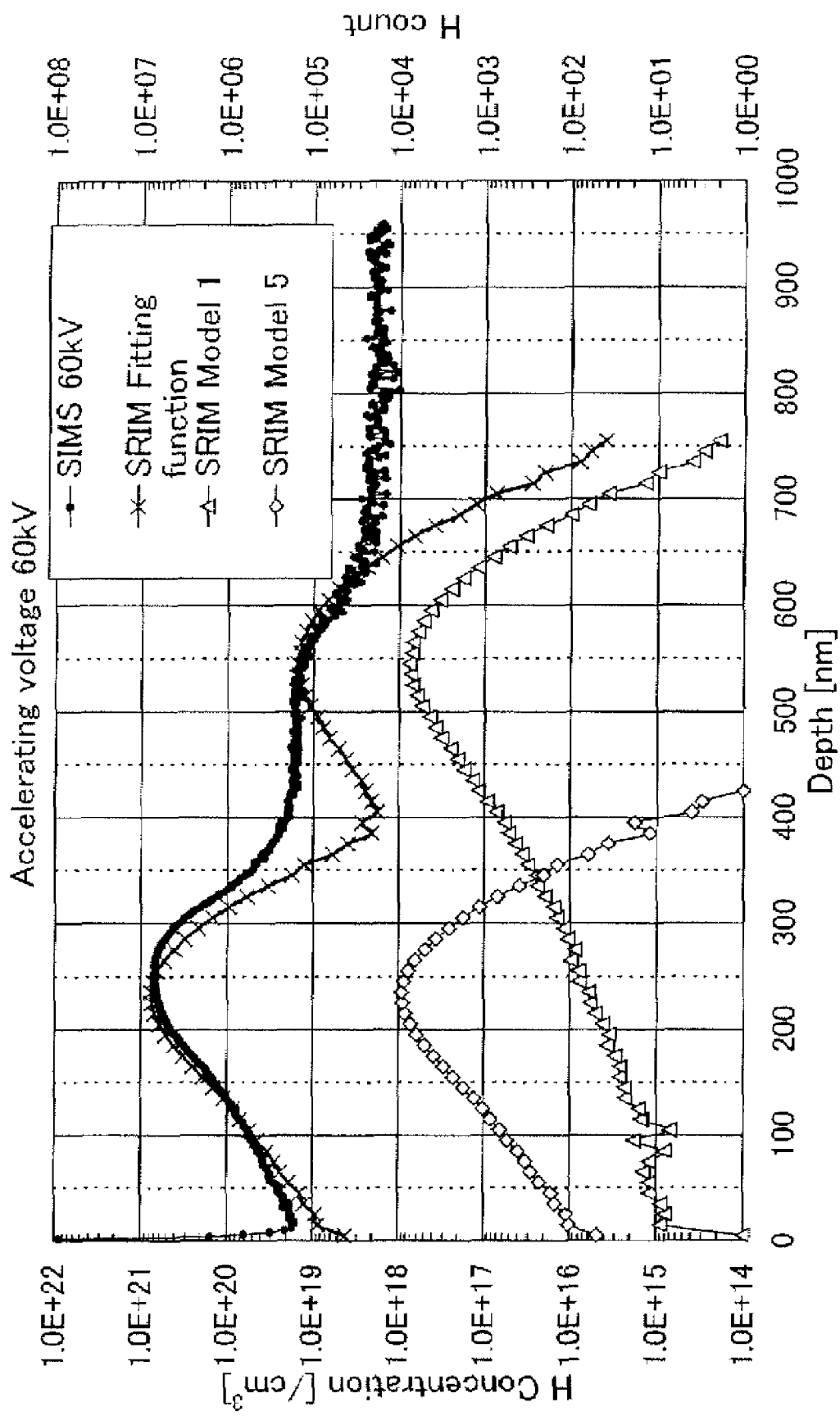
FIG. 29 is a diagram showing the profile (measured values, calculated values, and fitting functions) of hydrogen in the depth direction when the accelerating voltage is 60 kV.
Figure 30:
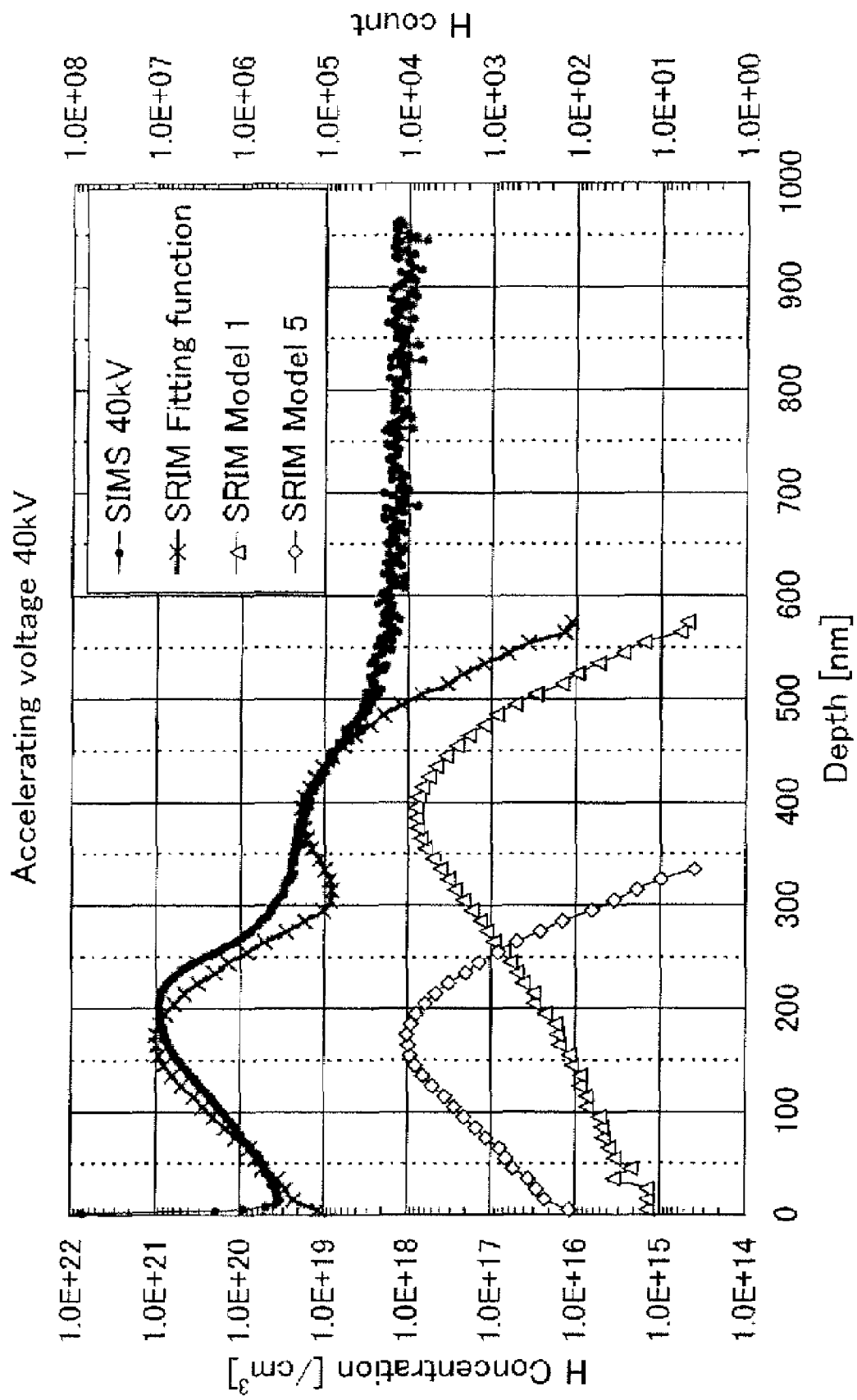
FIG. 30 is a diagram showing the profile (measured values, calculated values, and fitting functions) of hydrogen in the depth direction when the accelerating voltage is 40 kV.

Accordingly, Models 2 to 4 will not be considered hereinafter FIGS. 28 to 30 each show the calculation results obtained when irradiation with the hydrogen ion species (irradiation with 100,000 atoms for H) is performed using Models 1 and 5. FIGS. 28 to 30 also each show the hydrogen concentration (SIMS data) in an Si substrate irradiated with the hydrogen ion species of FIG. 25, and the simulation results fitted to the SIMS data (hereinafter referred to as a fitting function). Here, FIG. 28 shows the case where the accelerating voltage is 80 kV; FIG. 29, the case where the accelerating voltage is 60 kV; and FIG. 30, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of an Si substrate.

The fitting function is obtained using the calculation formula given below, in consideration of Models 1 and 5. Note that, in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+:H_2^+:H_3^+$ is about 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 31 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not considered and the calculation assumes amorphous Si, it can be said that values close to that of the ratio between ion species used for actual irradiation ($H^+:H_2^+:H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 25. For example, because $H_3^+$ splits into $H^+$, H, or the like to be introduced into a substrate, ion introduction efficiency can be improved compared with the case of irradiation mainly with $H^+$ or $H_2^+$. This leads to an improvement in semiconductor substrate production efficiency. In addition, because the kinetic energy of $H^+$ or H after $H_3^+$ splits similarly tends to be low, $H_3^+$ is suitable for manufacture of thin semiconductor layers.

Note that, in this specification, a method is described in which an ion doping apparatus that is capable of irradiation with the hydrogen ion species as shown in FIG. 25 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion doping apparatus.

Since irradiation with ions is conducted in high dose conditions in formation of the separation layer, a surface of the semiconductor substrate 101 becomes rough in some cases. Therefore, as a protective film for the semiconductor substrate 101, a silicon nitride film, a silicon nitride oxide film, or the like may be provided with a thickness of 50 nm to 200 nm on a surface irradiated with the ions.

Figure 1B:
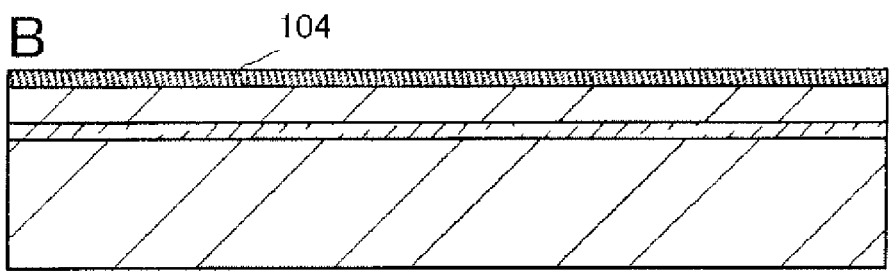

Next, as shown in FIG. 1B, as an insulating layer (bonding layer) 104 formed at a bonding interface, a silicon oxide film is formed on a surface of the semiconductor substrate 101, which is to be bonded to a base substrate. As the silicon oxide film, a silicon oxide film formed by chemical vapor deposition using an organic silane gas is preferable. Another silicon oxide film formed by chemical vapor deposition using different type of silane gas can also be used. In the film formation by chemical vapor deposition, a film formation temperature of, for example, 350° C. or lower is employed as a temperature which does not cause degassing from the separation layer 103 formed in the single-crystalline semiconductor substrate. In addition, the heat treatment for separating the LTSS layer from a single-crystalline or polycrystalline semiconductor substrate is carried out at a heat treatment temperature higher than the film formation temperature.

The insulating layer 104 forms a smooth surface and has a hydrophilic surface. As this insulating layer 104, a silicon oxide film is preferable. In particular, a silicon oxide film formed by chemical vapor deposition using an organic silane gas is preferable. As the organic silane gas, a compound containing silicon, such as tetraethoxysilane (TEOS: chemical formula, $Si(OC_2H_5)_4$), trimethylsilane (($CH_3)_3SiH$), tetramethylsilane (TMS), tetramethylcyclotetrasiloxane (TMCTS), octamethylcyclotetrasiloxane (OMCTS), hexamethyldisilazane (HMDS), triethoxysilane (SiH($OC_2H_5)_3$), or trisdimethylaminosilane ($SiH(N(CH_3)_2)_3$) can be used.

The above-described insulating layer 104 which forms a smooth surface and has a hydrophilic surface is provided with a thickness of 5 to 500 nm. With this thickness, surface roughness on a surface over which a film is formed (surface which forms a bond) can be smoothed and the smoothness on the growth surface of the film can be obtained. By provision of the insulating layer 104, heat distortion with a substrate to be bonded can be reduced. A similar silicon oxide film may also be provided for a base substrate 100. In other words, in bonding an LTSS layer 102 to the base substrate 100, the insulating layer 104 that includes a silicon oxide film formed using organic silane as a material is preferably provided for one or both of surfaces that form a bond so that the base substrate 100 and the LTSS layer 102 can be bonded strongly.

Figure 1C:
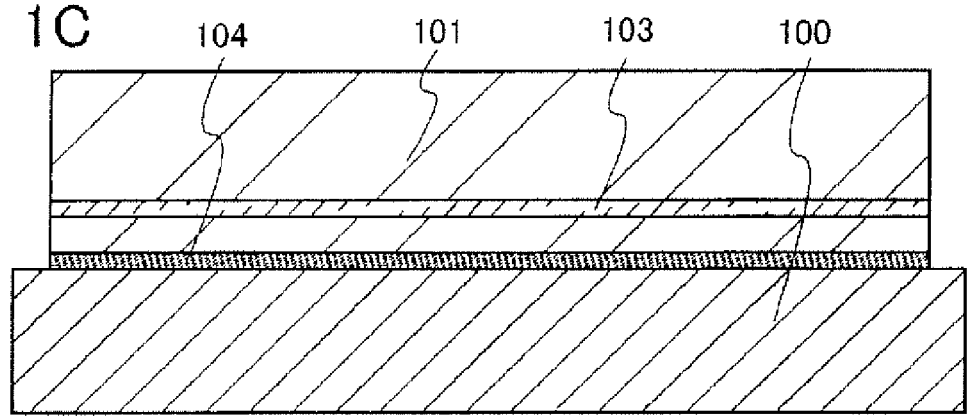

FIG. 1C shows a mode in which the base substrate 100 and a surface of the insulating layer 104 which is provided for the semiconductor substrate 101 are made in close contact with each other and bonded to each other. The surfaces which form a bond are sufficiently cleaned. By making the base substrate 100 and the insulating layer 104 face each other and pressing one part thereof from the outside, the base substrate 100 and the insulating layer 104 attract each other by increase in van der Waals force or contribution of hydrogen bonding due to local reduction in distance between the bonding surfaces. Further, since the distance between the base substrate 100 and the insulating layer 104 in an adjacent region, which also face each other, is reduced, a region which is strongly influenced by van der Waals force or a region to which hydrogen bonding contributes is widened. Accordingly, bonding proceeds and spreads to the entire bonding surfaces.

To form favorable bonding, surfaces that form a bond may be activated. For example, the surfaces that form a bond are irradiated with an atomic beam or an ion beam. In the case of utilizing the atomic beam or the ion beam, an inert gas neutral atomic beam or an inert gas ion beam of argon or the like can be used. Alternatively, plasma irradiation or radical treatment may be conducted. By such surface treatment, even when the temperature at later heat treatment is 200 to 400° C., the bonding strength between different kinds of materials can be improved easily.

Features of the present invention are that a glass substrate is used as the base substrate 100 to which the single-crystalline semiconductor layer is bonded and that before a bonding and separation step, the base substrate 100 is heated at a temperature higher than the heat temperature at heat treatment in the bonding and separation step.

In the present invention, the heat treatment in the bonding and separation step means heat treatment used in a step in which an LTSS layer and a glass substrate are bonded and the LTSS layer is separated from a semiconductor substrate. Further, the bonding and separation step also involves heat treatment performed to strongly bond the glass substrate to the LTSS layer after separation of the LTSS layer from the semiconductor substrate and formation of the LTSS layer over the glass substrate.

Heat treatments may be separately performed for a step of separating the LTSS layer from the semiconductor substrate to the glass substrate and a step of strongly bonding the glass substrate and the LTSS layer, or one-time heat treatment may be performed for the steps at the same time.

In the present invention, the single-crystalline semiconductor layer is heated at a temperature close to a strain point of the glass substrate, specifically at a temperature in a range from minus 50° C. to plus 50° C. of the strain point of the glass substrate in the bonding and separation step in which the single-crystalline semiconductor layer is bonded to the glass substrate. Accordingly, the glass substrate is subjected to heat treatment in advance at a temperature higher than the temperature close to the strain point, specifically, at a temperature which is higher than the temperature in a range from minus 50° C. to plus 50° C. of the strain point. Specifically, the heat treatment at a temperature close to the strain point of the glass substrate may be conducted at a temperature equal to or greater than 580° C. and equal to or less than 680° C.

The glass substrate shrinks by heating. Therefore, by making the glass substrate shrink in advance by heating at a temperature higher than a temperature close to a strain point of the glass substrate, specifically at a temperature higher than a temperature in a range from minus 50° C. to plus 50° C. of the strain point, shrink of the glass substrate at the heat treatment in the later bonding and separation step can be suppressed. Thus, even when heat treatment is conducted to the glass substrate to which a single-crystalline semiconductor layer having a different coefficient of thermal expansion is bonded, shrink of the glass substrate can be suppressed; therefore, film separation between the glass substrate and the single-crystalline semiconductor layer can be prevented and deformation such as warping of the glass substrate and the single-crystalline semiconductor layer can be prevented. Since defects in the above-described step can be prevented, a semiconductor device can be manufactured with high yield.

In addition, after heating the glass substrate, the glass substrate is preferably cooled down slowly. Preferably, after the heat treatment at a temperature higher than the temperature close to the strain point, specifically at a temperature which is higher than the temperature in a range from minus 50° C. to plus 50° C. of the strain point, the glass substrate may be slowly cooled down to a temperature lower than the strain point, preferably at a rate of 2° C./min or lower, more preferably at a rate of 0.5° C./min or lower, and further preferably at 0.3° C./min or lower. The temperature reduction rate may vary as appropriate depending on the kind of the substrate; however, when the temperature reduction rate is low, the local stress in the glass substrate can be eased at the same time as substantial shrinkage of the glass substrate. As the glass substrate shrinks more substantially, the shrinkage of the glass substrate in later heat treatment becomes smaller. This heat treatment may be conducted under either a reduced pressure or an atmospheric pressure, and the atmosphere may be a nitrogen atmosphere, an oxygen atmosphere, or the like.

After bonding the base substrate 100 and the semiconductor substrate 101 with the insulating layer 104 interposed therebetween, one of heat treatment and pressure treatment, or both of them is/are preferably conducted. By conducting heat treatment or pressure treatment, the bonding strength can be improved. The temperature of the heat treatment is set at a temperature equal to or lower than that of the heat treatment performed to the base substrate 100 in advance. The pressure treatment is conducted so that pressure is applied perpendicularly to the bonding surfaces in consideration of resistance to pressure of the base substrate 100 and the semiconductor substrate 101.

Figure 1D:
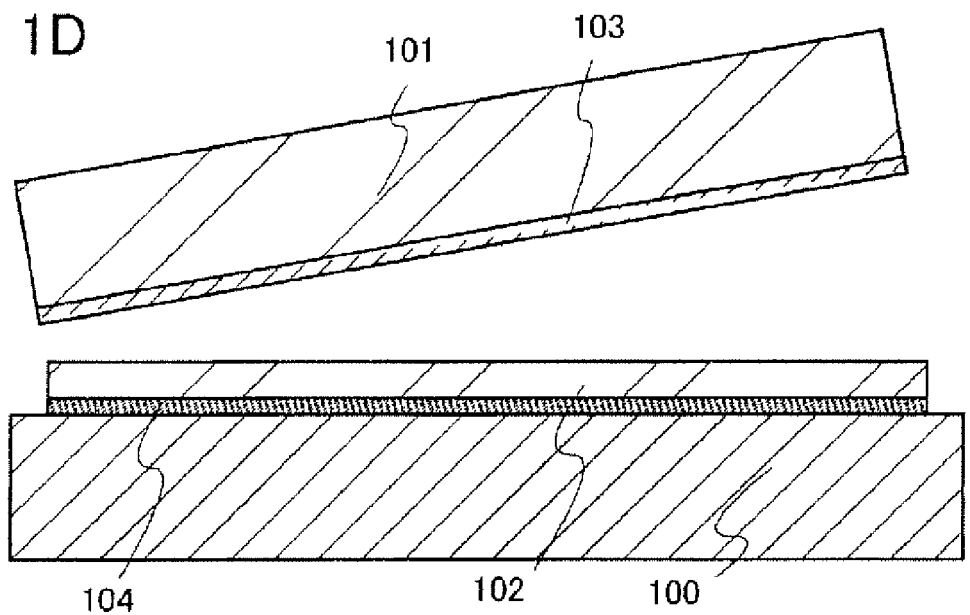

In FIG. 1D, after boding of the base substrate 100 and the semiconductor substrate 101, heat treatment is conducted and the semiconductor substrate 101 is separated from the base substrate 100 using the separation layer 103 as a separation surface. For example, by conducting heat treatment at 400 to 600° C., the volume of the microcavities formed in the separation layer 103 is changed; thus, separation along the separation layer 103 can be performed. In this embodiment mode, the temperature of the heat treatment is set at a temperature lower than that of the heat treatment conducted to the base substrate 100 in advance. Since the insulating layer 104 is bonded to the base substrate 100, there remains an LTSS layer 102 having the same crystallinity as the semiconductor substrate 101, over the base substrate 100.

Figure 2A:
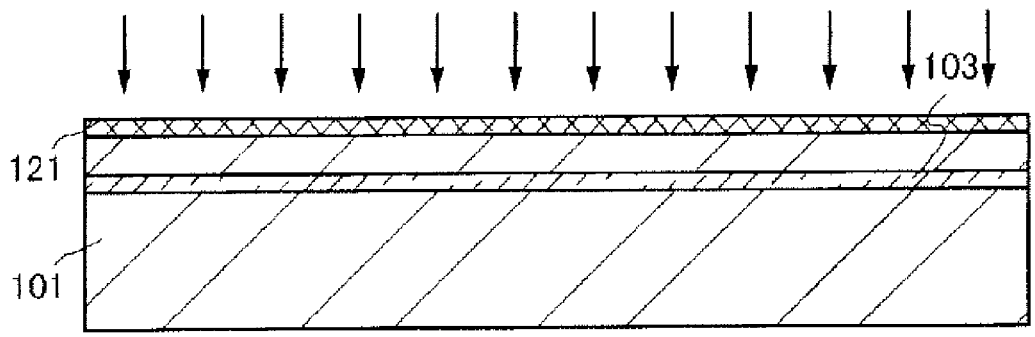
FIGS. 2A to 2C show a manufacturing method of a semiconductor device according to the present invention.
Figure 2B:
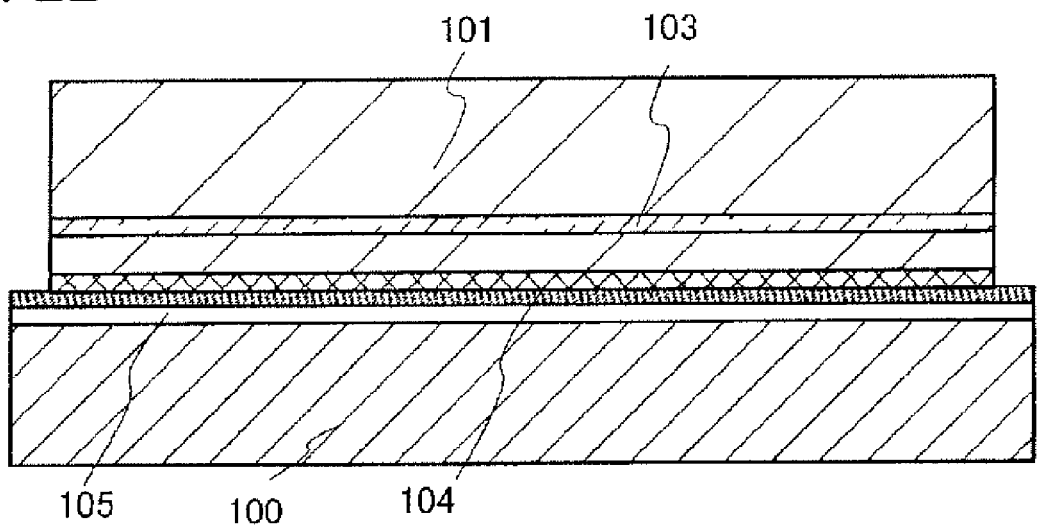
Figure 2C:
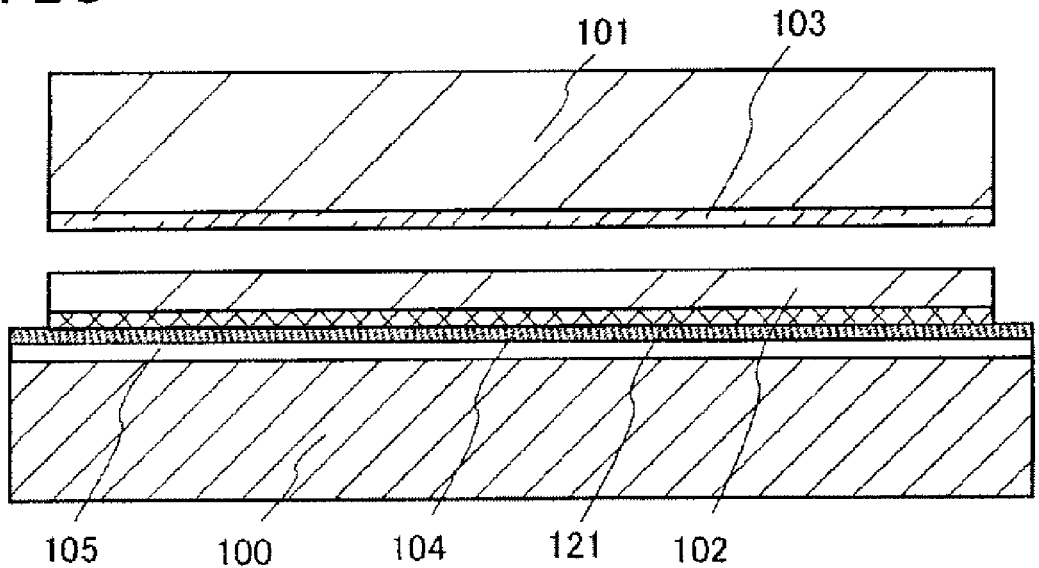

FIGS. 2A to 2C show a process of forming an LTSS layer by providing an insulating layer which forms a bonding interface on the base substrate side. FIG. 2A shows a step of forming a separation layer 103 at a predetermined depth by irradiating a semiconductor substrate 101 over which a silicon oxide film 121 is formed, with ions accelerated by electric field. Irradiation with ions are conducted similarly to the case of FIG. 1A. By forming the silicon oxide film 121 on the surface of the semiconductor substrate 101, the surface irradiated with the ions due to irradiation with the ions can be prevented from being damaged, and loss of planarity can be prevented.

FIG. 2B shows a step of forming a bond by making a base substrate 100 over which a barrier layer 105 and an insulating layer 104 are formed and a surface of the silicon oxide film 121 provided for the semiconductor substrate 101 in close contact with each other. By making the insulating layer 104 over the base substrate 100 and the silicon oxide film 121 provided for the semiconductor substrate 101 in close contact, a bond is formed.

By making the insulating layer 104 over the base substrate 100 and the silicon oxide film 121 provided for the semiconductor substrate 101 face each other and pressing one part thereof from the outside, the insulating layer 104 and the silicon oxide film 121 attract each other by increase in van der Waals force or contribution of hydrogen bonding due to local reduction in distance between the bonding surfaces. Further, since the distance between the insulating layer 104 over the base substrate 100 and the silicon oxide film 121 provided for the semiconductor substrate 101 in an adjacent region, which also face each other, is reduced, a region which is strongly influenced by van der Waals force or a region to which hydrogen bonding contributes is widened. Accordingly, bonding proceeds and spreads to the entire bonding surfaces.

As shown in FIG. 2C, the semiconductor substrate 101 is separated. Heat treatment for separating the single-crystalline semiconductor layer is conducted similarly to the case of FIG. 1D. The temperature of the heat treatment in the bonding and separation step is set equal to or lower than the temperature of the heat treatment conducted to the base substrate 100 in advance. Thus, a semiconductor substrate shown in FIG. 2C can be obtained.

As the base substrate 100, a glass substrate is used. As the glass substrate, various glass substrates used for electronic industry called non-alkali glass such as aluminosilicate glass, aluminoborosilicate glass, barium borosilicate glass can be used. That is, a single-crystalline semiconductor layer can be formed over a substrate having a side of 1 meter or more. Using such a large-area substrate, not only a display device like a liquid crystal display but also a semiconductor integrated circuit can be manufactured.

An LTSS layer 102 is a single-crystalline semiconductor layer, and single-crystalline silicon is typically applied to the LTSS layer 102. Alternatively, silicon which can be separated from a polycrystalline semiconductor substrate by a hydrogen ion irradiation separation method or germanium which can be separated from a single-crystalline semiconductor substrate or a polycrystalline semiconductor substrate by a hydrogen ion irradiation separation method can be used. Further alternatively, a crystalline semiconductor layer using a compound semiconductor of silicon germanium, gallium arsenide, indium phosphide, or the like can be used as well.

Figure 3A:
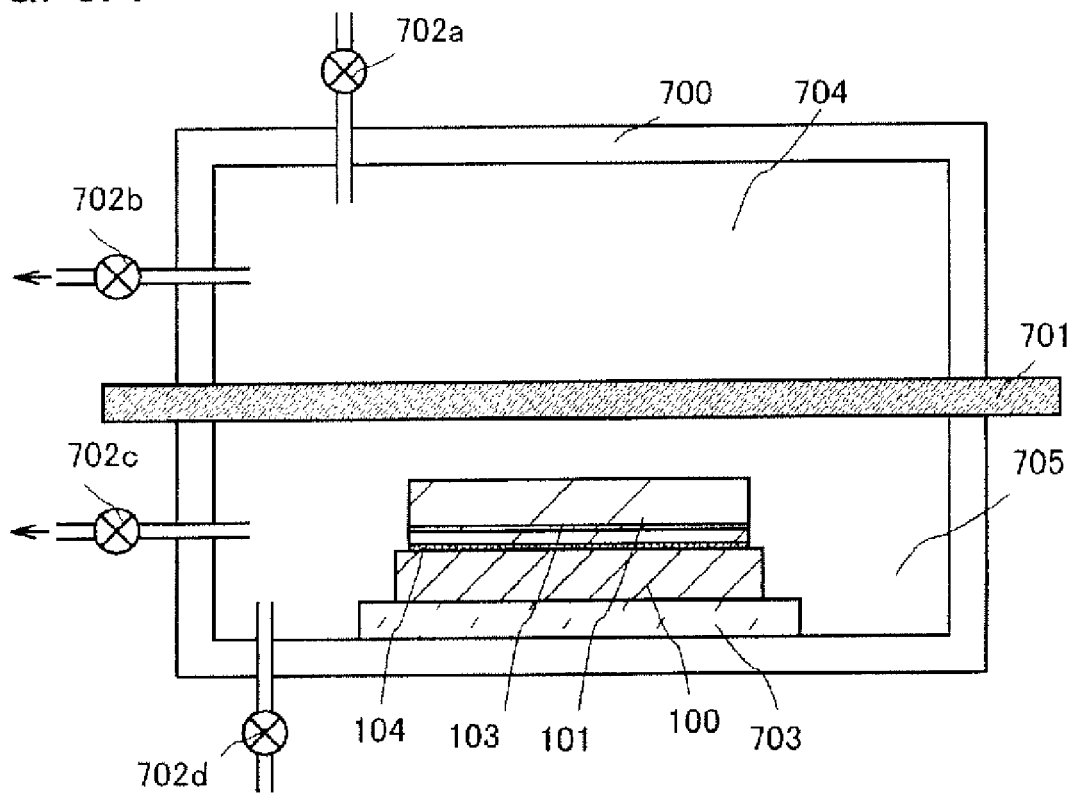
FIGS. 3A and 3B show a manufacturing method of a semiconductor device according to the present invention.
Figure 3B:
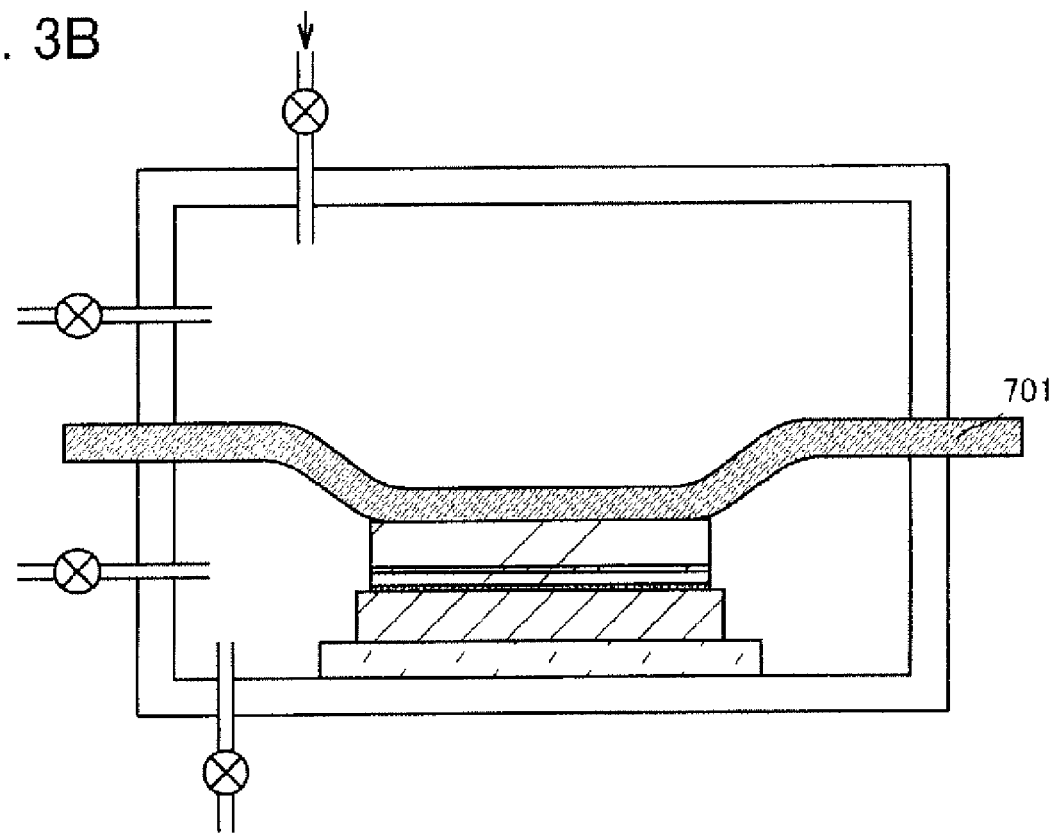

In order to strengthen the bond, the base substrate 100 and the LTSS layer 102 may be pressed. Further, heat treatment is preferably applied. Heat treatment may be conducted in the pressed state. FIGS. 3A and 3B show an example of a bonding method of the base substrate 100 and the semiconductor substrate 101, which are shown in FIG. 1C.

FIGS. 3A and 3B show a chamber 700 which is separated to a pressure chamber 704 and a sample chamber 705 by a diaphragm 701, and the sample chamber 705 includes a heater 703 that can heat a sample. In the chamber 700, an exhaust valve 702c and an air supply valve 702d for controlling the pressure in the sample chamber 705, and an exhaust valve 702b and an air supply valve 702a for controlling the pressure in the pressure chamber 704 are provided. The base substrate 100, the insulating layer 104, and the semiconductor substrate 101 including the separation layer 103 are provided over the heater 703 in the sample chamber 705.

As shown in FIG. 3A, the air supply valves 702a and 702d are closed, and air is exhausted from the exhaust valves 702b and 702c, so that pressures in the pressure chamber 704 and the sample chamber 705 are reduced to the same level. Next, as shown in FIG. 3B, the exhaust valves 702b and 702c are closed, and the air supply valve 702a is opened with the air supply valve 702d closed, so that the pressure chamber 704 is exposed to an atmosphere and the pressure of the pressure chamber 704 is changed from a reduced pressure to an atmospheric pressure. Since the sample chamber 705 has a reduced pressure, the diaphragm 701 is dented toward the sample chamber 705 as shown in FIG. 3B; accordingly, the diaphragm 701 can press the base substrate 100, the insulating layer 104, and the semiconductor substrate 101 including the separation layer 103, which are a sample. When heating is conducted with the heater 703 in pressing, heat treatment can be conducted in a pressure state. After that, the air supply valve 702d is opened, and the pressure of the sample chamber 705 is changed from the reduced pressure to an atmospheric pressure. Then, the base substrate 100, the insulating layer 104, and the separation layer 103, which are a sample, can be taken out.

To bond the base substrate 100 and the insulating layer 104 which are formed from different materials at a low temperature, surfaces are cleaned. When the base substrate 100 and the insulating layer 104 are bonded in this state, a bond is formed by attractive force between the surfaces. Further, treatment for attaching many hydroxyls on the surfaces is preferably added. For example, the surface of the base substrate 100 is preferably made to have a hydrophilic property by oxygen plasma treatment or ozone treatment. In the case where treatment for making surfaces hydrophilic is applied in this manner, the hydroxyls on the surfaces act to form a bond due to a hydrogen bonding. Heat treatment may be conducted to improve the strength of the bond formed at a room temperature; as described above, heat treatment is conducted in advance to the base substrate at a temperature higher than that of the heat treatment for improving the bonding strength in the present invention.

As the treatment for bonding the base substrate 100 and the insulating layer 104 which are formed from different materials at a low temperature, a surface which forms a bond may be irradiated with an ion beam using an inert gas such as argon to be cleaned. By the ion beam irradiation, dangling bonds are exposed on the surface of the base substrate 100 or the insulating layer 104, and the surface becomes very active. In this way, when activated surfaces are made in close contact with each other, a bond can be formed even at a low temperature. In the method of forming a bond by activating surfaces, since it is required to keep the surfaces in a highly clean state, the method is preferably carried out in vacuum.

The LTSS layer 102 is formed from a thin slice of a single-crystalline semiconductor substrate. For example, the LTSS layer 102 can be formed at a predetermined depth by an ion irradiation separation method in which a single-crystalline semiconductor substrate is irradiated with hydrogen or fluorine ions, heat treatment is then conducted, and a single-crystalline silicon layer, which is a surface layer, is separated. Alternatively, a method in which single-crystalline silicon is epitaxially grown on porous silicon and the porous silicon layer is separated by water jetting may also be applied. The thickness of the LTSS layer 102 is 5 to 500 nm, and preferably 10 to 200 nm.

Further, when the barrier layer 105 and the insulating layer 104 are provided over the base substrate 100, in the case where the LTSS layer 102 is bonded to the base substrate 100, the LTSS layer 102 can be prevented from being contaminated by diffusion of a movable ion impurity such as an alkali metal or an alkaline earth metal from the glass substrate used as the base substrate 100. The insulating layer 104 on the base substrate 100 side may be provided as appropriate.

A nitrogen-containing insulating layer may be provided between the LTSS layer 102 and the insulating layer 104. The nitrogen-containing insulating layer is formed by stacking one or more films selected from a silicon nitride film, a silicon nitride oxide film, or a silicon oxynitride film. For example, the nitrogen-containing insulating layer can be formed by stacking a silicon oxynitride film and a silicon nitride oxide film from the LTSS layer 102 side. The insulating layer 104 is provided to form a bond with the base substrate 100, whereas the nitrogen-containing insulating layer is preferably provided to prevent the LTSS layer 102 from being contaminated by diffusion of an impurity such as movable ions or moisture.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Further, the insulating layer 104 may be provided on the side of the base substrate 100. It is preferable that the barrier layer 105 be provided between the base substrate 100 and the insulating layer 104 in order to prevent the LTSS layer 102 from being contaminated by diffusion of a movable ion impurity such as an alkali metal or an alkaline earth metal from the glass substrate used as the base substrate 100. The silicon oxide film 121 is formed on the LTSS layer 102. This silicon oxide film 121 forms a bond with the insulating layer 104 and fixes the LTSS layer 102 over the base substrate 100. The silicon oxide film 121 is preferably formed by thermal oxidation.

Using the single-crystalline semiconductor layer (LTSS layer) transferred to the base substrate in the above-described manner, various semiconductor elements, memory elements, integrated circuits, and the like with high performance can be manufactured.

In this manner, according to this embodiment mode using the present invention, defects such as deformation and film separation of a single-crystalline semiconductor layer (LTSS layer) and a glass substrate can be prevented, and a semiconductor element and an integrated circuit with high reliability and high performance can be manufactured with high yield.

Embodiment Mode 2

Embodiment Mode 2 will describe an example of manufacturing a semiconductor device using the LTSS layer that is formed over the glass substrate in Embodiment Mode 1. Specifically, a liquid crystal display device using a liquid crystal display element as a display element will be described. Note that repetitive descriptions for the same components as or components having similar functions to the components in Embodiment Mode 1 are omitted.

Figure 16A:
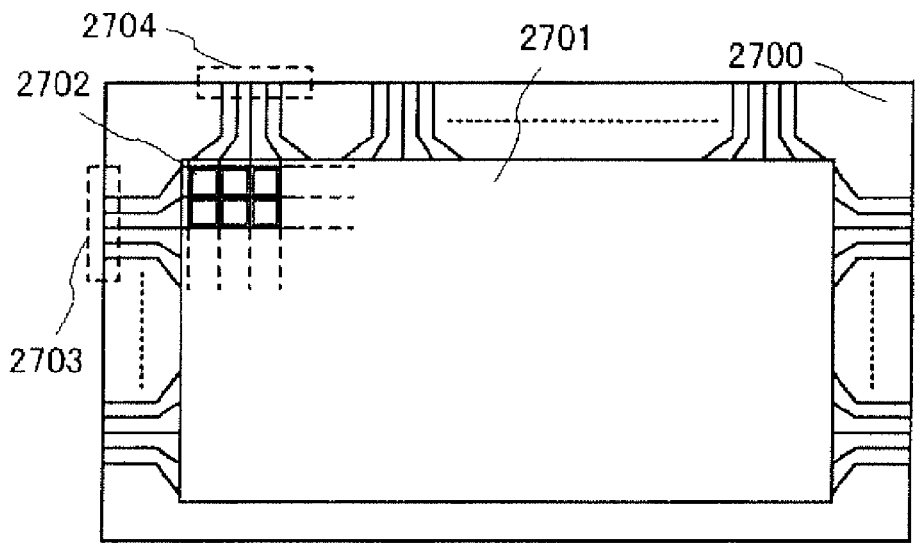
FIGS. 16A to 16C are plane views of semiconductor devices according to the present invention.

FIG. 16A is a top view showing a structure of a display panel according to the present invention. A pixel portion 2701 in which pixels 2702 are arranged in matrix, a scanning line input terminal 2703, and a signal line input terminal 2704 are formed over a substrate 2700 having an insulating surface. The number of pixels may be determined in accordance with various standards. In the case of XGA, the number of pixels may be 1024×768×3 (RGB). In the case of UXGA, the number of pixels may be 1600 1200×3 (RGB), and if the display panel is for full-spec high vision, the number of pixels may be 1920×1080×3 (RGB).

The pixels 2702 are formed in matrix by the intersection of scanning lines extended from the scanning line input terminal 2703 and signal lines extended from the signal line input terminal 2704. Each of the pixels 2702 is provided with a switching element and a pixel electrode layer connected thereto. A typical example of the switching element is a TFT. A gate electrode layer side of the TFT is connected to the scanning line, and a source or drain side of the TFT is connected to the signal line, which enables each pixel to be independently controlled by a signal input from the outside.

As main components of a TFT, a semiconductor layer, a gate insulating layer, and a gate electrode layer are given, and a wiring layer connected to source and drain regions which are formed in the semiconductor layer accompanies thereto. In terms of a structure, a top gate type in which a semiconductor layer, a gate insulating layer, and a gate electrode layer are provided from the substrate side; a bottom gate type in which a gate electrode layer, a gate insulating layer, and an LTSS layer are provided from the substrate side; and the like are typically known. Any of the structures may be applied to the present invention.

FIG. 16A shows a structure of a display panel in which a signal to be input to a scanning line and a signal line is controlled by an external driver circuit. Alternatively, a driver IC may be mounted on a substrate by a COG (chip on glass) method. As another mounting mode, a TAB (tape automated bonding) method may also be used.

Figure 16B:
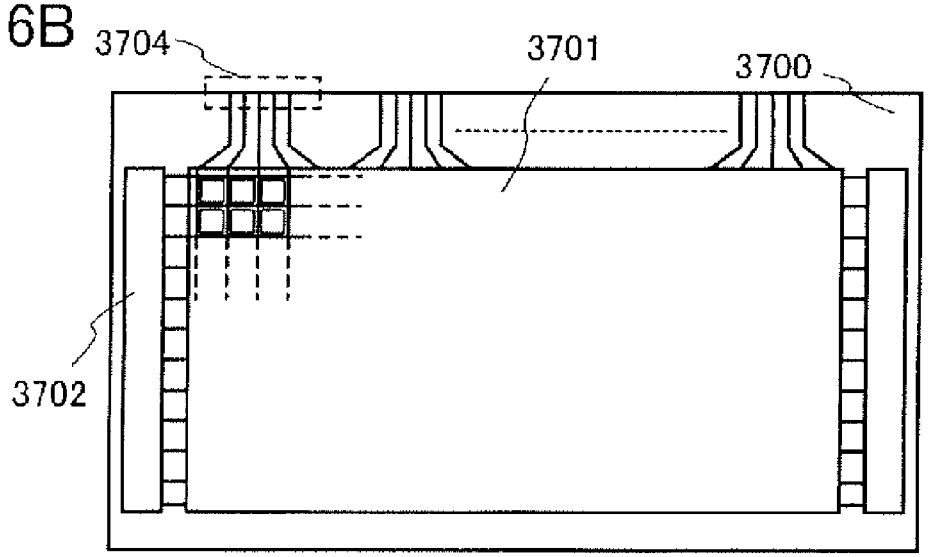
Figure 16C:
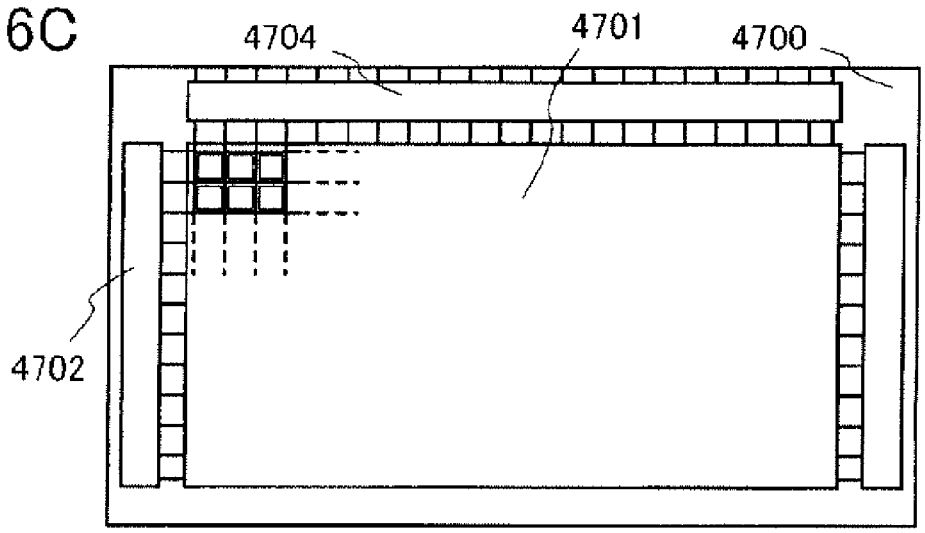

As shown in FIG. 16B, a scanning line driver circuit 3702 can be formed over a substrate 3700. In FIG. 16B, a pixel portion 3701 is connected to a signal line input terminal 3704 and is controlled by an external driver circuit in a similar manner to FIG. 16A. As shown in FIG. 16C, a pixel portion 4701, a scanning line driver circuit 4702, and a signal line driver circuit 4704 can be formed to be integrated over a substrate 4700.

As described in Embodiment Mode 1, a barrier layer 105 and an insulating layer 104 are provided over a base substrate 100 which is a glass substrate, and an LTSS layer 102 which is a single-crystalline semiconductor layer is formed (see FIG. 4A).

Figure 15:
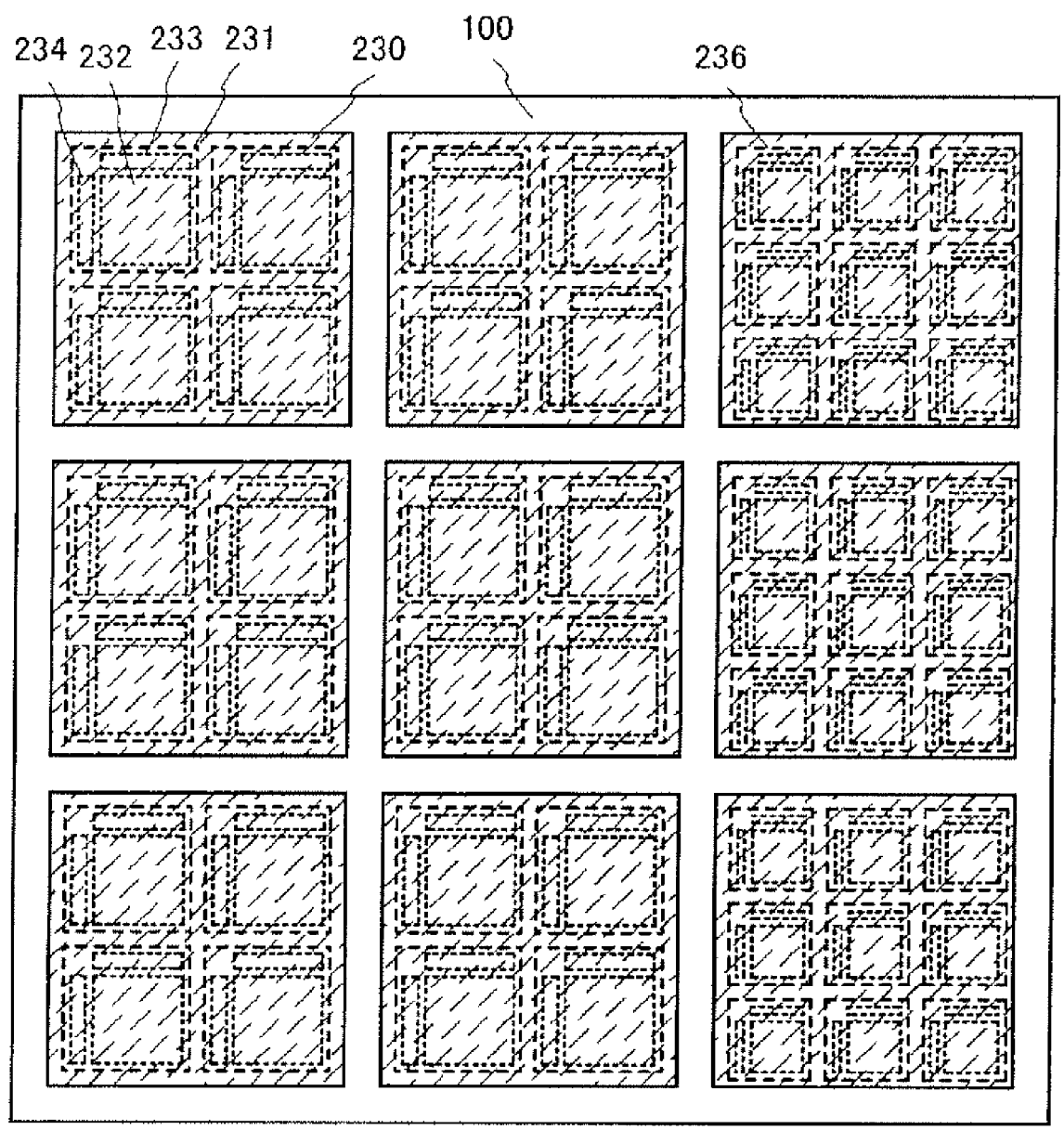
FIG. 15 shows a manufacturing method of a semiconductor device according to the present invention.

An LTSS layer can be bonded to a large-sized glass substrate called a mother glass, with which a display panel is manufactured. FIG. 15 shows a case of bonding a plurality of LTSS layers 230 to a mother glass used as the base substrate 100 which is a glass substrate. As shown in FIG. 15, a plurality of display panels 231 can be taken from one LTSS layer 230. A plurality of display panels are taken from a mother glass; LTSS layers each having a size such that a plurality of panels can be taken from one LTSS layer may be bonded to a mother glass as shown in FIG. 15, or LTSS layers each having a size corresponding to the size of a formation region of a display panel may be bonded to a mother glass. An LTSS layer having a size corresponding to a light-exposed region (which is resulted from a mask or a stepper size) of a light exposure apparatus used in etching may be bonded to a mother glass. Since the mother glass substrate has a larger area compared to a semiconductor substrate, a plurality of LTSS layers for forming plural kinds of display panels such as the display panel 231 and the display panel 236 as shown in FIG. 15 can be arranged separately. The display panel 231 includes a scanning line driver circuit region 234, a signal line driver circuit region 233, and a pixel formation region 232, and the LTSS layer 230 is bonded to the base substrate 100 (mother glass) so as to include these regions.

A p-type impurity element such as boron, aluminum, or gallium is added to the LTSS layer 102 in order to control the threshold voltage. For example, boron as the p-type impurity element may be added at a concentration equal to or greater than $5 \times 10^{16}$ cm$^{-1}$ and equal to or less than $1 \times 10^{18}$ cm$^{-3}$. Over the base substrate 100, a silicon nitride layer and a silicon oxide layer are formed to be stacked as the barrier layer 105. By providing the barrier layer over the base substrate 100, contamination of the LTSS layer 102 can be prevented. Instead of the silicon nitride layer, a silicon nitride oxide layer, an aluminum nitride layer, or an aluminum nitride oxide layer may be employed.

The LTSS layer 102 and the insulating layer 104 are etched so as to be divided into island shapes in accordance with arrangement of semiconductor elements, and LTSS layers 183, 184, and 185 are formed. Etching may be carried out using a mask by photolithography or the like.

The etching may be carried out by either plasma etching (dry etching) or wet etching. For treating a large-sized substrate, plasma etching is suitable. As an etching gas, a fluorine-based gas such as $CF_4$ or $NF_3$ or a chlorine-based gas such as $Cl_2$ or $BCl_3$ is used, and an inert gas such as He or Ar may be appropriately added thereto. If the etching is carried out utilizing atmospheric pressure discharge, electric discharge machining can be carried out locally and a mask layer does not need to be formed over the entire surface of the substrate.

In the present invention, a conductive layer to form a wiring layer or an electrode layer, a mask layer used for forming a predetermined pattern, and the like may be formed by a method by which a pattern can be formed selectively, such as a droplet discharge method. A droplet discharging (ejecting) method (also referred to as an "ink-jet method" depending on its system) can form a predetermined pattern (of a conductive layer, an insulating layer, or the like) by selectively discharging (ejecting) droplets of a composition mixed for a specific purpose. At this time, treatment for controlling wettability or adhesiveness may be carried out to a region on which the pattern is formed. A method by which a pattern can be transferred or drawn, e.g., a printing method (a method by which a pattern is formed, such as screen printing or offset printing), can also be used.

In this embodiment mode, for a mask, a resin material such as an epoxy resin, an acrylic resin, a phenol resin, a novolac resin, a melamine resin, or a urethane resin is used. An organic material such as benzocyclobutene, parylene, fluorinated arylene ether, or polyimide; a compound material formed by polymerization of siloxane-based polymers or the like; or the like can also be used. Alternatively, a positive resist, a negative resist, or the like may be used. If the droplet discharge method is used with any material, the surface tension and viscosity of the material are appropriately adjusted by, for example, adjusting the concentration of a solvent or adding a surfactant or the like.

A gate insulating layer 107 covering the LTSS layer 183, the LTSS layer 184, and the LTSS layer 185 is formed. The gate insulating layer 107 is formed of an insulating film containing silicon with a thickness of 10 to 150 nm by a plasma CVD method, a sputtering method, or the like. The gate insulating layer 107 may be formed by using a material such as an oxide material or nitride material of silicon, typified by silicon nitride, silicon oxide, silicon oxynitride, and silicon nitride oxide, and may have a stacked structure or a single-layer structure. Further, the insulating layer may be a stacked layer of three layers including a silicon nitride film, a silicon oxide film, and a silicon nitride film. A single layer or a stacked layer of two layers of a silicon oxynitride film may be employed as well. Preferably, a silicon nitride film with dense film quality may be used. A thin silicon oxide film with a thickness of 1 to 100 nm, preferably 1 to 10 nm, and more preferably 2 to 5 nm may be formed between the LTSS layers and the gate insulating layer. As a method for forming a thin silicon oxide film, the surface of the semiconductor region is oxidized by a GRTA method, an LRTA method, or the like to form a thermal oxide film, thereby forming a thin silicon oxide film. It is to be noted that a rare gas element such as argon may be contained in a reaction gas and be mixed into an insulating film to be formed in order to form a dense insulating film having little gate leak current at a low film formation temperature.

Next, a first conductive film having a thickness of 20 to 100 nm and a second conductive film having a thickness of 100 to 400 nm, each of which serves as a gate electrode layer, are stacked over the gate insulating layer 107. The first conductive film and the second conductive film can be formed by a sputtering method, an evaporation method, a CVD method, or the like. The first conductive film and the second conductive film may be formed of an element selected from tantalum (Ta), tungsten (W), titanium (Ti), molybdenum (Mo), aluminum (Al), copper (Cu), chromium (Cr), or neodymium (Nd), or an alloy material or compound material including the element as a main component. A semiconductor film typified by a polycrystalline silicon film that is doped with an impurity element such as phosphorus or an AgPdCu alloy may also be used as the first conductive film and the second conductive film. The conductive film is not limited to the two-layer structure, and for example, may have a three-layer structure in which a tungsten film of 50 nm thick as a first conductive film, an aluminum-silicon alloy (Al—Si) film of 500 nm thick as a second conductive film, and a titanium nitride film of 30 nm thick as a third conductive film are sequentially stacked. In a case of the three-layer structure, tungsten nitride may be used instead of tungsten as the first conductive film; an aluminum-titanium alloy (Al—Ti) film may be used instead of an aluminum-silicon alloy (Al—Si) film as the second conductive film; or a titanium film may be used instead of a titanium nitride film as the third conductive film as well. Further, a single-layer structure may also be used.

Then, masks 110a, 110b, 110d, 110e, and 110f are formed of a resist by a photolithography method, and the first conductive film and the second conductive film are processed into a desired shape to form first gate electrode layers 120, 122, 124, and 125, a first conductive layer 126, and conductive layers 109, 112, 114, 115, and 116 (see FIG. 4C). Etching can be conducted by an ICP (inductively coupled plasma) etching method by appropriately adjusting etching conditions (the amount of electric power applied to a coil-shaped electrode, the amount of electric power applied to an electrode on a substrate side, an electrode temperature on a substrate side, and the like) so that the first gate electrode layers 120, 122, 124, and 125, the first conductive layer 126, and the conductive layers 109, 112, 114, 115, and 116 have a desired taper shape. Further, an angle and the like of the taper shape can also be controlled by the shapes of the masks 110a, 110b, 110d, 110e, and 110f. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used. In this embodiment mode, the second conductive film is etched using an etching gas containing $CF_4$, $Cl_2$, and $O_2$, and then, the first conductive film is continuously etched using an etching gas containing $CF_4$ and $Cl_2$.

Then, the conductive layers 109, 112, 114, 115, and 116 are processed into a desired shape using the masks 110a, 110b, 110d, 110e, and 110f. At this time, the conductive layers are etched at an etching condition of high selectivity of the second conductive film which forms the conductive layers with respect to the first conductive film which forms the first gate electrode layers. By this etching, the conductive layers 109, 112, 114, 115, and 116 are etched to form second gate electrode layers 131, 132, 134, and 135 and a second conductive layer 136. In this embodiment mode, the second gate electrode layers and the second conductive layer also have a taper shape, in which taper angles are larger than those of the first gate electrode layers 120, 122, 124, and 125 and the first conductive layer 126. It is to be noted that the taper angle is an angle of the side surface with respect to the surface of the first gate electrode layer, the second gate electrode layer, the first conductive layer, or the second conductive layer. Accordingly, if the taper angle is increased to 90°, the conductive layer has a perpendicular side surface. In this embodiment mode, the second gate electrode layers and the second conductive layer are formed by using an etching gas of $Cl_2$, $SF_6$, and $O_2$.

In this embodiment mode, each of the first gate electrode layers, the conductive layers, and the second gate electrode layers is formed to have a taper shape, and thus, both of the two gate electrode layers have taper shapes. However, the present invention is not limited thereto, and one of the gate electrode layers may have a taper shape while the other has a perpendicular side surface by anisotropic etching. As described in this embodiment mode, the taper angles may be different or the same between the stacked gate electrode layers. With a taper shape, coverage of a film to be stacked thereover is improved and a defect is reduced, and thus, reliability is enhanced.

Through the aforementioned process, a gate electrode layer 117 formed of the first gate electrode layer 120 and the second gate electrode layer 131, and a gate electrode layer 118 formed of the first gate electrode layer 122 and the second gate electrode layer 132 can be formed in a peripheral driver circuit region 204; and a gate electrode layer 127 formed of the first gate electrode layer 124 and the second gate electrode layer 134, a gate electrode layer 128 formed of the first gate electrode layer 125 and the second gate electrode layer 135, and a conductive layer 129 formed of the first conductive layer 126 and the second conductive layer 136 can be formed in a pixel region 206 (see FIG. 4D). In this embodiment mode, the gate electrode layers are formed by dry etching; however, wet etching may also be employed.

The gate insulating layer 107 may be etched to some extent and reduced in thickness (so-called film reduction) by the etching step for forming the gate electrode layers.

By making the width of the gate electrode layer narrow in forming the gate electrode layer, a thin film transistor capable of high speed operation can be formed. Two methods for forming a gate electrode layer having a narrow width in a channel direction will be described below.

A first method is to form a mask for a gate electrode layer and then slim the mask in a width direction by etching, ashing, or the like to form a mask with a narrower width. By using the mask formed to have a narrower width in advance, the gate electrode layer can also be formed in a shape with a narrower width.

A second method is to form a normal mask and then form a gate electrode layer using the mask. Then, the obtained gate electrode layer is narrowed in a width direction by side etching. Accordingly, a gate electrode layer with a narrower width can be finally formed. Through the aforementioned process, a thin film transistor with a short channel length can be formed, which can realize a thin film transistor capable of high speed operation.

Next, an impurity element 151 which imparts n-type conductivity is added using the gate electrode layers 117, 118, 127, and 128 as masks to form first n-type impurity regions 140a, 140b, 141a, 141b, 142a, 142b, and 142c (see FIG. 5A). In this embodiment mode, doping is performed by using phosphine ($PH_3$) as a doping gas containing an impurity element (the doping gas is formed by diluting $PH_3$ with hydrogen ($H_2$), and the proportion of $PH_3$ in the gas is 5%) with a gas flow rate of 80 sccm, a beam current of 54 µA/cm, an accelerating voltage of 50 kV, and a dose of $7.0 \times 10^{13}$ ions/cm$^2$. Here, doping is performed so that the impurity element which imparts n-type conductivity is contained at a concentration of about $1\times10^{17}$ to $5\times10^{18}$/cm$^3$ in the first n-type impurity regions 140a, 140b, 141a, 141b, 142a, 142b, and 142c. In this embodiment mode, phosphorus (P) is used as the impurity element which imparts n-type conductivity.

In this embodiment mode, regions of the impurity regions, which overlap with the gate electrode layers with the gate insulating layer interposed therebetween, are referred to as Lov regions. Further, regions of the impurity regions, which do not overlap with the gate electrode layers with the gate insulating layer interposed therebetween, are referred to as Loff regions. In FIGS. 5A to 5C, the impurity regions are shown by hatching and blank spaces (or dotted hatching). This does not mean that the blank spaces are not doped with impurity elements, but makes it easy to understand that the concentration distribution of the impurity element in these regions reflects the mask and the doping condition. It is to be noted that the same can be said for the other drawings of this specification.

Next, masks 153a, 153b, and 153c which cover the LTSS layer 183 and part of the LTSS layer 185 are formed. By using the masks 153a, 153b, and 153c and the second gate electrode layer 132 as masks, an impurity element 152 which imparts n-type conductivity is added to form second n-type impurity regions 144a and 144b, third n-type impurity regions 145a and 145b, second n-type impurity regions 147a, 147b and 147c, and third n-type impurity regions 148a, 148b, 148c, and 148d. In this embodiment mode, doping is performed by using PH$_3$ as a doping gas containing an impurity element (the doping gas is formed by diluting PH$_3$ with hydrogen (H$_2$), and the proportion of PH$_3$ in the gas is 5%) with a gas flow rate of 80 sccm, a beam current of 540 μA/cm, an accelerating voltage of 70 kV, and a dose of $5.0\times10^{15}$ ions/cm$^2$. Here, doping is performed so that each of the second n-type impurity regions 144a and 144b contains the impurity element which imparts n-type conductivity at a concentration of about $5\times10^{19}$ to $5\times10^{20}$/cm$^3$. The third n-type impurity regions 145a and 145b are formed to contain the impurity element which imparts n-type conductivity at almost the same concentration as or a little higher concentration than those of the third n-type impurity regions 148a, 148b, 148c, and 148d. Further, a channel formation region 146 is formed in the LTSS layer 184, and channel formation regions 149a and 149b are formed in the LTSS layer 185 (see FIG. 5B).

The second n-type impurity regions 144a, 144b, 147a, 147b, and 147c are high concentration n-type impurity regions which function as sources and drains. On the other hand, the third n-type impurity regions 145a, 145b, 148a, 148b, 148c, and 148d are low concentration impurity regions which function as LDD (lightly doped drain) regions. Since the n-type impurity regions 145a and 145b are overlapped with the first gate electrode layer 122 with the gate insulating layer 107 interposed therebetween, the n-type impurity regions 145a and 145b are Lov regions, which can relieve an electric field around a drain and suppress deterioration of an on current due to hot carriers. As a result, a thin film transistor capable of high speed operation can be formed. On the other hand, since the third n-type impurity regions 148a, 148b, 148c, and 148d are formed in Loff regions, which are not overlapped with the gate electrode layers 127 and 128, an off current can be reduced. As a result, a semiconductor device with high reliability and low power consumption can be manufactured.

Next, the masks 153a, 153b, and 153c are removed, and masks 155a and 155b which cover the LTSS layers 184 and 185 are formed. An impurity element 154 which imparts p-type conductivity is added using the masks 155a and 155b, and the gate electrode layer 117 as masks to form first p-type impurity regions 160a and 160b and second p-type impurity regions 161a and 161b. In this embodiment mode, boron (B) is used as an impurity element, and doping is performed using diborane (B$_2$H$_6$) as a doping gas containing an impurity element (the doping gas is formed by diluting B$_2$H$_6$ with hydrogen (H$_2$), and the proportion of B$_2$H$_6$ in the gas is 15%) with a gas flow rate of 70 sccm, a beam current of 180 μA/cm, an accelerating voltage of 80 kV, and a dose of $2.0\times10^{15}$ ions/cm$^2$. Here, doping is performed so that the first p-type impurity regions 160a and 160b and the second p-type impurity regions 161a and 161b contain the impurity element which imparts p-type conductivity at a concentration of about $1\times10^{20}$ to $5\times10^{21}$/cm$^3$. In this embodiment mode, the second p-type impurity regions 161a and 161b reflect the shape of the gate electrode layer 117 and are formed in a self-alignment manner so as to contain the impurity element at a lower concentration than that of the first p-type impurity regions 160a and 160b. Further, a channel formation region 162 is formed in the LTSS layer 183 (see FIG. 5C).

The first p-type impurity regions 160a and 160b are high concentration p-type impurity regions and serve as a source and a drain. On the other hand, the second p-type impurity regions 161a and 161b are low concentration impurity regions which function as LDD (lightly doped drain) regions. Since the second p-type impurity regions 161a and 161b are overlapped with the first gate electrode layer 120 with the gate insulating layer 107 interposed therebetween, the second p-type impurity regions 161a and 161b are Lov regions, which can relieve an electric field around a drain and suppress deterioration of an on current due to hot carriers.

The masks 155a and 155b are removed by O$_2$ ashing or using a resist stripping solution, and the oxide film is also removed. After that, an insulating film, namely, a sidewall may be formed so as to cover side surfaces of the gate electrode layers. The sidewall can be formed of an insulating film containing silicon by a plasma CVD method or a low pressure CVD (LPCVD) method.

In order to activate the impurity element, heat treatment, strong light irradiation, or laser light irradiation may be performed. At the same time as the activation, plasma damage to the gate insulating layer and plasma damage to an interface between the gate insulating layer and the LTSS layer can be recovered.

Next, an interlayer insulating layer which covers the gate electrode layers and the gate insulating layer is formed. In this embodiment mode, a stacked structure of insulating films 167 and 168 is employed (see FIG. 6A). A silicon nitride oxide film is formed as the insulating film 167 to be 100 nm thick, and a silicon oxynitride film is formed as the insulating film 168 to be 900 nm thick to form a stacked structure. Further, a stacked-layer structure of three layers may be employed by forming a silicon oxynitride film to be 30 nm thick, a silicon nitride oxide film to be 140 nm thick, and a silicon oxynitride film to be 800 nm thick to cover the gate electrode layers and the gate insulating layer. In this embodiment mode, the insulating films 167 and 168 are continuously formed by a plasma CVD method similarly to the base film. The insulating films 167 and 168 are not limited to the above materials and may be formed by using a silicon nitride film, a silicon nitride oxide film, a silicon oxynitride film, or a silicon oxide film by a sputtering method or a plasma CVD method. Alternatively, a single layer structure or a stacked structure of three or more layers using another insulating film containing silicon may also be employed.

The insulating films 167 and 168 can also be formed of a material selected from aluminum nitride (AlN), aluminum oxynitride (AlON), aluminum nitride oxide containing more nitrogen than oxygen (AlNO), aluminum oxide, diamond-like carbon (DLC), a nitrogen-containing carbon film (CN), or another substance containing an inorganic insulating material. A siloxane resin may also be used. The siloxane resin is a resin including a Si—O—Si bond. Siloxane has a skeletal structure formed of a bond of silicon (Si) and oxygen (O). As a substituent, an organic group containing at least hydrogen (for example, an alkyl group or an aryl group) or a fluoro group may be used. In addition, as a substituent, both of an organic group containing at least hydrogen and a fluoro group may also be used. Further, an organic insulating material such as polyimide, acrylic, polyamide, polyimide amide, resist, benzocyclobutene, or polysilazane may also be used. A coating film with a favorable planarity formed by a coating method may also be used.

Next, contact holes (openings) which reach the LTSS layers and the gate electrode layer are formed in the insulating films 167 and 168 and the gate insulating layer 107 using a mask made of a resist. Etching may be performed once or plural times depending on selectivity of a material to be used. In this embodiment mode, first etching is performed to remove part of the insulating film 168 at a condition where selectivity of the insulating film 168 that is a silicon oxynitride film to the insulating film 167 that is a silicon nitride oxide film and the gate insulating layer 107 is high. Then, the insulating film 167 and the gate insulating layer 107 are partly removed by second etching to form openings which reach the first p-type impurity regions 160a and 160b and the second n-type impurity regions 144a, 144b, 147a and 147b, which are source regions and drain regions. In this embodiment mode, the first etching is performed by wet etching, and the second etching is performed by dry etching. A hydrofluoric acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used. Further, an inert gas may be added to an etching gas to be used. As an inert element to be added, one or a plurality of elements selected from He, Ne, Ar, Kr, or Xe can be used.

A conductive film is formed so as to cover the openings, and the conductive film is etched to form source or drain electrode layers 169a, 169b, 170a, 170b, 171a, and 171b, which are electrically connected to parts of source regions and drain regions. The source or drain electrode layers can be formed by forming a conductive film by a PVD method, a CVD method, an evaporation method, or the like, and then, etching the conductive film into a desired shape. Further, a conductive film can be selectively formed in a predetermined position by a droplet discharge method, a printing method, an electroplating method, or the like. Moreover, a reflow method or a damascene method may also be used. As a material for the source or drain electrode layers, a metal such as Ag, Au, Cu, Ni, Pt, Pd, Ir, Rh, W, Al, Ta, Mo, Cd, Zn, Fe, Ti, Zr, or Ba, or Si or Ge, an alloy or nitride thereof can be used. A stacked structure of these materials may also be employed. In this embodiment mode, titanium (Ti) is formed to be 60 nm thick, a titanium nitride film is formed to be 40 nm thick, aluminum is formed to be 700 nm thick, and titanium (Ti) is formed to be 200 nm thick, and then, the stacked film is processed into a desired shape.

Through the above-described process, an active matrix substrate can be manufactured, in which a transistor 173 that is a p-channel thin film transistor having a p-type impurity region in a Lov region and a transistor 174 that is an n-channel thin film transistor having an n-type impurity region in a Lov region are provided in the peripheral driver circuit region 204; and a transistor 175 that is a multi-channel type n-channel thin film transistor having an n-type impurity region in a Loff region and a capacitor element 176 are provided in the pixel region 206 (see FIG. 6B). Then, the active matrix substrate can be used for a display device including a liquid crystal display element.

By using the LTSS layers, a pixel region and a driver circuit region can be formed to be integrated over the same glass substrate. In that case, the transistor 175 in the pixel region and the transistors 173 and 174 in the driver circuit region can be formed simultaneously. The transistors used in the driver circuit region form a CMOS circuit.

A structure of the thin film transistor is not limited to this embodiment mode, and a single gate structure in which one channel formation region is formed, a double gate structure in which two channel formation regions are formed, or a triple gate structure in which three channel formation regions are formed may be employed. Further, the thin film transistor in the peripheral driver circuit region may also employ a single gate structure, a double gate structure, or a triple gate structure.

The present invention can be applied to not only a manufacturing method of the thin film transistor described in this embodiment mode but also a top gate type (a planar type), a bottom gate type (an inversely staggered type), a dual gate type having two gate electrode layers which are arranged above and below a channel region with a gate insulating film interposed therebetween, and other structures.

Next, an insulating film 181 is formed as a second interlayer insulating layer (see FIG. 6C).

The insulating film 181 can be formed using a material selected from silicon oxide, silicon nitride, silicon oxynitride, silicon nitride oxide, aluminum nitride (AlN), aluminum oxynitride (AlON), aluminum nitride oxide containing more nitrogen than oxygen, aluminum oxide, diamond-like carbon (DLC), a nitrogen-containing carbon film (CN), phosphosilicate glass (PSG), borophosphosilicate glass (BPSG), an alumina film, polysilazane, or another substance including an inorganic insulating material. Alternatively, a siloxane resin may be used. An organic insulating material may also be used, and either a photosensitive organic insulating material or a nonphotosensitive organic insulating material may be used. For example, polyimide, acrylic, polyamide, polyimide amide, resist, or benzocyclobutene can be used.

In this embodiment mode, the interlayer insulating layer provided for planarization is required to have a high heat resistant property, a high insulating property, and high planarity. Thus, the insulating film 181 is preferably formed by using a coating method typified by a spin coating method.

The insulating film 181 can be formed by using dipping, spray coating, a doctor knife, a roll coater, a curtain coater, a knife coater, a CVD method, an evaporation method, or the like. The insulating film 181 may also be formed by a droplet discharge method. In a case of using a droplet discharge method, a material solution can be saved. In addition, a method capable of transferring or drawing a pattern similarly to a droplet discharge method, for example, a printing method (a method of forming a pattern such as screen printing or offset printing) can also be used.

Next, a minute opening, that is, a contact hole is formed in the insulating film 181 in the pixel region 206.

By using the parallel plate RIE apparatus, the insulating film 181 is etched. Note that the etching time may be determined so that the wiring layer and the insulating film 168 are over-etched. Due to the condition where the wiring layer and the insulating film 168 are over-etched, variation in film thickness in the substrate and variation in etching rate can be reduced.

In addition, an ICP apparatus may also be used as the etching apparatus. In the above-described process, an opening reaching the source or drain electrode layer 171b can be formed in the pixel region 206.

Next, a pixel electrode layer 130 is formed so as to be in contact with the source or drain electrode layer. The pixel electrode layer 130 can be formed using indium tin oxide (ITO), indium zinc oxide (IZO) in which zinc oxide (ZnO) is mixed with indium oxide, a conductive material in which silicon oxide ($SiO_2$) is mixed with indium oxide, organic indium, organic tin, indium oxide containing tungsten oxide, indium zinc oxide containing tungsten oxide, indium oxide containing titanium oxide, indium tin oxide containing titanium oxide, a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), an alloy thereof, or metal nitride thereof.

FIGS. 7A and 7B are a plane view and a cross sectional view of a semiconductor device. FIG. 7A is a plane view of the semiconductor device, and FIG. 7B is a cross sectional view taken along a line C-D of FIG. 7A. An external terminal connection region 202 to which an FPC is attached, a scaling region 203, the peripheral driver circuit region 204, a peripheral driver circuit region 207, and the pixel region 206 are shown. A terminal electrode layer 178 which connects to an external terminal is provided in the external terminal connection region 202.

Next, an insulating layer 381 called an orientation film is formed by a printing method or a droplet discharge method to cover the pixel electrode layer 130 and the insulating film 181. Note that the insulating layer 381 can be selectively formed by using a screen printing method or an offset printing method. After that, rubbing treatment is performed. The rubbing treatment is not necessarily performed when the mode of liquid crystal is, for example, a VA mode. An insulating layer 383 functioning as an orientation film is formed similarly to the insulating layer 381. Then, a sealant 192 is formed by a droplet discharge method in a peripheral region of pixels.

After that, a counter substrate 195 provided with the insulating layer 383 functioning as an orientation film, a conductive layer 384 functioning as a counter electrode, a colored layer 385 functioning as a color filter, and a polarizer 391 (also referred to as a polarizing plate) is attached to the base substrate 100 that is a TFT substrate with a spacer 387 interposed therebetween, and a liquid crystal layer 382 is provided in a gap therebetween. Since the liquid crystal display device of this embodiment mode is a transmissive type, a polarizer (polarizing plate) 393 is provided on a surface opposite to the side having elements of the base substrate 100. The polarizer can be provided for the substrate using an adhesive layer. The sealant may be mixed with a filler, and further, the counter substrate 195 may be provided with a shielding film (black matrix) or the like. Note that the color filter or the like may be formed of materials exhibiting red (R), green (G), and blue (B) when the liquid crystal display device performs full color display. When performing monochrome display, the colored layer may be omitted or formed of a material exhibiting at least one color.

Note that the color filter is not provided in some cases where light-emitting diodes (LEDs) of RGB or the like are arranged as a backlight and a successive additive color mixing method (field sequential method) in which color display is performed by time division is employed. The black matrix is preferably provided so as to overlap with a transistor and a CMOS circuit for the sake of reducing reflection of incident light from external by wirings of the transistor and the CMOS circuit. Note that the black matrix may be provided so as to overlap with the capacitor element. This is because reflection by a metal film forming the capacitor element can be prevented.

The liquid crystal layer can be formed by a dispenser method (dripping method), or an injecting method by which liquid crystal is injected using a capillary phenomenon after attaching the base substrate 100 including the elements to the counter substrate 195. A dripping method is preferably employed when using a large-sized substrate to which an injecting method is not easily applied.

The spacer may be provided in such a way that particles each having a size of several μm are dispersed, or the spacer may be formed by a method in which a resin film is formed over the entire surface of the substrate and then etched. A material of the spacer is applied by a spinner and then subjected to light exposure and development to form a predetermined pattern. Further, the material is heated at 150 to 200° C. in a clean oven or the like so as to be hardened. The spacer manufactured thus can have various shapes depending on the conditions of the light exposure and development. It is preferable that the spacer have a columnar shape with a flat top so that mechanical strength of the liquid crystal display device can be secured when the counter substrate is attached. The shape can be conical, pyramidal, or the like, and there is no particular limitation on the shape.

Then, the terminal electrode layer 178 electrically connected to the pixel region is provided with an FPC 194 that is a wiring board for connection with an anisotropic conductive layer 196 interposed therebetween. The FPC 194 transmits signals or potential from the outside. Through the above process, a liquid crystal display device having a display function can be manufactured.

A retardation plate may be sandwiched between the polarizing plate and the liquid crystal layer. Further, an anti-reflection film which prevents reflection of incident light from external to the viewing side may be provided on the most viewing side.

Features of the present invention are that a glass substrate is used as the base substrate 100 to which the single-crystalline semiconductor layer is bonded and that before a bonding and separation step, the base substrate 100 is heated at a temperature higher than the heat temperature at heat treatment in the bonding and separation step.

In the present invention, the heat treatment in the bonding and separation step means heat treatment used in a step in which an LTSS layer and a glass substrate are bonded and the LTSS layer is separated from a semiconductor substrate. Further, the bonding and separation step also involves heat treatment performed to strongly bond the glass substrate to the LTSS layer after separation of the LTSS layer from the semiconductor substrate and formation of the LTSS layer over the glass substrate.

Heat treatments may be separately performed for a step of separating the LTSS layer from the semiconductor substrate to the glass substrate and a step of strongly bonding the glass substrate and the LTSS layer, or one-time heat treatment may be performed for the steps at the same time.

In the present invention, the single-crystalline semiconductor layer is heated at a temperature close to a strain point of the glass substrate, specifically at a temperature in a range from minus 50° C. to plus 50° C. of the strain point of the glass substrate in the bonding and separation step in which the single-crystalline semiconductor layer is bonded to the glass substrate. Accordingly, the glass substrate is subjected to heat treatment in advance at a temperature higher than the temperature close to the strain point, specifically, at a temperature which is higher than the temperature in a range from minus 50° C. to plus 50° C. of the strain point. Specifically, the heat treatment at a temperature close to the strain point of the glass substrate may be conducted at a temperature equal to or greater than 580° C. and equal to or less than 680° C.

The glass substrate shrinks by heating. Therefore, by making the glass substrate shrink in advance by heating at a temperature higher than a temperature close to a strain point of the glass substrate, specifically at a temperature which is higher than a temperature in a range from minus 50° C. to plus 50° C. of the strain point, shrink of the glass substrate at the heat treatment in the later bonding and separation step can be suppressed. Thus, even when heat treatment is conducted to the glass substrate to which a single-crystalline semiconductor layer having a different coefficient of thermal expansion is bonded, shrink of the glass substrate can be suppressed; therefore, film separation between the glass substrate and the single-crystalline semiconductor layer can be prevented and deformation such as warping of the glass substrate and the single-crystalline semiconductor layer can be prevented. Since defects in the above-described step can be prevented, a semiconductor device can be manufactured with high yield.

In addition, after heating the glass substrate, the glass substrate is preferably cooled down slowly. Preferably, after the heat treatment at a temperature higher than the temperature close to the strain point, specifically at a temperature which is higher than the temperature in a range from minus 50° C. to plus 50° C. of the strain point, the glass substrate may be slowly cooled down to a temperature lower than the strain point, preferably at a rate of 2° C./min or lower, more preferably at a rate of 0.5° C./min or lower, and further preferably at 0.3° C./min or lower. The temperature reduction rate may vary as appropriate depending on the kind of the substrate, however, when the temperature reduction rate is low, the local stress in the glass substrate can be eased at the same time as substantial shrinkage of the glass substrate. As the glass substrate shrinks more substantially, the shrinkage of the glass substrate in later heat treatment becomes smaller. This heat treatment may be conducted under either a reduced pressure or an atmospheric pressure, and the atmosphere may be a nitrogen atmosphere, an oxygen atmosphere, or the like.

In this manner, according to the present invention, defects such as deformation and film separation of a single-crystalline semiconductor layer (LTSS layer) and a glass substrate can be prevented, and a semiconductor element and an integrated circuit with high reliability and high performance can be manufactured with high yield.

Accordingly, by using the present invention, a semiconductor device including a liquid crystal display element with high performance and high reliability can be manufactured with high productivity.

Embodiment Mode 3

A semiconductor device having a light-emitting element can be formed by applying the present invention, and the light-emitting element emits light by any one of bottom emission, top emission, and dual emission. Embodiment Mode 3 will describe an example of a manufacturing method of a semiconductor device in which a semiconductor device having a display function (also called a display device or a light-emitting device) is manufactured as a bottom-emission, dual-emission, or top-emission semiconductor device with high performance and high reliability with high yield, with reference to FIGS. 8A to 10.

A semiconductor device shown in FIGS. 8A and 8B employs a bottom-emission structure in which light is emitted in a direction indicated by an arrow. FIG. 8A is a plane view of the semiconductor device, and FIG. 8B is a cross sectional view taken along a line E-F of FIG. 8A. In FIGS. 8A and 8B, the semiconductor device includes an external terminal connection region 252, a sealing region 253, a driver circuit region 254, and a pixel region 256.

The semiconductor device shown in FIGS. 8A and 8B includes an element substrate 600, a thin film transistor 655, a thin film transistor 677, a thin film transistor 667, a thin film transistor 668, a light-emitting element 690 including a first electrode layer 685, a light-emitting layer 688, and a second electrode layer 689, a filler 693, a sealant 692, an insulating film 601, a gate insulating layer 675, an insulating film 607, an insulating film 665, an insulating layer 686, a sealing substrate 695, a wiring layer 679, a terminal electrode layer 678, an anisotropic conductive layer 696, and an FPC 694. The semiconductor device includes the external terminal connection region 252, the sealing region 253, the driver circuit region 254, a driver circuit region 257, a driver circuit region 259, a driver circuit region 658, and the pixel region 256. The filler 693 can be formed by a dropping method using a composition in a liquid state. A semiconductor device (light-emitting display device) is sealed by attaching the element substrate 600 provided with the filler by a dropping method and the sealing substrate 695 to each other.

In the semiconductor device shown in FIGS. 8A and 8B, the first electrode layer 685 is formed using a light-transmitting conductive material so as to transmit light emitted from the light-emitting element 690, and the second electrode layer 689 is formed using a reflective conductive material so as to reflect light emitted from the light-emitting element 690.

Since the second electrode layer 689 is required to have reflectivity, a conductive film formed of titanium, tungsten, nickel, gold, platinum, silver, copper, tantalum, molybdenum, aluminum, magnesium, calcium, lithium, or an alloy thereof may be used. It is preferable to use a substance having high reflectivity in a visible light range, and an aluminum film is used in this embodiment mode.

The first electrode layer 685 may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

Figure 9:
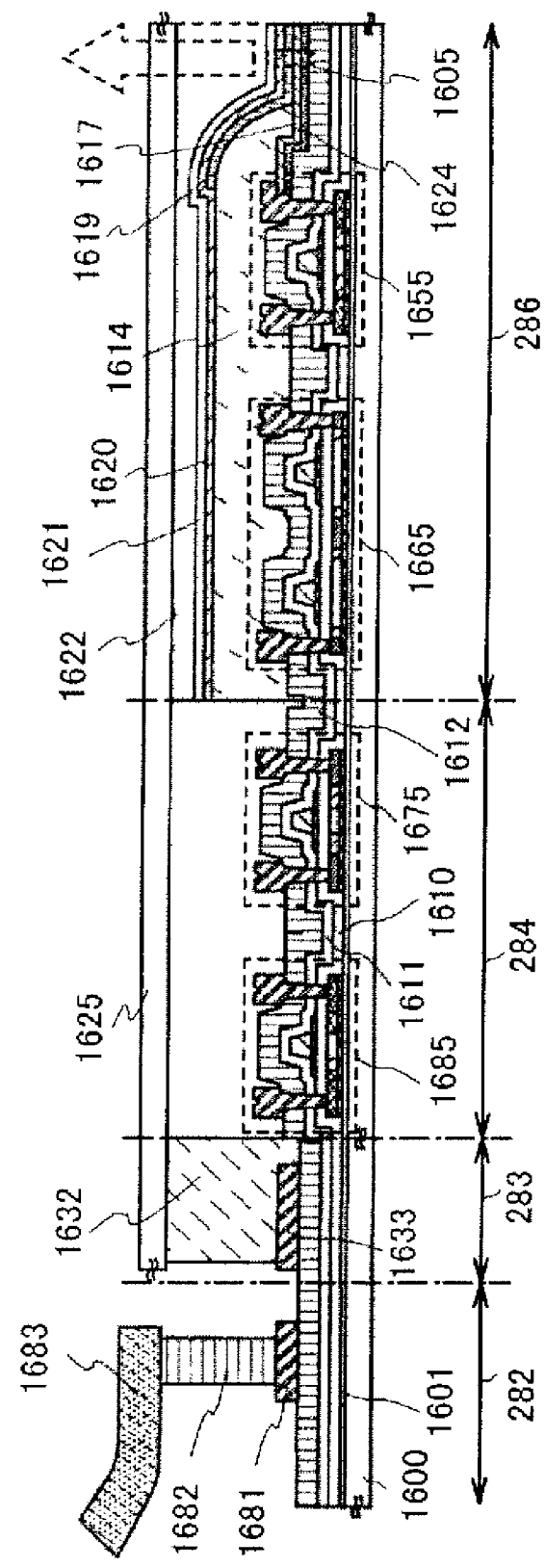
FIG. 9 shows a semiconductor device according to the present invention.

A semiconductor device shown in FIG. 9 employs a top-emission structure in which light is emitted in a direction indicated by an arrow. The semiconductor device shown in FIG. 9 includes an element substrate 1600, a thin film transistor 1655, a thin film transistor 1665, a thin film transistor 1675, a thin film transistor 1685, a wiring layer 1624, a first electrode layer 1617, a light-emitting layer 1619, a second electrode layer 1620, a light emitting element 1605, a protective film 1621, a filler 1622, a sealant 1632, an insulating film 1601, a gate insulating layer 1610, an insulating film 1611, an insulating film 1612, an insulating layer 1614, a sealing substrate 1625, a wiring layer 1633, a terminal electrode layer 1681, an anisotropic conductive layer 1682, and an FPC 1683.

The semiconductor device shown in FIG. 9 includes an external terminal connection region 282, a sealing region 283, a driver circuit region 284, and a pixel region 286. In the semiconductor device shown in FIG. 9, the wiring layer 1624 that is a reflective metal layer is provided below the first electrode layer 1617. The first electrode layer 1617 that is a transparent conductive film is formed over the wiring layer 1624. Since the wiring layer 1624 is required to have reflectivity, a conductive film or the like formed of titanium, tungsten, nickel, gold, platinum, silver, copper, tantalum, molybdenum, aluminum, magnesium, calcium, lithium, or an alloy thereof may be used. It is preferable to use a substance having high reflectivity in a visible light range. A conductive film may also be used as the first electrode layer 1617, and in that case, the wiring layer 1624 having reflectivity is not required to be provided.

The first electrode layer 1617 and the second electrode layer 1620 may each be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

Further, when a material such as a metal film having no light-transmitting property is formed thin (preferably a thickness of about 5 to 30 nm) so as to be able to transmit light, light can be emitted through the first electrode layer 1617 and the second electrode layer 1620. As a metal thin film which can be used for the first electrode layer 1617 and the second electrode layer 1620, a conductive film formed of titanium, tungsten, nickel, gold, platinum, silver, aluminum, magnesium, calcium, lithium, or an alloy thereof, or the like can be used.

Figure 10:
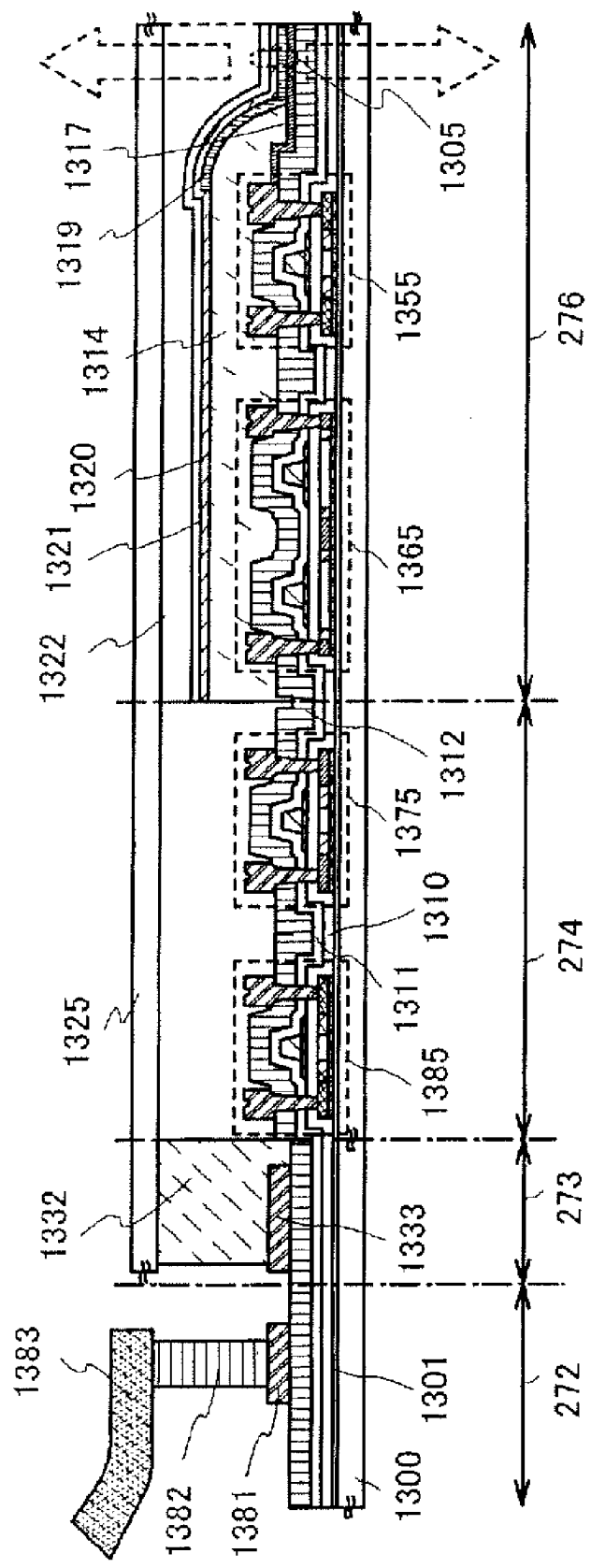
FIG. 10 shows a semiconductor device according to the present invention.

A semiconductor device shown in FIG. 10 includes an element substrate 1300, a thin film transistor 1355, a thin film transistor 1365, a thin film transistor 1375, a thin film transistor 1385, a first electrode layer 1317, a light-emitting layer 1319, a second electrode layer 1320, a light emitting element 1305, a protective film 1321, a filler 1322, a sealant 1332, an insulating film 1301, a gate insulating layer 1310, an insulating film 1311, an insulating film 1312, an insulating layer 1314, a sealing substrate 1325, a wiring layer 1333, a terminal electrode layer 1381, an anisotropic conductive layer 1382, and an FPC 1383. The semiconductor device includes an external terminal connection region 272, a sealing region 273, a driver circuit region 274, and a pixel region 276.

The semiconductor device shown in FIG. 10 is dual-emission type and has a structure in which light is emitted in directions indicated by arrows from both the element substrate 1300 side and the sealing substrate 1325 side. Therefore, a light-transmitting electrode layer is used for each of the first electrode layer 1317 and the second electrode layer 1320.

In this embodiment mode, the first electrode layer 1317 and the second electrode layer 1320, which are light-transmitting electrode layers, may each be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

Further, when a material such as a metal film having no light-transmitting property is formed thin (preferably a thickness of about 5 to 30 nm) so as to be able to transmit light, light can be emitted through the first electrode layer 1317 and the second electrode layer 1320. As a metal thin film which can be used for the first electrode layer 1317 and the second electrode layer 1320, a conductive film formed of titanium, tungsten, nickel, gold, platinum, silver, aluminum, magnesium, calcium, lithium, or an alloy thereof, or the like can be used.

In the above-described manner, the semiconductor device shown in FIG. 10 has a structure in which light emitted from a light-emitting element 1305 passes through the first electrode layer 1317 and the second electrode layer 1320 so that light is emitted from both sides.

A pixel of a semiconductor device that is formed using a light-emitting element can be driven by a simple matrix mode or an active matrix mode. Further, either digital driving or analog driving can be employed.

A color filter (colored layer) may be formed over a sealing substrate. The color filter (colored layer) can be formed by an evaporation method or a droplet discharge method. By using the color filter (colored layer), high-definition display can also be carried out. This is because a broad peak can be modified to be sharp in the light emission spectrum of each color of RGB by the color filter (colored layer).

Full color display can be performed by formation of a material to emit light of a single color and combination of the material with a color filter or a color conversion layer. The color filter (colored layer) or the color conversion layer may be provided for, for example, the sealing substrate, and the sealing substrate may be attached to the element substrate.

Needless to say, display of single color light emission may also be performed. For example, an area color type semiconductor device may be formed by using single color light emission. The area color type is suitable for a passive matrix display portion, and can mainly display characters and symbols.

By using a single-crystalline semiconductor layer, a pixel region and a driver circuit region can be formed to be integrated over the same substrate. In that case, a transistor in the pixel region and a transistor in the driver circuit region are formed simultaneously.

The transistors provided in a semiconductor device of this embodiment mode shown FIGS. 8A to 10 can be manufactured similarly to the transistors described in Embodiment Mode 2.

In FIGS. 8A to 10, a glass substrate is used as each of the element substrates 600, 1300, and 1600 which are bonded to LTSS layers that are single-crystalline semiconductor layers. Features are that a glass substrate is used as the element substrates 600, 1300, and 1600 to each of which the single-crystalline semiconductor layer is bonded and that before a bonding and separation step, the element substrates 600, 1300, and 1600 are heated at a temperature higher than the heat temperature at heat treatment in the bonding and separation step.

In the present invention, the heat treatment in the bonding and separation step means heat treatment used in a step in which an LTSS layer and a glass substrate are bonded and the LTSS layer is separated from a semiconductor substrate. Further, the bonding and separation step also involves heat treatment performed to strongly bond the glass substrate to the LTSS layer after separation of the LTSS layer from the semiconductor substrate and formation of the LTSS layer over the glass substrate.

Heat treatments may be separately performed for a step of separating the LTSS layer from the semiconductor substrate to the glass substrate and a step of strongly bonding the glass substrate and the LTSS layer, or one-time heat treatment may be performed for the steps at the same time.

In the present invention, the single-crystalline semiconductor layer is heated at a temperature close to a strain point of the glass substrate, specifically at a temperature in a range from minus 50° C. to plus 50° C. of the strain point of the glass substrate in the bonding and separation step in which the single-crystalline semiconductor layer is bonded to the glass substrate. Accordingly, the glass substrate is subjected to heat treatment in advance at a temperature higher than the temperature close to the strain point, specifically, at a temperature which is higher than the temperature in a range from minus 50° C. to plus 50° C. of the strain point. Specifically, the heat treatment at a temperature close to the strain point of the glass substrate may be conducted at a temperature equal to or greater than 580° C. and equal to or less than 680° C.

The glass substrate shrinks by heating. Therefore, by making the glass substrate shrink in advance by heating at a temperature higher than a temperature close to a strain point of the glass substrate, specifically at a temperature which is higher than a temperature in a range from minus 50° C. to plus 50° C. of the strain point, shrink of the glass substrate at the heat treatment in the later bonding and separation step can be suppressed. Thus, even when heat treatment is conducted to the glass substrate to which a single-crystalline semiconductor layer having a different coefficient of thermal expansion is bonded, shrink of the glass substrate can be suppressed; therefore, film separation between the glass substrate and the single-crystalline semiconductor layer can be prevented and deformation such as warping of the glass substrate and the single-crystalline semiconductor layer can be prevented. Since defects in the above-described step can be prevented, a semiconductor device can be manufactured with high yield.

In addition, after heating the glass substrate, the glass substrate is preferably cooled down slowly. Preferably, after the heat treatment at a temperature higher than the temperature close to the strain point, specifically at a temperature which is higher than the temperature in a range from minus 50° C. to plus 50° C. of the strain point, the glass substrate may be slowly cooled down to a temperature lower than the strain point, preferably at a rate of 2° C./min or lower, more preferably at a rate of 0.5° C./min or lower, and further preferably at 0.3° C./min or lower. The temperature reduction rate may vary as appropriate depending on the kind of the substrate; however, when the temperature reduction rate is low, the local stress in the glass substrate can be eased at the same time as substantial shrinkage of the glass substrate. As the glass substrate shrinks more substantially, the shrinkage of the glass substrate in later heat treatment becomes smaller. This heat treatment may be conducted under either a reduced pressure or an atmospheric pressure, and the atmosphere may be a nitrogen atmosphere, an oxygen atmosphere, or the like.

In this manner, according to the present invention, defects such as deformation and film separation of a single-crystalline semiconductor layer (LTSS layer) and a glass substrate can be prevented, and a semiconductor element and an integrated circuit with high reliability and high performance can be manufactured with high yield.

Accordingly, by using the present invention, a semiconductor device with high performance and high reliability can be manufactured with high productivity.

This embodiment mode can be appropriately combined with Embodiment Mode 1.

Embodiment Mode 4

Embodiment Mode 4 will describe an example of a semiconductor device (also referred to as a display device or a light-emitting device) having a display function as a semiconductor device having high performance and high reliability. Specifically, a light-emitting display device using a light-emitting element for a display element will be described.

This embodiment mode will describe structures of light-emitting elements that can be used for display elements in the display device of the present invention with reference to FIGS. 13A to 13D.

FIGS. 13A to 13D show structures of a light-emitting element in which an EL layer 860 is sandwiched between a first electrode layer 870 and a second electrode layer 850. The EL layer 860 includes a first layer 804, a second layer 803, and a third layer 802 as shown in the drawings. In FIGS. 13A to 13D, the second layer 803 is a light-emitting layer, and the first layer 804 and the third layer 802 are functional layers.

The first layer 804 is a layer having a function of transporting holes to the second layer 803. In FIGS. 13A to 13D, a hole-injecting layer included in the first layer 804 includes a substance having a high hole-injecting property, and molybdenum oxide, vanadium oxide, ruthenium oxide, tungsten oxide, manganese oxide, or the like can be used. Further, the first layer 804 can also be formed using the following: a phthalocyanine-based compound such as phthalocyanine (abbrev.: $H_2Pc$) or copper phthalocyanine (abbrev.: CuPc); an aromatic amine compound such as 4,4'-bis[N-(4-diphenylaminophenyl)-N-phenylamino]biphenyl (abbrev.: DPAB) or 4,4'-bis(N-{4-[N-(3-methylphenyl)-N-phenylamino]phenyl}-N-phenylamino)biphenyl (abbrev.: DNTPD); a high molecular compound such as poly(ethylene dioxythiophene)/poly(styrenesulfonic acid) (abbrev.: PEDOT/PSS); and the like.

Further, a composite material including an organic compound and an inorganic compound can be used for the hole-injecting layer. In particular, a composite material including an organic compound and an inorganic compound showing an electron-accepting property with respect to the organic compound is excellent in a hole-injecting property and a hole-transporting property since electrons are transferred between the organic compound and the inorganic compound and carrier density is increased.

Further, in the case where a composite material including an organic compound and an inorganic compound is used for the hole-injecting layer, the hole-injecting layer can form an ohmic contact with the electrode layer; therefore, a material of the electrode layer can be selected regardless of the work function.

As the inorganic compound used for the composite material, an oxide of a transition metal is preferably used. In addition, an oxide of a metal belonging to Groups 4 to 8 of the periodic table can be used. Specifically, the following are preferable because an electron-accepting property is high: vanadium oxide, niobium oxide, tantalum oxide, chromium oxide, molybdenum oxide, tungsten oxide, manganese oxide, and rhenium oxide. Among them, molybdenum oxide is particularly preferable because it is stable in the atmosphere, low in hygroscopicity, and is easy to be handled.

As the organic compound used for the composite material, various compounds can be used, such as an aromatic amine compound, a carbazole derivative, aromatic hydrocarbon, or a high molecular compound (e.g., an oligomer, a dendrimer, or a polymer). Note that, as the organic compound used for the composite material, it is preferable to use an organic compound having a high hole-transporting property. Specifically, it is preferable to use a substance having a hole mobility of greater than or equal to $10^{-6}$ cm$^2$/Vs. Further, other materials may also be used as long as a hole-transporting property thereof is higher than an electron-transporting property.

Examples of the organic compound which can be used for the composite material are specifically listed below.

For example, as the aromatic amine compound, the following can be given: N,N'-di(p-tolyl)-N,N'-diphenyl-p-phenylenediamine (abbrev.: DTDPPA); 4,4'-bis[N-(4-diphenylaminophenyl)-N-phenylamino]biphenyl (abbrev.: DPAB); 4,4'-bis(N-{4-[N-(3-methylphenyl)-N-phenylamino]phenyl}-N-phenylamino)biphenyl (abbrev.: DNTPD); 1,3,5-tris[N-(4-diphenylaminophenyl)-N-phenylamino]benzene (abbrev.: DPA3B); and the like.

As specific examples of the carbazole derivative which can be used for the composite material, the following can be given: 3-[N-(9-phenylcarbazol-3-yl)-N-phenylamino]-9-phenylcarbazole (abbrev.: PCzPCA1); 3,6-bis[N-(9-phenylcarbazol-3-yl)-N-phenylamino]-9-phenylcarbazole (abbrev.: PCzPCA2); 3-[N-(1-naphthyl)-N-(9-phenylcarbazol-3-yl)amino]-9-phenylcarbazole (abbrev.: PCzPCN1); and the like.

Further, the following can also be used: 4,4'-di(N-carbazolyl)biphenyl (abbrev.: CBP); 1,3,5-tris[4-(N-carbazolyl)phenyl]benzene (abbrev.: TCPB); 9-[4-(N-carbazolyl)]phenyl-10-phenylanthracene (abbrev.: CzPA); 1,4-bis[4-(N-carbazolyl)phenyl]-2,3,5,6-tetraphenylbenzene; and the like.

Further, as the aromatic hydrocarbon which can be used for the composite material, the following can be given: 2-tert-butyl-9,10-di(2-naphthyl)anthracene (abbrev.: t-BuDNA), 2-tert-butyl-9,10-di(1-naphthyl)anthracene; 9,10-bis(3,5-diphenylphenyl)anthracene (abbrev.: DPPA); 2-tert-butyl-9,10-bis(4-phenylphenyl)anthracene (abbrev.: t-BuDBA); 9,10-di(2-naphthyl)anthracene (abbrev.: DNA); 9,10-diphenylanthracene (abbrev.: DPAnth); 2-tert-butylanthracene (abbrev.: t-BuAnth); 9,10-bis(4-methyl-1-naphthyl)anthracene (abbrev.: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides the above, pentacene, coronene, or the like can also be used. As described above, an aromatic hydrocarbon which has a hole mobility of greater than or equal to $1 \times 10^{-6}$ cm$^2$/Vs and of which the carbon number is 14 to 42 is more preferable.

Note that the aromatic hydrocarbon which can be used for the composite material may have a vinyl skeleton. As examples of the aromatic hydrocarbon having a vinyl group, 4,4'-bis(2,2-diphenylvinyl)biphenyl (abbrev.: DPVBi), 9,10-bis[4-(2,2-diphenylvinyl)phenyl]anthracene (abbrev.: DPVPA), and the like can be given.

Further, a high molecular compound such as poly(N-vinylcarbazole) (abbrev.: PVK) or poly(4-vinyltriphenylamine) (abbrev.: PVTPA) can also be used.

As a substance for forming a hole-transporting layer included in the first layer 804 in FIGS. 13A to 13D, a substance having a high hole-transporting property, specifically, an aromatic amine compound (that is, a compound having a benzene ring-nitrogen bond) is preferable. As examples of the material which are widely used, the following can be given: 4,4'-bis[N-(3-methylphenyl)-N-phenylamino]biphenyl; a derivative thereof such as 4,4'-bis[N-(1-napthyl)-N-phenylamino]biphenyl (hereinafter referred to as NPB); and a starburst aromatic amine compound such as 4,4',4''-tris(N,N-diphenyl-amino)triphenylamine and 4,4',4''-tris[N-(3-methylphenyl)-N-phenylamino]triphenylamine. These substances described here are mainly substances each having a hole mobility of greater than or equal to $10^{-6}$ cm$^2$/Vs. Further, other materials may also be used as long as a hole-transporting property thereof is higher than an electron-transporting property. The hole-transporting layer is not limited to a single layer and may be a mixed layer of any of the aforementioned substances or a stacked layer which includes two or more layers each containing the aforementioned substance.

The third layer 802 has a function of transporting and injecting electrons to the second layer 803. With reference to FIGS. 13A to 13D, an electron-transporting layer included in the third layer 802 is described. As the electron-transporting layer, a substance having a high electron-transporting property can be used. For example, a layer containing a metal complex or the like including a quinoline or benzoquinoline skeleton, such as tris(8-quinolinolato)aluminum (abbrev.: Alq), tris(4-methyl-8-quinolinolato)aluminum (abbrev.: Almq$_3$), bis(10-hydroxybenzo[h]quinolinato)beryllium (abbrev.: BeBq$_2$), or bis(2-methyl-8-quinolinolato)(4-phenylphenolato)aluminum (abbrev.: BAlq) can be used. Further, a metal complex or the like including an oxazole-based or thiazole-based ligand, such as bis[2-(2-hydroxyphenyl)benzoxazolato]zinc (abbrev.: Zn(BOX)$_2$) or bis[2-(2-hydroxyphenyl)benzothiazolato]zinc (abbrev.: Zn(BTZ)$_2$) can be used. Besides the above metal complexes, the following can be used: 2-(4-biphenylyl)-5-(4-tert-butylphenyl)-1,3,4-oxadiazole (abbrev.: PBD); 1,3-bis[5-(p-tert-butylphenyl)-1,3,4-oxadiazol-2-yl]benzene (abbrev.: OXD-7); 3-(4-biphenylyl)-4-phenyl-5-(4-tert-butylphenyl)-1,2,4-thiazole (abbrev.: TAZ), bathophenanthroline (abbrev.: BPhen); bathocuproine (abbrev.: BCP); and the like. These substances described here are mainly substances each having an electron mobility of greater than or equal to $10^{-6}$ cm$^2$/Vs. Further, other substances may also be used for the electron-transporting layer as long as an electron transporting property thereof is higher than a hole transporting property. The electron-transporting layer is not limited to a single layer and may be a stacked layer which includes two or more layers each containing the aforementioned substance.

With reference to FIGS. 13A to 13D, an electron-injecting layer included in the third layer 802 is described. As the electron-injecting layer, a substance having a high electron-injecting property can be used. As the electron-injecting layer, an alkali metal, an alkaline earth metal, or a compound thereof such as lithium fluoride (LiF), cesium fluoride (CsF), or calcium fluoride (CaF$_2$) can be used. For example, a layer which is made of a substance having an electron-injecting property and contains an alkali metal, an alkaline earth metal, or a compound thereof, for example, a layer of Alq containing magnesium (Mg) or the like can be used. It is preferable to use the layer which is made of a substance having an electron-transporting property and contains an alkali metal or an alkaline earth metal as the electron-injecting layer because electron injection from the electrode layer is efficiently performed by using the layer.

Next, the second layer 803 which is a light-emitting layer is described. The light-emitting layer has a function of emitting light and includes an organic compound having a light-emitting property. Further, the light-emitting layer may include an inorganic compound. The light-emitting layer may be formed using various light-emitting organic compounds and inorganic compounds. The thickness of the light-emitting layer is preferably about 10 to 100 nm.

There are no particular limitations on the organic compound used for the light-emitting layer as long as it is a light-emitting organic compound. As the organic compound, for example, the following can be given: 9,10-di(2-naphthyl)anthracene (abbrev.: DNA), 9,10-di(2-naphthyl)-2-tert-butylanthracene (abbrev.: t-BuDNA), 4,4'-bis(2,2-diphenylvinyl)

biphenyl (abbrev.: DPVBi), coumarin 30, coumarin 6, coumarin 545, coumarin 545T, perylene, rubrene, periflanthene, 2,5,8,11-tetra(tert-butyl)perylene (abbrev.: TBP), 9,10-diphenylanthracene (abbrev.: DPA), 5,12-diphenyltetracene, 4-(dicyanomethylene)-2-methyl-[p-(dimethylamino)styryl]-4H-pyran (abbrev.: DCM1), 4-(dicyanomethylene)-2-methyl-6-[2-(julolidin-9-yl)ethenyl]-4H-pyran (abbrev.: DCM2), 4-(dicyanomethylene)-2,6-bis[p-(dimethylamino)styryl]-4H-pyran (abbrev.: BisDCM), and the like. Further, a compound capable of emitting phosphorescence such as bis [2-(4',6'-difluorophenyl)pyridinato-N,$C^{2'}$]iridium(picolinate) (abbrev.: FIrpic), bis {2-[3',5'-bis(trifluoromethyl)phenyl]pyridinato-N,$C^{2'}$}iridium(picolinate) (abbrev.: Ir($CF_3$ppy)$_2$(pic)), tris(2-phenylpyridinato-N,$C^{2'}$)iridium (abbrev.: Ir(ppy)$_3$), bis(2-phenylpyridinato-N,$C^{2'}$)iridium (acetylacetonate) (abbrev.: Ir(ppy)$_2$(acac)), bis[2-(2'-thienyl)pyridinato-N,$C^{3'}$]iridium(acetylacetonate) (abbrev.: Ir(thp)$_2$(acac)), bis(2-phenylquinolinato-N,$C^{2'}$)iridium (acetylacetonate) (abbrev.: Ir(pq)$_2$(acac)), or bis[2-(2'-benzothienyl)pyridinato-N,$C^{3'}$]iridium(acetylacetonate) (abbrev.: Ir(btp)$_2$(acac)) may be used.

Further, a triplet excitation light-emitting material containing a metal complex or the like may be used for the light-emitting layer in addition to a singlet excitation light-emitting material. For example, among pixels emitting light of red, green, and blue, the pixel emitting light of red whose luminance is reduced by half in a relatively short time is formed using a triplet excitation light-emitting material and the other pixels are formed using a singlet excitation light-emitting material. A triplet excitation light-emitting material has a feature of favorable light-emitting efficiency, so that less power is consumed to obtain the same luminance. In other words, when a triplet excitation light-emitting material is used for the pixel emitting light of red, a smaller amount of current is necessary to be applied to a light-emitting element; thus, reliability can be improved. The pixel emitting light of red and the pixel emitting light of green may be formed using a triplet excitation light-emitting material and the pixel emitting light of blue may be formed using a singlet excitation light-emitting material in order to achieve low power consumption. Low power consumption can be further achieved by formation of a light-emitting element that emits light of green, which has high visibility for human eyes, with the use of a triplet excitation light-emitting material.

Another organic compound may be further added to the light-emitting layer including any of the above-described organic compounds which emit light. Examples of the organic compound that can be added are TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, and 4,4'-bis(N-carbazolyl)biphenyl (abbrev.: CBP), and 1,3,5-tris[4-(N-carbazolyl)phenyl]benzene (abbrev.: TCPB). However, the present invention is not limited thereto. It is preferable that the organic compound which is added in addition to the organic compound which emits light have a larger excitation energy and be added in a larger amount than the organic compound which emits light, in order to make the organic compound emit light efficiently (which makes it possible to prevent concentration quenching of the organic compound). Further, as another function, the added organic compound may emit light along with the organic compound which emits light (which makes it possible to emit white light or the like).

The light-emitting layer may have a structure in which color display is performed by formation of a light-emitting layer having a different emission wavelength range for each pixel. Typically, light-emitting layers corresponding to respective colors of R (red), G (green), and B (blue) are formed. Also in this case, color purity can be improved and a pixel region can be prevented from having a mirror surface (reflection) by provision of a filter which transmits light of the emission wavelength range on the light-emission side of the pixel. By provision of the filter, a circularly polarizing plate or the like that has been conventionally considered to be necessary can be omitted, and further, the loss of light emitted from the light-emitting layer can be eliminated. Further, change in color tone, which occurs when a pixel region (display screen) is obliquely seen, can be reduced.

Either a low-molecular organic light-emitting material or a high-molecular organic light-emitting material may be used for a material of the light-emitting layer A high-molecular organic light-emitting material has higher physical strength than a low-molecular material and an element using the high-molecular organic light-emitting material has higher durability than an element using a low-molecular material. In addition, since a high-molecular organic light-emitting material can be formed by coating, the element can be relatively easily formed.

The color of light emission is determined depending on a material forming the light-emitting layer; therefore, a light-emitting element which emits light of a desired color can be formed by selecting an appropriate material for the light-emitting layer. As a high-molecular electroluminescent material which can be used for forming the light-emitting layer, a polyparaphenylene-vinylene-based material, a polyparaphenylene-based material, a polythiophene-based material, a polyfluorene-based material, and the like can be given.

As the polyparaphenylene-vinylene-based material, a derivative of poly(paraphenylenevinylene) [PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly (3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2,2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The inorganic compound used for the light-emitting layer may be any inorganic compound as long as light emission of the organic compound is not easily quenched by the inorganic compound, and various kinds of metal oxide and metal nitride may be used. In particular, an oxide of a metal that belongs to Group 13 or 14 of the periodic table is preferable because light emission of the organic compound is not easily quenched, and specifically, aluminum oxide, gallium oxide, silicon oxide, and germanium oxide are preferable. However, the inorganic compound is not limited thereto.

Note that the light-emitting layer may be formed by stacking a plurality of layers each containing a combination of the organic compound and the inorganic compound, which are described above, or may further contain another organic compound or inorganic compound. A layer structure of the light-emitting layer can be changed, and an electrode layer for injecting electrons may be provided or light-emitting materials may be dispersed, instead of provision of a specific electron-injecting region or light-emitting region. Such a change can be permitted unless it departs from the spirit of the present invention.

A light-emitting element formed using the above materials emits light by being forwardly biased. A pixel of a semiconductor device which is formed using a light-emitting element can be driven by a simple matrix mode or an active matrix mode. In either case, each pixel emits light by application of forward bias thereto at a specific timing; however, the pixel is in a non-light-emitting state for a certain period. Reliability of a light-emitting element can be unproved by application of reverse bias in the non-light-emitting time. In a light-emitting element, there is a deterioration mode in which light emission intensity is decreased under a constant driving condition or a deterioration mode in which a non-light-emitting region is increased in the pixel and luminance is apparently decreased. However, progression of deterioration can be slowed down by performing alternating driving in which bias is applied forwardly and reversely; thus, reliability of a semiconductor device including a light-emitting element can be improved. In addition, either digital driving or analog diving can be applied.

A color filter (colored layer) may be provided for a sealing substrate. The color filter (colored layer) can be formed by an evaporation method or a droplet discharge method. High-definition display can be performed with the use of the color filter (colored layer). This is because a broad peak can be modified to be sharp in a light emission spectrum of each of RGB by the color filter (colored layer).

Full color display can be performed by formation of a material emitting light of a single color and combination of the material with a color filter or a color conversion layer. The color filter (colored layer) or the color conversion layer may be provided for, for example, the sealing substrate, and the sealing substrate may be attached to the element substrate.

Needless to say, display of single color light emission may also be performed. For example, an area color type semiconductor device may be formed by using single color light emission. The area color type is suitable for a passive matrix display portion, and can mainly display characters and symbols.

Figure 13A:
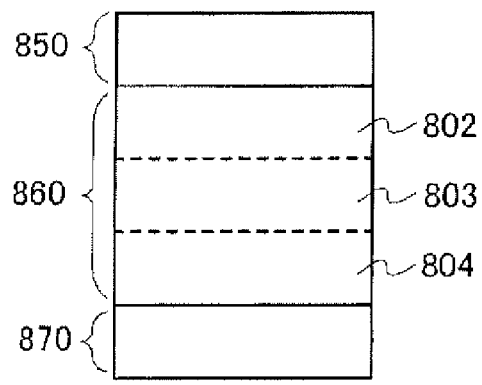
FIGS. 13A to 13D show structures of a light-emitting element which can be applied to the present invention.
Figure 13B:
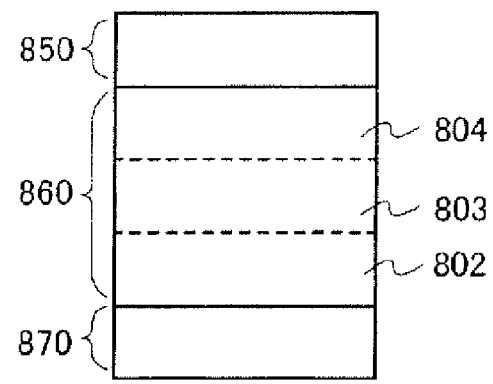

It is necessary to select materials for the first electrode layer 870 and the second electrode layer 850 considering the work function. The first electrode layer 870 and the second electrode layer 850 can be either an anode (an electrode layer with high potential) or a cathode (an electrode layer with low potential) depending on the pixel structure. In the case where the polarity of a driving thin film transistor is a p-channel type, the first electrode layer 870 may serve as an anode and the second electrode layer 850 may serve as a cathode as shown in FIG. 13A. In the case where the polarity of the driving thin film transistor is an n-channel type, the first electrode layer 870 may serve as a cathode and the second electrode layer 850 may serve as an anode as shown in FIG. 13B. Materials that can be used for the first electrode layer 870 and the second electrode layer 850 are described below. It is preferable to use a material having a high work function (specifically, a material having a work function of greater than equal to 4.5 eV) for one of the first electrode layer 870 and the second electrode layer 850, which serves as an anode, and a material having a low work function (specifically, a material having a work function of less than or equal to 3.5 eV) for the other electrode layer which serves as a cathode. However, since the first layer 804 is excellent in a hole-injecting property and a hole-transporting property and the third layer 802 is excellent in an electron-injecting property and an electron-transporting property, both the first electrode layer 870 and the second electrode layer 850 are scarcely restricted by a work function and various materials can be used.

The light-emitting elements in FIGS. 13A and 13B each have a structure in which light is extracted from the first electrode layer 870 and thus, the second electrode layer 850 need not necessarily have a light-transmitting property. The second electrode layer 850 may be formed of a film mainly containing an element selected from Ti, Ni, W, Cr, Pt Zn, Sn, In, Ta, Al, Cu, Au, Ag, Mg, Ca, Li or Mo, or an alloy material or a compound material containing any of the above elements as its main component, such as titanium nitride, $TiSi_xN_y$, $WSi_x$, tungsten nitride, $WSi_xN_y$, or NbN; or a stacked film thereof with a total thickness of 100 to 800 nm.

In addition, when the second electrode layer 850 is formed using a light-transmitting conductive material similarly to the material used for the first electrode layer 870, light can be extracted from the second electrode layer 850 as well, and a dual emission structure can be obtained, in which light from the light-emitting element is emitted through both the first electrode layer 870 and the second electrode layer 850.

Note that the light-emitting element of the present invention can have variations by changing types of the first electrode layer 870 and the second electrode layer 850.

FIG. 13B shows the case where the EL layer 860 is formed by stacking the third layer 802, the second layer 803, and the first layer 804 in this order from the first electrode layer 870 side.

Figure 13C:
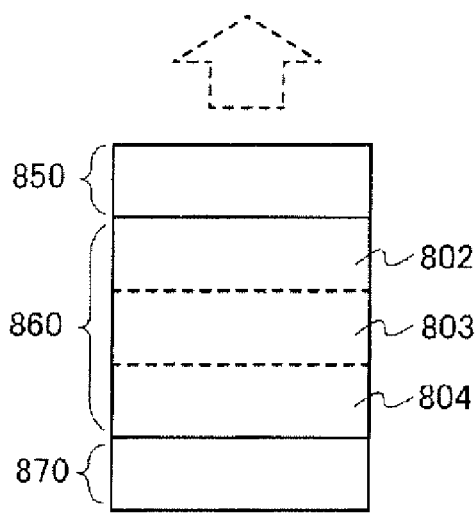
Figure 13D:
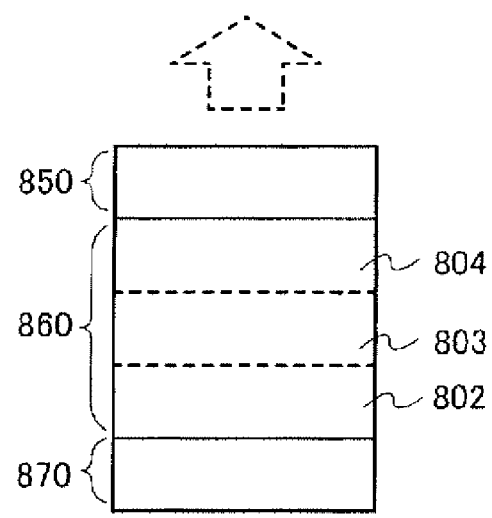

FIG. 13C shows a structure in which an electrode layer having reflectivity is used for the first electrode layer 870 and an electrode layer having a light-transmitting property is used for the second electrode layer 850 in FIG. 13A. Light emitted from the light-emitting element is reflected at the first electrode layer 870, transmitted through the second electrode layer 850, and emitted to the outside. Similarly, FIG. 13D shows a structure in which an electrode layer having reflectivity is used for the first electrode layer 870 and an electrode layer having a light-transmitting property is used for the second electrode layer 850 in FIG. 13B. Light emitted from the light-emitting element is reflected at the first electrode layer 870, transmitted through the second electrode layer 850, and emitted to the outside.

Further, various methods can be used as a method for forming the EL layer 860 when an organic compound and an inorganic compound are mixed in the EL layer 860. For example, there is a co-evaporation method for vaporizing both an organic compound and an inorganic compound by resistance heating. Further, for co-evaporation, an inorganic compound may be vaporized by an electron beam (EB) while an organic compound is vaporized by resistance heating. Furthermore, a method for sputtering an inorganic compound while vaporizing an organic compound by resistance heating to deposit the both at the same time may also be used. Instead, the EL layer 860 may be formed by a wet method.

As a method for manufacturing the first electrode layer 870 and the second electrode layer 850, an evaporation method by resistance heating, an EB evaporation method, a sputtering method, a CVD method, a spin coating method, a printing method, a dispenser method, a droplet discharge method, or the like can be used.

This embodiment mode can be combined with any of Embodiment Modes 1 to 3 as appropriate.

In this manner, with the use of the present invention, a semiconductor device including a light-emitting element with high performance and high reliability can be manufactured with high productivity.

Embodiment Mode 5

Embodiment Mode 5 will describe other examples of a semiconductor device having a display function as a semiconductor device with high performance and high reliability. In this embodiment mode, other structures that can be applied to the light-emitting element in the semiconductor device of the present invention will be described with reference to FIGS. 11A to 11C and 12A to 12C.

Light-emitting elements using electroluminescence can be roughly classified into light-emitting elements that use an organic compound as a light-emitting material and light-emitting elements that use an inorganic compound as a light-emitting material. In general, the former are referred to as organic EL elements, while the latter are referred to as inorganic EL elements.

Inorganic EL elements are classified into a dispersion-type inorganic EL element and a thin-film-type inorganic EL element according to their element structures. The difference between the two EL elements lies in that the former dispersion-type inorganic EL element includes an electroluminescent layer in which particles of a light-emitting material are dispersed in a binder, while the latter thin-film-type inorganic EL element includes an electroluminescent layer made of a thin film of a light-emitting material. Although the two light-emitting elements are different in the above points, they have a common characteristic in that both require electrons that are accelerated by a high electric field. As a light-emission mechanisms, there are donor-acceptor recombination type light emission that utilizes a donor level and an acceptor level, and localized type light emission that utilizes inner-shell electron transition of a metal ion. In general, donor-acceptor recombination light emission is employed in dispersion type inorganic EL elements and localized type light emission is employed in thin-film type inorganic EL elements in many cases.

A light-emitting material that can be used in the present invention contains a base material and an impurity element which serves as a luminescence center. By changing the impurity element to be contained in the light-emitting material, light emission of various colors can be obtained. As a method of forming a light-emitting material, various methods such as a solid-phase method and a liquid-phase method (a coprecipitation method) can be used. Further, an evaporative decomposition method, a double decomposition method, a method utilizing thermal decomposition reaction of a precursor, a reversed micelle method, a method which combines the foregoing method with high-temperature baking, a liquid-phase method such as a freeze-drying method, or the like can also be used.

A solid phase method is a method in which a base material, and an impurity element or a compound containing an impurity element are weighed, mixed in a mortar, heated in an electric furnace, and baked to be reacted, whereby the impurity element is contained in the base material. The baking temperature is preferably 700 to 1500° C. This is because the solid-phase reaction will not proceed when the temperature is too low, whereas the base material will be decomposed when the temperature is too high. The baking may be performed in a powder state; however, it is preferably performed in a pellet state. Although the solid-phase method requires baking at a relatively high temperature, the solid-phase method is easy to perform and has high productivity. Thus, it is suitable for mass production.

A liquid-phase method (a coprecipitation method) is a method in which a base material or a compound containing a base material, and an impurity element or a compound containing an impurity element are reacted in a solution, dried, and then baked. Particles of a light-emitting material are uniformly distributed, and the reaction can progress even when the grain size is small and the baking temperature is low.

As a base material of a light-emitting material, sulfide, oxide, or nitride can be used. Examples of sulfide include zinc sulfide (ZnS), cadmium sulfide (CdS), calcium sulfide (CaS), yttrium sulfide ($Y_2S_3$), gallium sulfide ($Ga_2S_3$), strontium sulfide (SrS), and barium sulfide (BaS). Examples of oxide include zinc oxide (ZnO) and yttrium oxide ($Y_2O_3$). Examples of nitride include aluminum nitride (AlN), gallium nitride (GaN), and indium nitride (InN). Further, it is also possible to use zinc selenide (ZnSe), zinc telluride (ZnTe), or ternary mixed crystals such as calcium gallium sulfide ($CaGa_2S_4$), strontium gallium sulfide ($SrGa_2S_4$), or barium gallium sulfide ($BaGa_2S_4$).

For a luminescence center of an EL element which exhibits localized type light emission, the following can be used: manganese (Mn), copper (Cu), samarium (Sm), terbium (Th), erbium (Er), thulium (Tm), europium (Eu), cerium (Ce), praseodymium (Pr), and the like. Note that a halogen element such as fluorine (F) or chlorine (Cl) may also be added. The halogen element can function to compensate electric charge.

Meanwhile, for a luminescence center of an EL element which exhibits donor-acceptor recombination light emission, a light-emitting material containing a first impurity element which forms a donor level and a second impurity element which forms an acceptor level can be used. Examples of the first impurity element include fluorine (F), chlorine (Cl), and aluminum (Al). Meanwhile, examples of the second impurity element include copper (Cu) and silver (Ag).

In the case of synthesizing a light-emitting material of an EL element which exhibits donor-acceptor recombination light emission by using a solid-phase method, the following steps are performed: weighing a base material, weighing a first impurity element or a compound containing the first impurity element, weighing a second impurity element or a compound containing the second impurity element, mixing them in a mortar, and heating and baking them in an electric furnace. As a base material, the above-described base materials can be used. As a first impurity element or a compound containing the first impurity element, fluorine (F), chlorine (Cl), aluminum sulfide ($Al_2S_3$), or the like can be used, for example. As a second impurity element or a compound containing the second impurity element, copper (Cu), silver (Ag), copper sulfide ($Cu_2S$), silver sulfide ($Ag_2S$), or the like can be used, for example. The baking temperature is preferably 700 to 1500° C. This is because the solid-phase reaction will not proceed when the temperature is too low, whereas the base material will be decomposed when the temperature is too high. The baking may be performed in a powder state; however, it is preferably performed in a pellet state.

In the case of performing solid-phase reaction, it is also possible to use a compound containing the first impurity element and the second impurity element as the impurity element. In that case, the impurity elements can be easily diffused, and solid-phase reaction can easily proceed, therefore, a uniform light-emitting material can be obtained. Further, since unnecessary impurity elements are not mixed, a light-emitting material with high purity can be obtained. As the compound containing the first impurity element and the second impurity element, copper chloride (CuCl), silver chloride (AgCl), or the like can be used.

Note that the concentration of the impurity element with respect to the base material may be 0.01 to 10 at. %, preferably, 0.05 to 5 at. %.

With regard to a thin-film-type inorganic EL element, an electroluminescent layer contains the above-described light-emitting material and can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low pressure hydride transport CVD method, an atomic layer epitaxy (ALE) method, or the like.

Figure 11A:
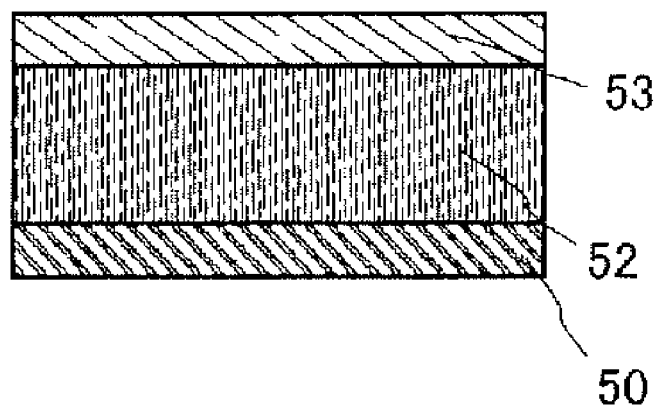
FIGS. 11A to 11C show structures of a light-emitting element which can be applied to the present invention.
Figure 11B:
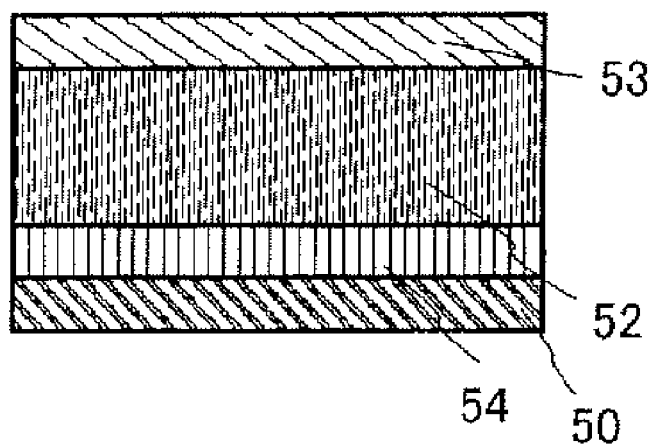
Figure 11C:
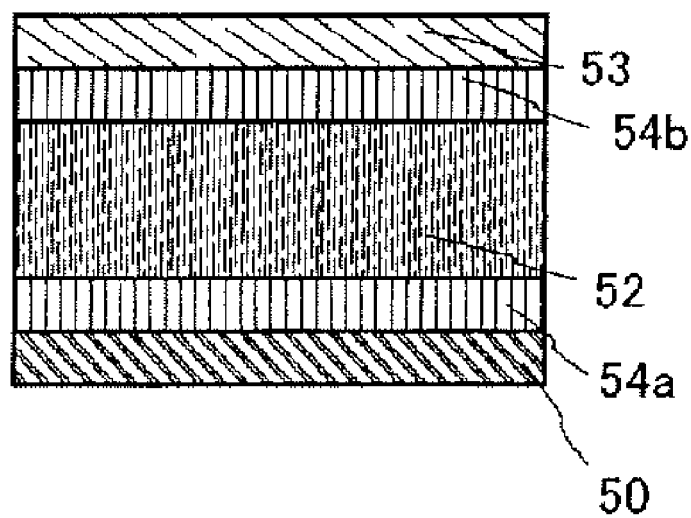

FIGS. 11A to 11C show examples of a thin-film-type inorganic EL element that can be used as a light-emitting element. Each of the light-emitting elements shown in FIGS. 11A to 11C includes a first electrode layer 50, an electroluminescent layer 52, and a second electrode layer 53.

The light-emitting elements shown in FIGS. 11B and 11C each have a structure in which an insulating layer is provided between the electrode layer and the electroluminescent layer of the light-emitting element shown in FIG. 11A. The light-emitting element shown in FIG. 11B has an insulating layer 54 between the first electrode layer 50 and the electroluminescent layer 52. The light-emitting element shown in FIG. 11C has an insulating layer 54a between the first electrode layer 50 and the electroluminescent layer 52, and an insulating layer 54b between the second electrode layer 53 and the electroluminescent layer 52. As described above, the insulating layer may be provided between the electroluminescent layer and one or both of the pair of electrode layers. In addition, the insulating layer may have either a single layer or a plurality of stacked layers.

Although the insulating layer 54 is provided to be in contact with the first electrode layer 50 in FIG. 11B, the insulating layer 54 may also be provided to be in contact with the second electrode layer 53 by reversing the order of the insulating layer and the electroluminescent layer.

In the case of forming a dispersion-type inorganic EL element, a film-form electroluminescent layer is formed by dispersing particles of a light-emitting material in a binder. The light-emitting material is processed into particulate forms. When particles with a desired size cannot be obtained due to a method of forming a light-emitting material, the material may be processed into particulate forms by being ground in a mortar or the like. A binder is a substance for fixing particles of a light-emitting material in a dispersed state in order to keep the shape of the electroluminescent layer. Light-emitting materials are uniformly dispersed and fixed in the electroluminescent layer by the binder.

The electroluminescent layer of the dispersion-type inorganic EL element can be formed by a droplet discharge method by which an electroluminescent layer can be selectively formed, a printing method (e.g., screen printing or offset printing), a coating method such as a spin coating method, a dipping method, a dispenser method, or the like. The thickness of the electroluminescent layer is not limited to a specific value; however, it is preferably in the range of 10 to 1000 nm. In the electroluminescent layer which contains a light-emitting material and a binder, the percentage of the light-emitting material is preferably 50 to 80 wt %, inclusive.

Figure 12A:
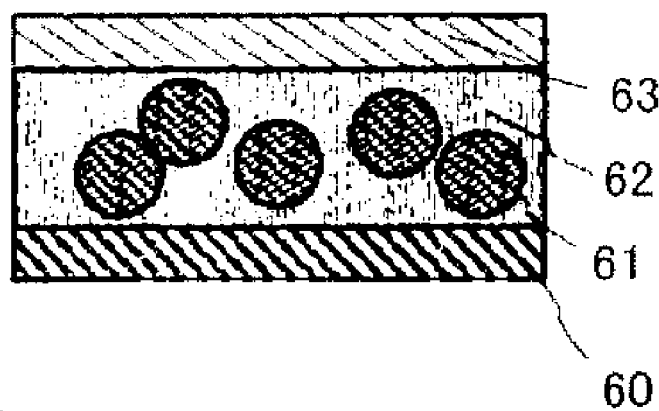
FIGS. 12A to 12C show structures of a light-emitting element which can be applied to the present invention.
Figure 12B:
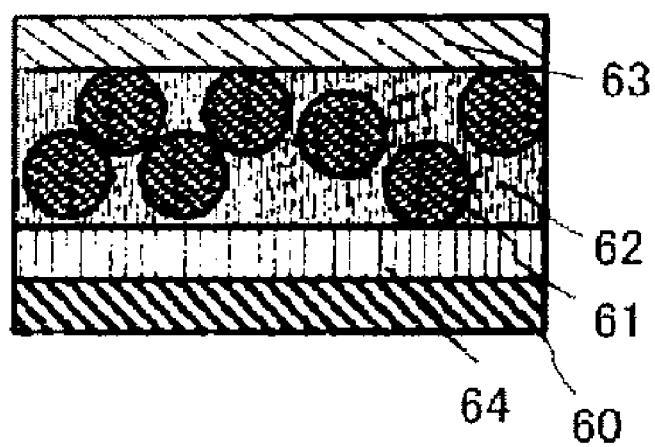
Figure 12C:
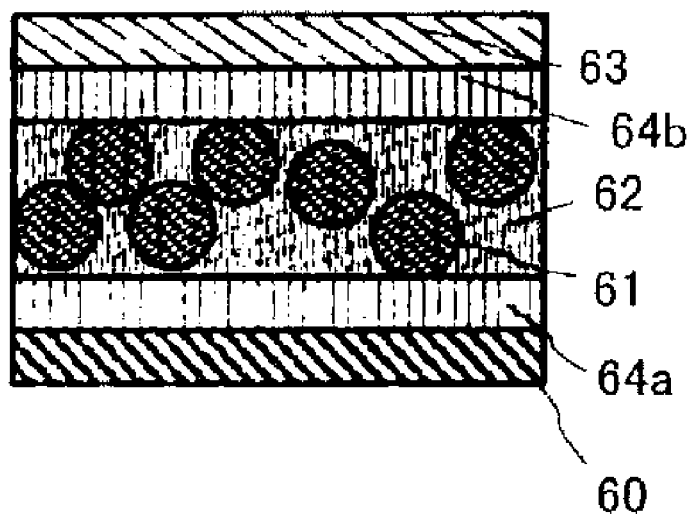

FIGS. 12A to 12C show examples of a dispersion-type inorganic EL element that can be used as a light-emitting element. The light-emitting element shown in FIG. 12A has a structure in which a first electrode layer 60, an electroluminescent layer 62, and a second electrode layer 63 are stacked, and the electroluminescent layer 62 contains a light-emitting material 61 fixed by a binder.

As a binder that can be used in this embodiment mode, an organic material, an inorganic material, or a mixed material of an organic material and an inorganic material can be used. As an organic material, the following resins can be used: a polymer having a relatively high dielectric constant such as a cyanoethyl cellulose based resin, a polyethylene resin, a polypropylene resin, a polystyrene based resin, a silicone resin, an epoxy resin, and vinylidene fluoride. Further, it is also possible to use thermally stable high molecular materials such as aromatic polyamide and polybenzimidazole, or a siloxane resin. Note that a siloxane resin has the bond of Si—O—Si. Siloxane has a skeleton structure with the bond of silicon (Si) and oxygen (O). As a substituent, an organic group containing at least hydrogen (e.g., an alkyl group or an aryl group) is used. Further, a fluoro group may be used as the substituent, or both a fluoro group and an organic group containing at least hydrogen may be used as the substituent. Further, it is also possible to use a resin material such as a vinyl resin (e.g. polyvinyl alcohol or polyvinyl butyral), a phenol resin, a novolac resin, an acrylic resin, a melamine resin, a urethane resin, or an oxazole resin (e.g., polybenzoxazole). When high-dielectric-constant microparticles of, for example, barium titanate ($BaTiO_3$) or strontium titanate ($SrTiO_3$) are mixed as appropriate into the above-described resin, the dielectric constant of the material can be controlled.

As an inorganic material contained in the binder, the following materials can be used: silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, and other substances containing an inorganic material. When a high-dielectric-constant inorganic material is mixed into an organic material (by addition or the like), it becomes possible to control the dielectric constant of the electroluminescent layer which contains a light-emitting material and a binder more efficiently, whereby the dielectric constant can be further increased.

In the manufacturing process, light-emitting materials are dispersed in a solution containing a binder. As a solvent of the solution containing a binder that can be used in this embodiment mode, it is preferable to appropriately select a solvent in which a binder material can be dissolved and with which a solution having a viscosity suitable for a method for forming the electroluminescent layer (various wet processes) and a desired film thickness can be formed. An organic solvent or the like can be used. For example, when a siloxane resin is used as a binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting elements shown in FIGS. 12B and 12C each have a structure in which an insulating layer is provided between the electrode layer and the electroluminescent layer of the light-emitting element shown in FIG. 12A. The light-emitting element shown in FIG. 12B has an insulating layer 64 between the first electrode layer 60 and the electroluminescent layer 62. The light-emitting element shown in FIG. 12C has an insulating layer 64a between the first electrode layer 60 and the electroluminescent layer 62, and an insulating layer 64b between the second electrode layer 63 and the electroluminescent layer 62. As described above, the insulating layer may be provided between the electroluminescent layer and one or both of the pair of electrode layers. In addition, the insulating layer may have either a single layer or a plurality of stacked layers.

In addition, although the insulating layer 64 is provided to be in contact with the first electrode layer 60 in FIG. 12B, the insulating layer 64 may also be provided to be in contact with the second electrode layer 63 by reversing the order of the insulating layer and the electroluminescent layer.

Although the insulating layers 54 and 64 shown in FIGS. 11B, 11C, 12B and 12C are not particularly limited to certain types, a preferable insulating layer has a high withstand voltage and dense film quality, and more preferably has a high dielectric constant. For example, the following materials can be used: silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), and the like. Further, a mixed film of such materials or a stacked film of two or more layers using such materials can also be used. The insulating films can be formed by sputtering, evaporation, CVD, or the like. Further, it is also possible to form an insulating layer by dispersing particles of an insulating material in a binder. The binder material may be formed using a material and method similar to those of the binder contained in the electroluminescent layer. Although the thickness of such an insulating layer is not particularly limited, it is preferably in the range of 10 to 1000 nm.

The light-emitting element shown in this embodiment mode emits light when a voltage is applied between the pair of electrode layers which sandwich the electroluminescent layer, and can be operated by either DC driving or AC driving.

This embodiment mode can be combined with any of Embodiment Modes 1 to 3 as appropriate.

With the use of the present invention, a semiconductor device with high performance and high reliability can be manufactured with high productivity.

Embodiment Mode 6

Embodiment Mode 6 will describe structures of a backlight. A backlight is provided in a semiconductor device having a liquid crystal element as shown in Embodiment Mode 2 as a backlight unit having a light source. In the backlight unit, the light source is surrounded by a reflector plate so that light is scattered efficiently.

Figure 14A:
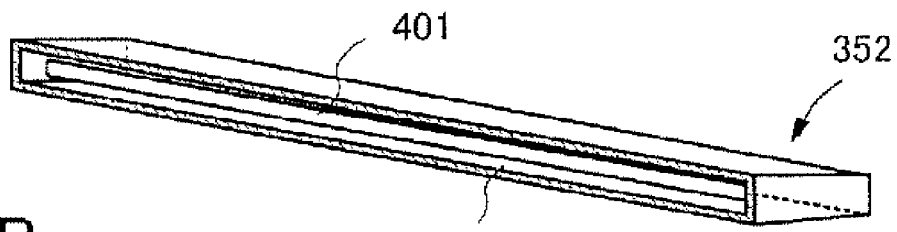
FIGS. 14A to 14D show lighting devices which can be applied to the present invention.

As shown in FIG. 14A, a cold cathode tube 401 can be used as a light source in a backlight unit 352. In order to reflect light from the cold cathode tube 401 efficiently, a lamp reflector 332 can be provided. In many cases, the cold cathode tube 401 is used for a large-sized semiconductor device because of the intensity of the luminance from the cold cathode tube. Therefore, the backlight unit having a cold cathode tube can be used for a display of a personal computer.

Figure 14B:
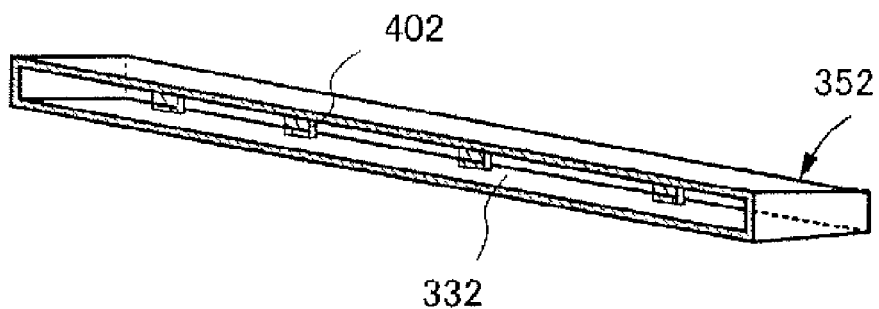

As shown in FIG. 14B, light-emitting diodes (LEDs) 402 can be used as a light source in the backlight unit 352. For example, light-emitting diodes (W) 402 emitting light of a white color are arranged at predetermined intervals. In order to reflect light from the light-emitting diodes (W) 402 efficiently, the lamp reflector 332 can be provided.

Figure 14C:
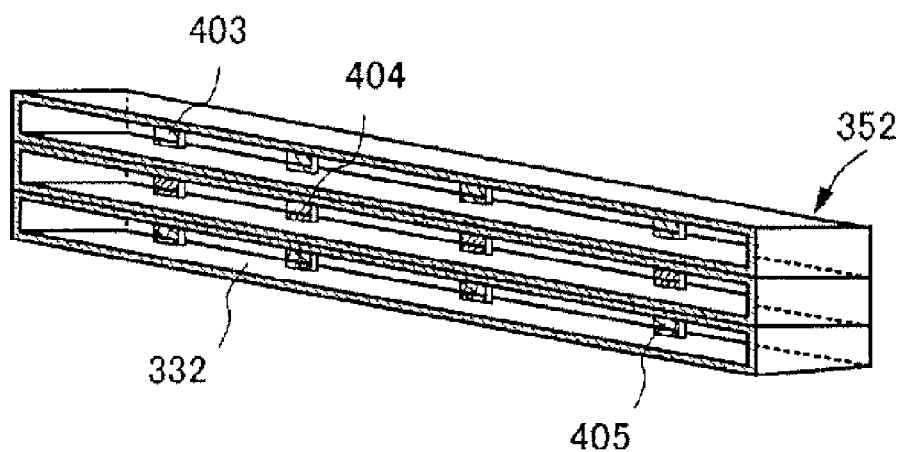

As shown in FIG. 14C, light-emitting diodes (LEDs) 403, 404, and 405 emitting light of colors of RGB can be used as a light source in the backlight unit 352. When the light-emitting diodes (LEDs) 403, 404, and 405 emitting light of colors of RGB are used, color reproducibility can be enhanced compared to the case where only the light-emitting diodes (LEDs) 402 emitting light of a white color are used. In order to reflect light from the light-emitting diodes efficiently, the lamp reflector 332 can be provided.

Figure 14D:
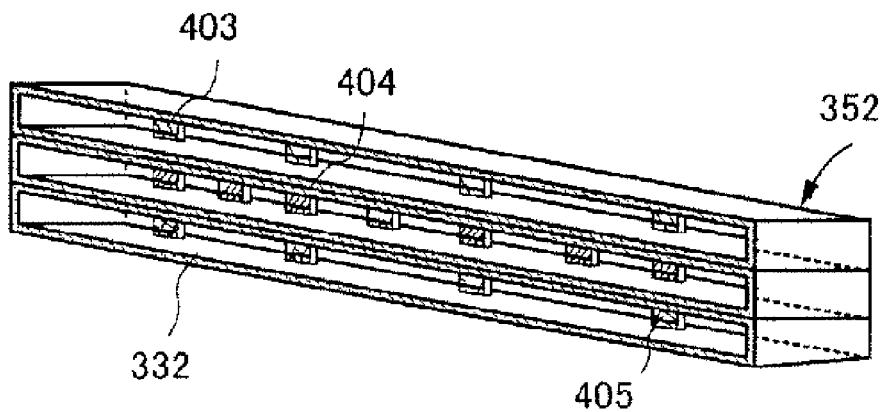

As shown in FIG. 14D, when the light-emitting diodes (LEDs) 403, 404, and 405 emitting light of colors of RGB are used as a light source, it is not necessary that the number and arrangement thereof are the same. For example, more light-emitting diodes emitting light of a color that has low light-emitting intensity (such as green) may be arranged than light-emitting diodes emitting light of other colors.

Furthermore, the light-emitting diodes 402 emitting light of a white color may be combined with the light-emitting diodes (LEDs) 403, 404, and 405 emitting light of colors of RGB.

When a field sequential mode is applied in a case of using the light-emitting diodes of RGB, color display can be performed by sequentially lighting the light-emitting diodes of RGB in accordance with the time.

The light-emitting diode is suitable for a large-sized semiconductor device because the luminance thereof is high. In addition, color reproducibility of the light-emitting diode is superior to that of a cold cathode tube because the color purity of each color of RGB is favorable, and an area required for arrangement can be reduced. Therefore, a narrower frame can be achieved when the light-emitting diode is applied to a small-sized semiconductor device.

Further, a light source does not need to be provided as the backlight units as shown in FIGS. 14A to 14D. For example, when a backlight having light-emitting diodes is mounted on a large-sized semiconductor device, the light-emitting diodes can be arranged on the back side of a substrate. In this case, the light-emitting diodes of each color can be arranged in order at predetermined intervals. Color reproducibility can be enhanced by the arrangement of the light-emitting diodes.

Therefore, by using the present invention, a semiconductor device using such a backlight and having high performance and high reliability can be manufactured with high productivity A backlight having a light-emitting diode is particularly suitable for a large-sized semiconductor device, and a high-quality image can be provided even in a dark place by enhancement of the contrast ratio of the large-sized semiconductor device.

This embodiment mode can be combined with Embodiment Mode 2 as appropriate.

Embodiment Mode 7

A television device can be completed using a semiconductor device which includes a display element and is formed by the present invention. An example of a television device having high performance and high reliability will be described.

Figure 23:
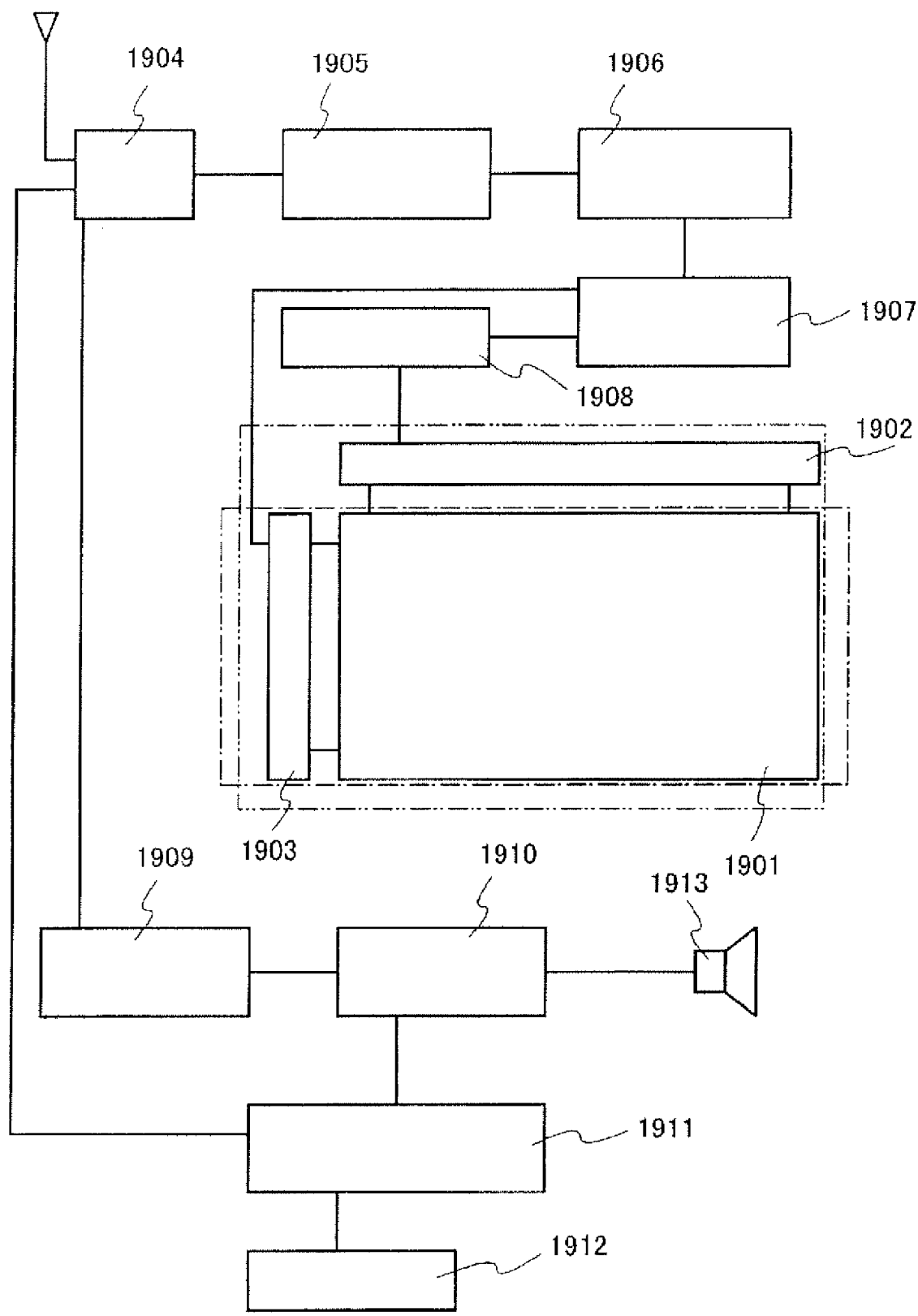
FIG. 23 is a block diagram showing a main structure of an electronic device to which the present invention is applied.

FIG. 23 is a block diagram showing a main configuration of a television device (a liquid crystal television device or an EL television device). A display panel can have various structures: a structure like FIG. 16B in which TFTs are formed, a pixel region 1901 and a scanning line drive circuit 1903 are formed over the same substrate, and a signal line drive circuit 1902 is separately formed as a driver IC; a structure like FIG. 16C in which the pixel region 1901, the signal line drive circuit 1902, and the scanning line drive circuit 1903 are formed over the same substrate; and the like.

As for the structures of other external circuits, a video signal amplifier circuit 1905 for amplifying video signals among signals received at a tuner 1904, a video signal processing circuit 1906 for converting signals output from the video signal amplifier circuit 1905 into color signals corresponding to red, green and blue, a control circuit 1907 for converting the video signals into an input specification of the driver ICs, and the like are provided on the input side of the video signals. The control circuit 1907 outputs signals to each of the scanning line side and the signal line side. In the case of digital driving, a signal divider circuit 1908 may be provided on the signal line side so that input digital signals can be divided into m pieces to be supplied.

Audio signals among the signals received at the tuner 1904 are transmitted to an audio signal amplifier circuit 1909, and an output thereof is supplied to a speaker 1913 through an audio signal processing circuit 1910. A control circuit 1911 receives control data on the receiving station (reception frequency) or sound volume from an input portion 1912, and transmits signals to the tuner 1904 and the audio signal processing circuit 1910.

Figure 20A:
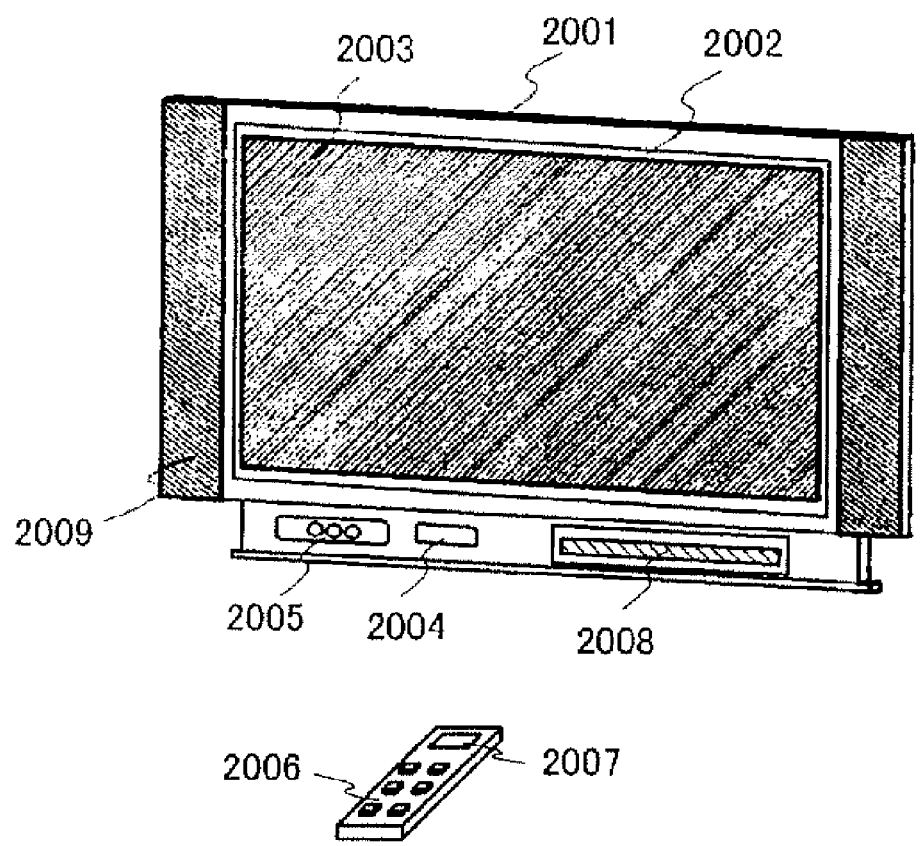
FIGS. 20A and 20B show electronic devices to which the present invention is applied.
Figure 20B:
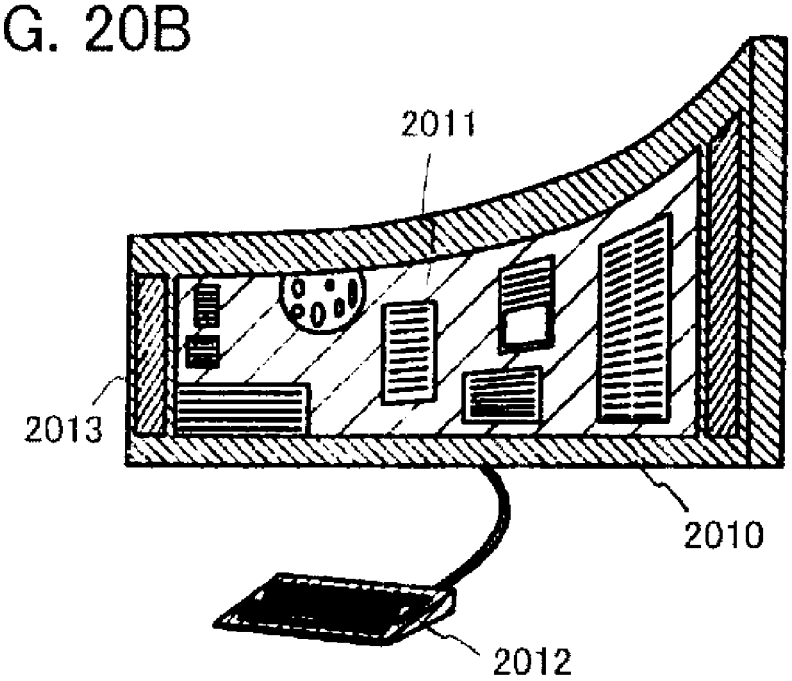

By incorporating a display module into a housing as shown in FIGS. 20A and 20B, a television device can be completed. A display panel in which components up to an FPC are set as shown in FIGS. 8A and 8B is generally called an EL display module. When an EL display module as shown in FIGS. 8A and 8B is used, an EL television device can be completed, and when a liquid crystal display module as shown in FIGS. 7A and 7B is used, a liquid crystal television device can be completed. Using a display module, a main display screen 2003 can be formed, and other accessories such as speaker portions 2009 and operation switches are provided. In this manner, a television device can be completed according to the present invention.

In addition, reflected light of incident light from external may be blocked with the use of a retardation plate or a polarizing plate. In a top-emission display device, an insulating layer serving as a partition wall may be colored to be used as a black matrix. This partition wall can also be formed by a droplet discharge method or the like. Carbon black or the like may be mixed into a black resin of a pigment material or a resin material such as polyimide, or a stacked layer thereof may be used. By a droplet discharge method, different materials may be discharged to the same region plural times to form the partition wall. A quarter wave plate ($\lambda/4$) or a half wave plate ($\lambda/2$) may be used as the retardation plate and may be designed to be able to control light. As the structure, the light-emitting element, the sealing substrate (sealant), the retardation plates (a quarter wave plate ($\lambda/4$) and a half wave plate ($\lambda/2$)), and the polarizing plate are formed over a TFT element substrate in this order, and light emitted from the light-emitting element is transmitted therethrough and is emitted to the outside from the polarizing plate side. The retardation plate or the polarizing plate may be provided on a side to which light is emitted or may be provided on both sides in the case of a dual-emission semiconductor device in which light is emitted from the both sides. In addition, an antireflective film may be provided on the outer side of the polarizing plate. Accordingly, high-definition and precise images can be displayed.

A display panel 2002 using a display element is incorporated into a housing 2001 as shown in FIG. 20A. In addition to reception of general TV broadcast with the use of a receiver 2005, communication of information can also be performed in one way (from a transmitter to a receiver) or in two ways (between a transmitter and a receiver or between receivers) by connection to a wired or wireless communication network through a modem 2004. The television device can be operated with switches incorporated in the housing or with a remote control device 2006 separated from the main body. A display portion 2007 that displays information to be output may also be provided for this remote control device.

In addition, for the television device, a structure for displaying a channel, sound volume, or the like may be additionally provided by formation of a sub-screen 2008 with a second display panel in addition to the main screen 2003. In this structure, the main screen 2003 may be formed using an EL display panel superior in viewing angle, and the sub-screen 2008 may be formed using a liquid crystal display panel capable of displaying with low power consumption. In order to prioritize low power consumption, a structure in which the main screen 2003 is formed using a liquid crystal display panel, the sub-screen 2008 is formed using an EL display panel, and the sub-screen is able to flash on and off may be employed. By the present invention, a semiconductor device with high performance and high reliability can be manufactured with high productivity even with the use of a large-sized substrate with a number of TFTs and electronic components.

FIG. 20B shows a television device which has a large display portion, for example, 20-inch to 80-inch display portion and includes a housing 2010, a keyboard portion 2012 which is an operation portion, a display portion 2011, a speaker portion 2013, and the like. The present invention is applied to manufacture of the display portion 2011. The display portion in FIG. 20B is formed using a bendable material; therefore, the television device includes the bent display portion. Since the shape of the display portion can be freely set, a television device having a desired shape can be manufactured.

In accordance with the present invention, a semiconductor device with high performance and high reliability which has a display function can be manufactured in high productivity. Therefore, a television device with high performance and high reliability can be manufactured with high productivity.

The present invention is certainly not limited to the television device and is also applicable to various uses such as a monitor of a personal computer and a display medium having a large area, for example, an information display board at a train station, an airport, or the like, or an advertisement display board on the street.

Embodiment Mode 8

Embodiment Mode 8 will describe an example of a semiconductor device having high performance and high reliability. Specifically, as examples of the semiconductor device, examples of a microprocessor and a semiconductor device which has an arithmetic function and can transmit and receive data without contact are described.

Figure 17:
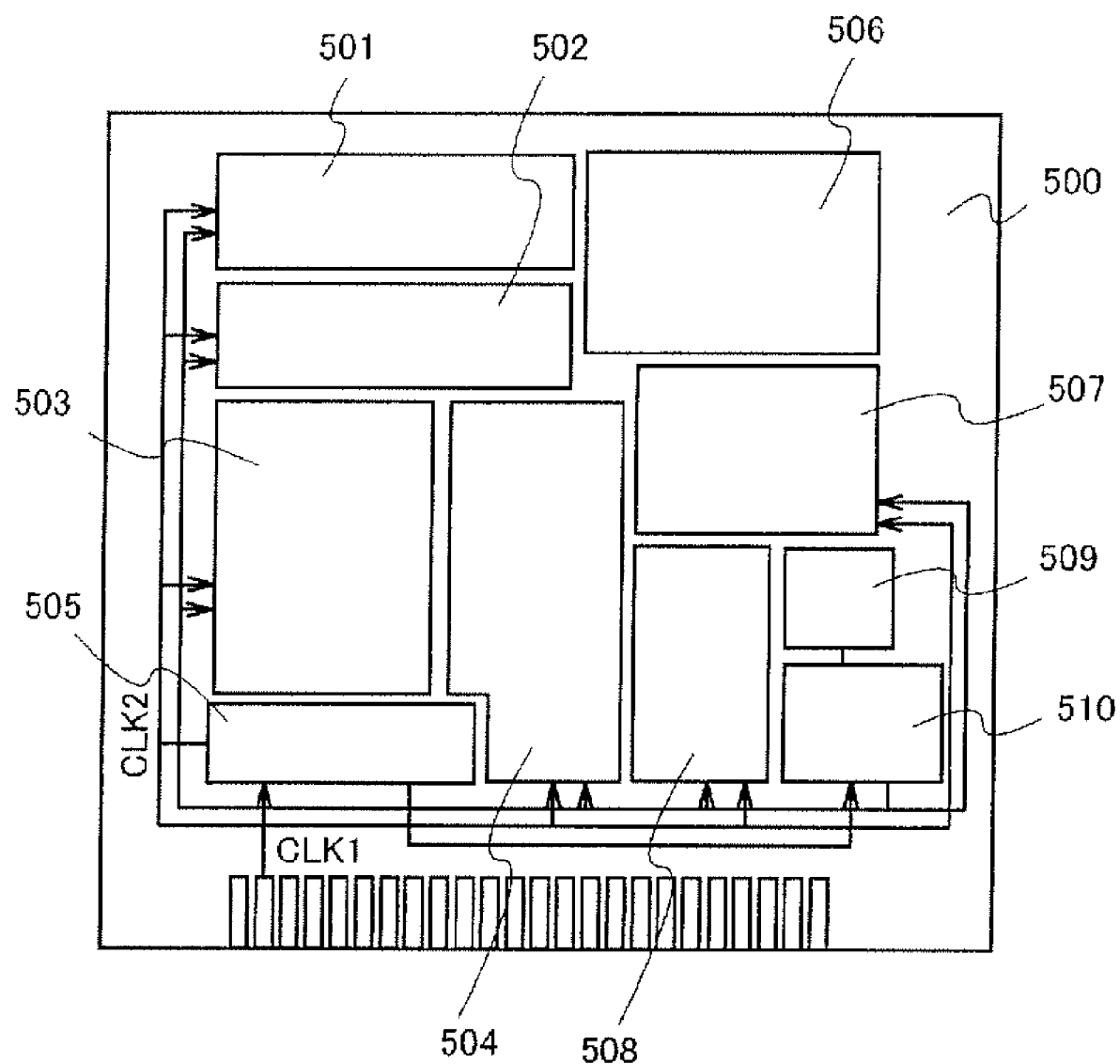
FIG. 17 is a block diagram showing a structure of a microprocessor obtained using a semiconductor substrate.

FIG. 17 shows a structure of a microprocessor 500 that can be obtained using a semiconductor substrate of the present invention as an example of a semiconductor device. As described above, the microprocessor 500 is manufactured using the semiconductor substrate of the present invention. This microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 generates a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads/writes data from/to the register 506 in accordance with the state of the microprocessor. The timing controller 505 generates signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the clock signal CLK2 to each of the above-mentioned circuits. It is to be noted that the microprocessor 500 shown in FIG. 17 is just an example of the simplified structure, and practical microprocessors have various structures depending on usage.

Since an integrated circuit is formed using a single-crystalline semiconductor layer (LTSS layer) whose crystals are oriented in a certain direction and which is bonded to a glass substrate in the microprocessor 500, higher processing speed and lower power consumption can be achieved.

Figure 18:
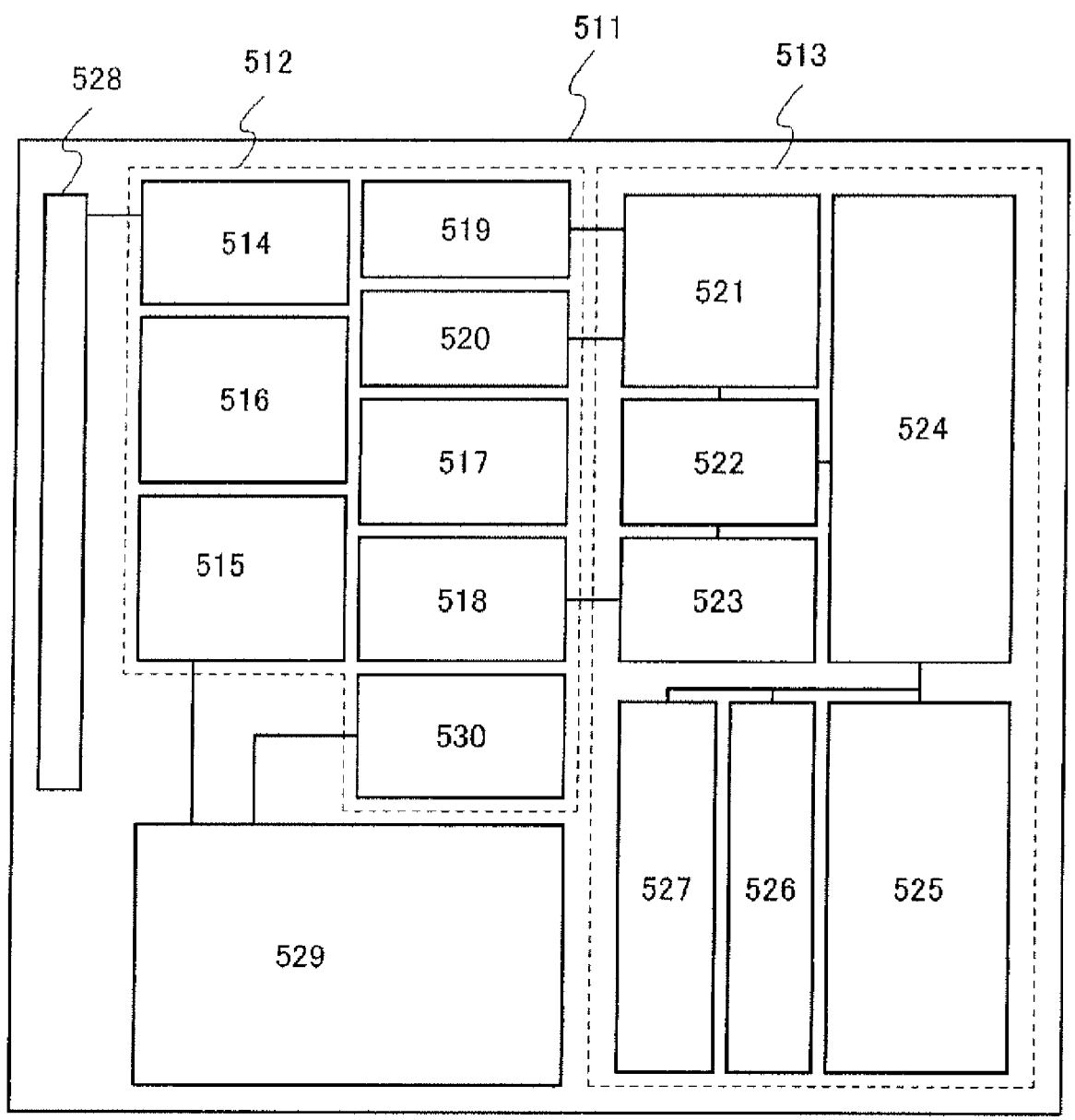
FIG. 18 is a block diagram showing a structure of an RFCPU obtained using a semiconductor substrate.

Next, a structure of an RFCPU obtained by using the semiconductor substrate of the present invention will be described as an example of a semiconductor device which has an arithmetic function and can transmit and receive data without contact, with reference to FIG. 18. FIG. 18 shows an example of a computer (hereinafter also referred to as an RFCPU) which transmits and receives signals to/from an external device by wireless communication. An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, an interface (CPU interface) 524, a central processing unit (CPU) 525, a random access memory (RAM) 526, and a read only memory (ROM) 527.

The operation of the RFCPU 511 having such a structure is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate having an insulating surface that partially constitutes the RFCPU 511.

The reset circuit 517 generates a signal that resets the digital circuit portion 513 to be initialized. For example, the reset circuit 517 generates, as a reset signal, a signal that rises with delay after increase in the power supply voltage. The oscillator circuit 518 changes the frequency and the duty ratio of a clock signal in accordance with a control signal generated by the constant voltage circuit 516. The demodulation circuit 519 having a low pass filter, for example, binarizes changes in amplitude of reception signals of an amplitude shift keying (ASK) system. The modulation circuit 520 changes the amplitude of transmission signals of an amplitude shift keying (ASK) system to be transmitted. The modulation circuit 520 changes the resonance point of the resonance circuit 514, thereby changing the amplitude of communication signals. The clock controller 523 generates a control signal for changing the frequency and the duty ratio of the clock signal in accordance with the power supply voltage or current consumption in the central processing unit 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the interface 524. The interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an OS (operating system) and a program is read at the time of starting operation and then executed. Alternatively, a method may be employed in which a circuit dedicated to arithmetic is formed as an arithmetic circuit and an arithmetic processing is conducted using hardware. In a method in which both hardware and software are used, a method can be employed in which a part of process is conducted in the circuit dedicated to arithmetic and the other part of the arithmetic process is conducted by the central processing unit 525 using a program.

Since an integrated circuit is formed using a single-crystalline semiconductor layer (LTSS layer) whose crystals are oriented in a certain direction and which is bonded to a glass substrate in the RFCPU 511, higher processing speed and lower power consumption can be achieved. Accordingly, even when the capacitor portion 529 which supplies electric power is miniaturized, long-term operation can be secured.

Embodiment Mode 9

Embodiment Mode 9 will be described with reference to FIGS. 21A and 21B. This embodiment mode shows an example of a module using a panel including the semiconductor device manufactured in Embodiment Modes 1 to 8. In this embodiment mode, an example of a module including a semiconductor device having high performance and high reliability will be described.

Figure 21A:
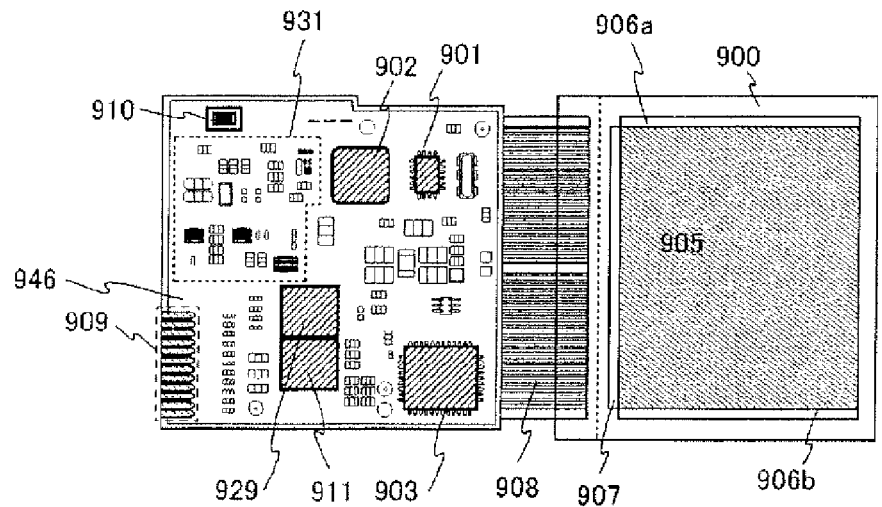
FIGS. 21A and 21B show an electronic device to which the present invention is applied.

A module of an information terminal shown in FIG. 21A includes a printed wiring board 946 on which a controller 901, a central processing unit (CPU) 902, a memory 911, a power supply circuit 903, an audio processing circuit 929, a transmission/reception circuit 931, and other elements such as a resistor, a buffer, and a capacitor are mounted. In addition, a panel 900 is connected to the printed wiring board 946 through a flexible printed circuit (FPC) 908.

The panel 900 is provided with a pixel region 905 having a light-emitting element in each pixel, a first scanning line drive circuit 906a and a second scanning line drive circuit 906b which select a pixel included in the pixel region 905, and a signal line drive circuit 907 which supplies a video signal to the selected pixel.

Various control signals are input and output through an interface (I/F) 909 provided over the printed wiring board 946. An antenna port 910 for transmitting and receiving signals to/from an antenna is provided over the printed wiring board 946.

In this embodiment mode, the printed wiring board 946 is connected to the panel 900 through the FPC 908; however, the present invention is not limited to this structure. The controller 901, the audio processing circuit 929, the memory 911, the CPU 902, or the power supply circuit 903 may be directly mounted on the panel 900 by a COG (chip on glass) method. Moreover, various elements such as a capacitor and a buffer are provided over the printed wiring board 946, so that a noise in power supply voltage or a signal and delay in signal rising are prevented.

Figure 21B:
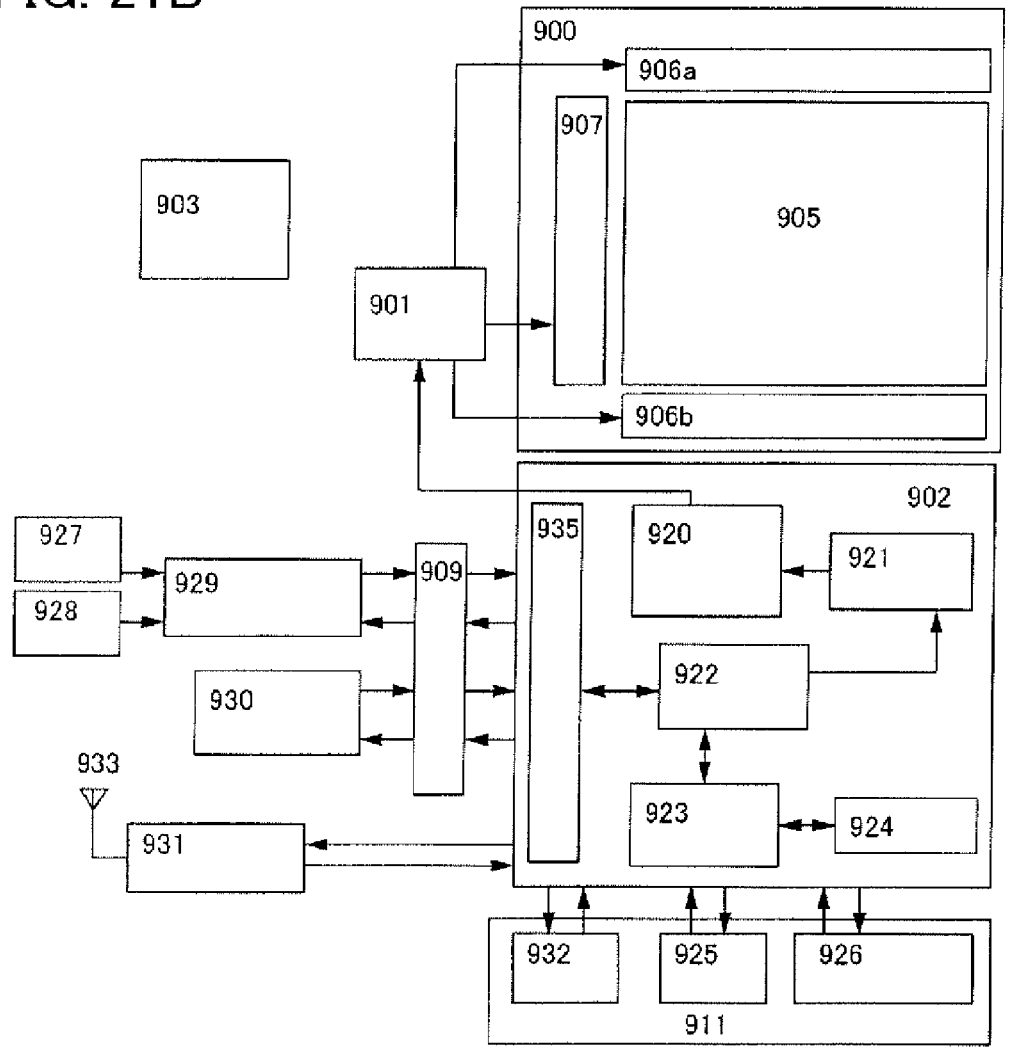

FIG. 21B is a block diagram of the module shown in FIG. 21A. A module 999 includes a VRAM 932, a DRAM 925, a flash memory 926, and the like in the memory 911. The VRAM 932 stores image data to be displayed on the panel, the DRAM 925 stores image data or audio data, and the flash memory stores various programs.

The power supply circuit 903 generates power supply voltage applied to the panel 900, the controller 901, the CPU 902, the audio processing circuit 929, the memory 911, and the transmission/reception circuit 931. Moreover, depending on the specifications of the panel, a current source is provided in the power supply circuit 903 in some cases.

The CPU 902 includes a control signal generating circuit 920, a decoder 921, a register 922, an arithmetic circuit 923, a RAM 924, an interface 935 for the CPU, and the like. Various signals input to the CPU 902 through the interface 935 are input to the arithmetic circuit 923, the decoder 921, and the like after once being held in the register 922. The arithmetic circuit 923 carries out an arithmetic operation based on the input signal and specifies an address to which various instructions are sent. On the other hand, the signal input to the decoder 921 is decoded and input to the control signal generating circuit 920. The control signal generating circuit 920 generates a signal including various instructions based on the input signal and sends it to the address specified by the arithmetic circuit 923, specifically, the memory 911, the transmission/reception circuit 931, the audio processing circuit 929, the controller 901, and the like.

The memory 911, the transmission/reception circuit 931, the audio processing circuit 929, and the controller 901 operate in accordance with respective instructions received. The operations will be briefly explained below.

The signal input from an input unit 930 is transmitted to the CPU 902 mounted on the printed wiring board 946 through the interface 909. The control signal generating circuit 920 converts the image data stored in the VRAM 932 into a predetermined format in accordance with the signal transmitted from the input unit 930 such as a pointing device and a keyboard, and then transmits it to the controller 901.

The controller 901 processes a signal including image data transmitted from the CPU 902 in accordance with the specifications of the panel and supplies it to the panel 900. The controller 901 generates a Hsync signal, a Vsync signal, a clock signal CLK, alternating voltage (AC Cont), and a switching signal L/R based on the power supply voltage input from the power supply circuit 903 and various signals input from the CPU 902 and supplies them to the panel 900.

In the transmission/reception circuit 931, a signal transmitted and received as an electric wave at the antenna 933 is processed. Specifically, high frequency circuits such as an isolator, a band path filter, a VCO (voltage controlled oscillator), an LPF (low pass filter), a coupler, and a balun are included. Among the signals transmitted and received at the transmission/reception circuit 931, signals including audio data are transmitted to the audio processing circuit 929 in accordance with an instruction transmitted from the CPU 902.

The signals including audio data transmitted in accordance with the instruction from the CPU 902 are demodulated into audio signals in the audio processing circuit 929 and transmitted to a speaker 928. The audio signal transmitted from a microphone 927 is modulated in the audio processing circuit 929 and transmitted to the transmission/reception circuit 931 in accordance with the instruction from the CPU 902.

The controller 901, the CPU 902, the power supply circuit 903, the audio processing circuit 929, and the memory 911 can be incorporated as a package of this embodiment mode. This embodiment mode is applicable to any circuit other than high frequency circuits such as an isolator, a band path filter, a VCO (voltage controlled oscillator), an LPF (low pass filter), a coupler, and a balun.

Embodiment Mode 10

Figure 22:
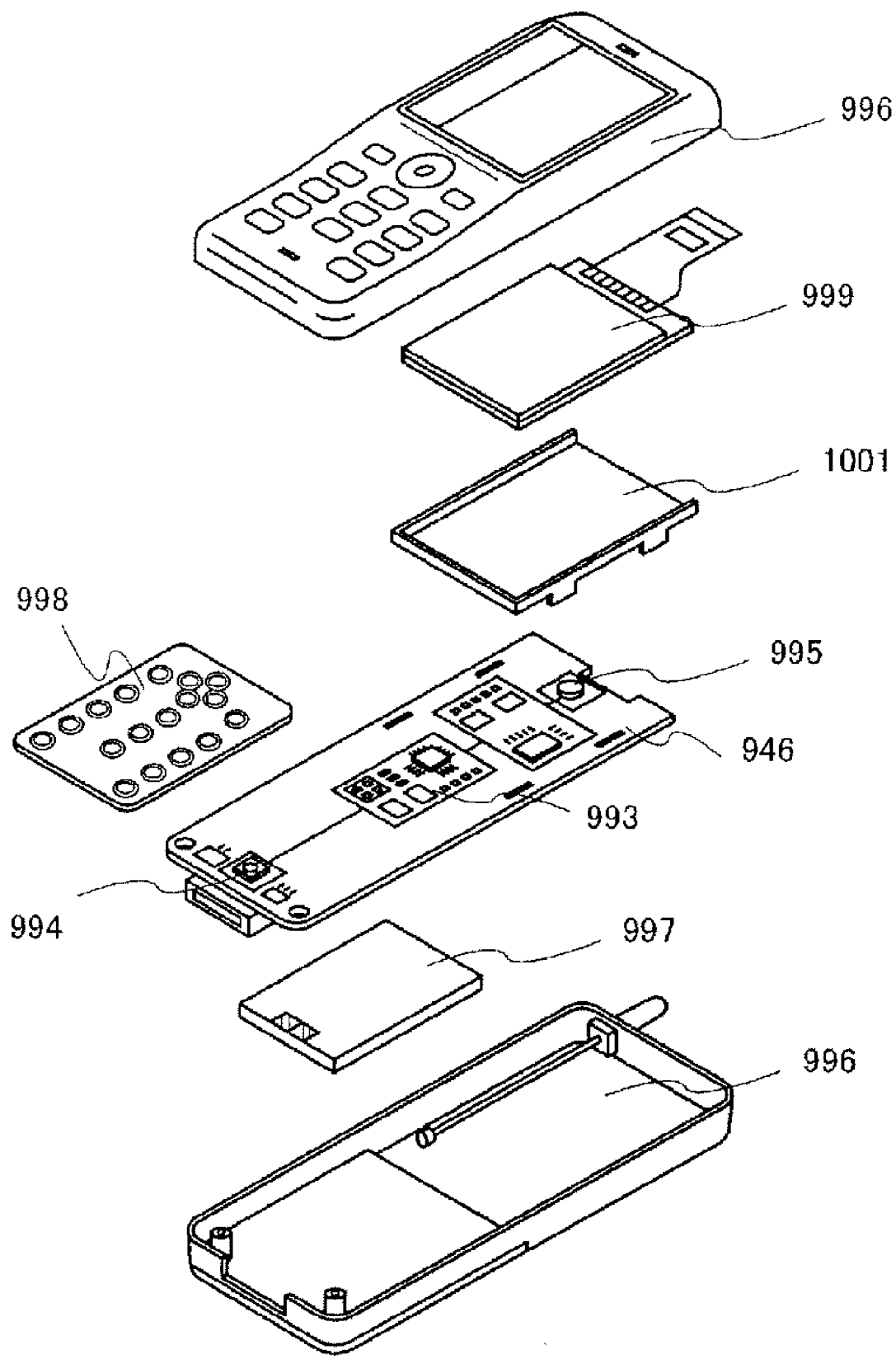
FIG. 22 shows an electronic device to which the present invention is applied.

Embodiment Mode 10 will be described with reference to FIGS. 21A and 21B and 22. FIG. 22 shows one mode of a portable compact phone (mobile phone) which includes the module manufactured in Embodiment Mode 9 and operates wirelessly. The panel 900 is detachably incorporated into a housing 1001 so as to be easily combined with the module 999. The shape and the size of the housing 1001 can be appropriately changed in accordance with an electronic device incorporated therein.

The housing 1001 in which the panel 900 is fixed is fitted to the printed wiring board 946 and set up as a module. A controller, a CPU, a memory, a power supply circuit, and other elements such as a resistor, a buffer, and a capacitor are mounted on the printed wiring board 946. Moreover, an audio processing circuit including a microphone 994 and a speaker 995 and a signal processing circuit 993 such as a transmission/reception circuit are provided. The panel 900 is connected to the printed wiring board 946 through the FPC 908.

The module 999, an input unit 998, and a battery 997 are stored in a housing 996. The pixel region of the panel 900 is arranged so that it can be seen through a window formed in the housing 996.

The housing 996 shown in FIG. 22 is an example of an exterior shape of a telephone. However, an electronic device of this embodiment mode can be changed into various modes in accordance with functions and intended purposes. In the following embodiment mode, examples of the modes will be explained.

Embodiment Mode 11

By applying the present invention, various semiconductor devices having a display function can be manufactured. In other words, the present invention is applicable to various electronic devices in which these semiconductor devices having a display function are incorporated into display portions. In this embodiment mode, examples of electronic devices including a semiconductor device having performance and high reliability will be described.

As electronic devices of the present invention, television devices (also simply referred to as televisions or television receivers), cameras such as digital cameras or digital video cameras, mobile phone sets (also simply referred to as mobile phones or cell-phones), portable information terminals such as PDAs, portable game machines, monitors for computers, computers, audio reproducing devices such as car audio systems, image reproducing devices provided with a recording medium such as home game machines (specifically, a digital versatile disc (DVD)), and the like can be given. Specific examples thereof will be explained with reference to FIGS. 19A to 19E.

Figure 19A:
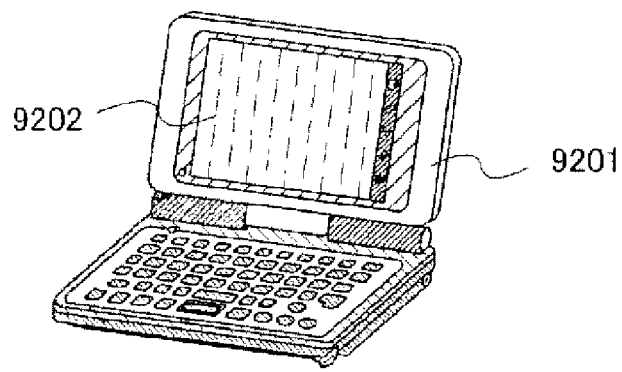
FIGS. 19A to 19E show electronic devices to which the present invention is applied.

A portable information terminal shown in FIG. 19A includes a main body 9201, a display portion 9202, and the like. The semiconductor device of the present invention is applicable to the display portion 9202. Accordingly, a portable information terminal with high performance and high reliability can be provided.

Figure 19B:
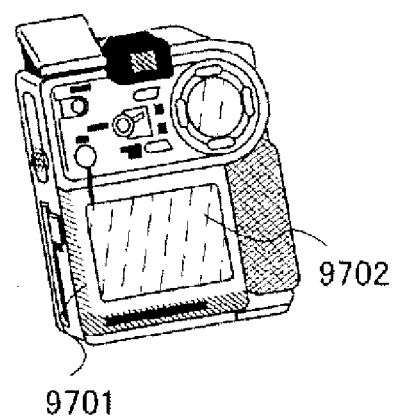

A digital video camera shown in FIG. 19B includes a display portion 9701, a display portion 9702, and the like. The semiconductor device of the present invention is applicable to the display portion 9701. Accordingly, a digital video camera with high performance and high reliability can be provided.

Figure 19C:
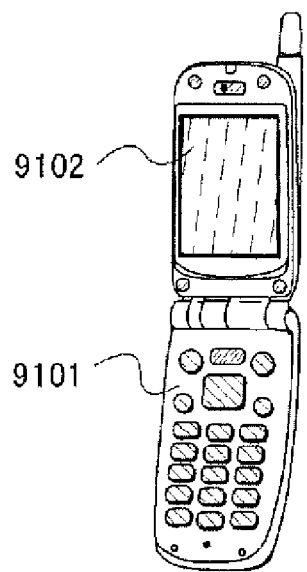

A mobile phone shown in FIG. 19C includes a main body 9101, a display portion 9102, and the like. The semiconductor device of the present invention is applicable to the display portion 9102. Accordingly, a mobile phone with high performance and high reliability can be provided.

Figure 19D:
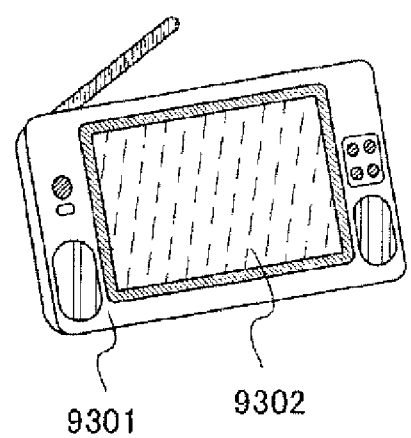

A portable television device shown in FIG. 19D includes a main body 9301, a display portion 9302, and the like. The semiconductor device of the present invention is applicable to the display portion 9302. Accordingly, a portable television device with high performance and high reliability can be provided. The semiconductor device of the present invention is applicable to various types of television devices including a small-sized television incorporated in a portable terminal such as a mobile phone, a medium-sized television that is portable, and a large-sized television (e.g., 40 inches or more in size).

Figure 19E:
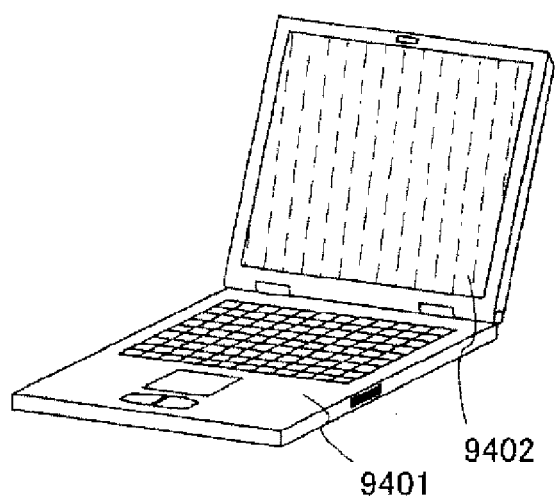

A portable computer shown in FIG. 19E includes a main body 9401, a display portion 9402, and the like. The semiconductor device of the present invention is applicable to the display portion 9402. Accordingly, a portable computer with high performance and high reliability can be provided.

In this manner, by using the semiconductor device of the present invention, electronic devices with high performance and high reliability can be provided.

This application is based on Japanese Patent Application serial no. 2007-120186 filed with Japan Patent Office on Apr. 27, 2007, the entire contents of which are hereby incorporated by reference.

What is claimed is:

1. A manufacturing method of a semiconductor device, comprising:
   conducting a first heat treatment to a glass substrate;
   forming a separation layer at a predetermined depth from a surface of a single-crystalline semiconductor substrate;
   forming a silicon oxide film over the single-crystalline semiconductor substrate by chemical vapor deposition;
   superposing the single-crystalline semiconductor substrate and the glass substrate to which the first heat treatment is conducted on each other with the silicon oxide film interposed therebetween and bonding the single-crystalline semiconductor substrate to the glass substrate;
   conducting a second heat treatment at a temperature close to a strain point of the glass substrate with the single-crystalline semiconductor substrate and the glass substrate superposed on each other, to generate a crack at the separation layer; and
   separating the single-crystalline semiconductor substrate from the glass substrate so that a single-crystalline semiconductor layer remains on the glass substrate,
   wherein the first heat treatment is conducted at a temperature higher than that of the second heat treatment.

2. The manufacturing method of a semiconductor device according to claim 1, wherein after formation of the single-crystalline semiconductor layer over the glass substrate, a third heat treatment is conducted to the glass substrate and the single-crystalline semiconductor layer at a temperature lower than that of the first heat treatment.

3. The manufacturing method of a semiconductor device according to claim 1, wherein the silicon oxide film is formed over the single-crystalline semiconductor substrate by chemical vapor deposition using an organic silane gas.

4. The manufacturing method of a semiconductor device according to claim 3, wherein the organic silane gas is one selected from the group consisting of ethyl silicate, trimethylsilane, tetramethylsilane, tetramethylcyclotetrasiloxane, octamethylcyclotetrasiloxane, hexamethyldisilazane, triethoxysilane, and trisdimethylaminosilane.

5. The manufacturing method of a semiconductor device according to claim 1,
   wherein a temperature in formation of the silicon oxide film over the single-crystalline semiconductor substrate by chemical vapor deposition is such that an element introduced to form the separation layer is not separated, and
   wherein the second heat treatment is conducted at a temperature by which the element introduced to form the separation layer is separated.

6. The manufacturing method of a semiconductor device according to claim 1,
   wherein a temperature in formation of the silicon oxide film over the single-crystalline semiconductor substrate by chemical vapor deposition is equal to or less than 350° C., and
   wherein the second heat treatment is conducted at equal to or greater than 400° C.

7. A manufacturing method of a semiconductor device, comprising:
   conducting a first heat treatment to a glass substrate;
   forming a separation layer at a predetermined depth from a surface of a single-crystalline semiconductor substrate;
   forming a silicon oxide film over the single-crystalline semiconductor substrate by chemical vapor deposition;
   superposing the single-crystalline semiconductor substrate and the glass substrate to which the first heat treatment is conducted on each other with the silicon oxide film interposed therebetween and bonding the single-crystalline semiconductor substrate to the glass substrate;
   conducting a second heat treatment at a temperature in a range from minus 50° C. to plus 50° C. of a strain point of the glass substrate with the single-crystalline semiconductor substrate and the glass substrate superposed on each other, to generate a crack at the separation layer; and
   separating the single-crystalline semiconductor substrate from the glass substrate so that a single-crystalline semiconductor layer remains on the glass substrate,
   wherein the first heat treatment is conducted at a temperature higher than that of the second heat treatment.

8. The manufacturing method of a semiconductor device according to claim 7, wherein after formation of the single-crystalline semiconductor layer over the glass substrate, a third heat treatment is conducted to the glass substrate and the single-crystalline semiconductor layer at a temperature lower than that of the first heat treatment.

9. The manufacturing method of a semiconductor device according to claim 7, wherein the silicon oxide film is formed over the single-crystalline semiconductor substrate by chemical vapor deposition using an organic silane gas.

10. The manufacturing method of a semiconductor device according to claim 9, wherein the organic silane gas is one selected from the group consisting of ethyl silicate, trimethylsilane, tetramethylsilane, tetramethylcyclotetrasiloxane, octamethylcyclotetrasiloxane, hexamethyldisilazane, triethoxysilane, and trisdimethylaminosilane.

11. The manufacturing method of a semiconductor device according to claim 7,
wherein a temperature in formation of the silicon oxide film over the single-crystalline semiconductor substrate by chemical vapor deposition is such that an element introduced to form the separation layer is not separated, and
wherein the second heat treatment is conducted at a temperature by which the element introduced to form the separation layer is separated.

12. The manufacturing method of a semiconductor device according to claim 7,
wherein a temperature in formation of the silicon oxide film over the single-crystalline semiconductor substrate by chemical vapor deposition is equal to or less than 350° C., and
wherein the second heat treatment is conducted at equal to or greater than 400° C.

13. A manufacturing method of a semiconductor device, comprising:
conducting a first heat treatment to a glass substrate;
forming a separation layer at a predetermined depth from a surface of a single-crystalline semiconductor substrate;
forming a silicon oxide film over the single-crystalline semiconductor substrate by chemical vapor deposition;
superposing the single-crystalline semiconductor substrate and the glass substrate to which the first heat treatment is conducted on each other with the silicon oxide film interposed therebetween and bonding the single-crystalline semiconductor substrate to the glass substrate;
conducting a second heat treatment at a temperature equal to or greater than 580° C. and equal to or less than 680° C. with the single-crystalline semiconductor substrate and the glass substrate superposed on each other, to generate a crack at the separation layer; and
separating the single-crystalline semiconductor substrate from the glass substrate so that a single-crystalline semiconductor layer remains on the glass substrate,
wherein the first heat treatment is conducted at a temperature higher than that of the second heat treatment.

14. The manufacturing method of a semiconductor device according to claim 13, wherein after formation of the single-crystalline semiconductor layer over the glass substrate, a third heat treatment is conducted to the glass substrate and the single-crystalline semiconductor layer at a temperature lower than that of the first heat treatment.

15. The manufacturing method of a semiconductor device according to claim 13, wherein the silicon oxide film is formed over the single-crystalline semiconductor substrate by chemical vapor deposition using an organic silane gas.

16. The manufacturing method of a semiconductor device according to claim 15, wherein the organic silane gas is one selected from the group consisting of ethyl silicate, trimethylsilane, tetramethylsilane, tetramethylcyclotetrasiloxane, octamethylcyclotetrasiloxane, hexamethyldisilazane, triethoxysilane, and trisdimethylaminosilane.

17. The manufacturing method of a semiconductor device according to claim 13,
wherein a temperature in formation of the silicon oxide film over the single-crystalline semiconductor substrate by chemical vapor deposition is such that an element introduced to form the separation layer is not separated, and
wherein the second heat treatment is conducted at a temperature by which the element introduced to form the separation layer is separated.

18. The manufacturing method of a semiconductor device according to claim 13,
wherein a temperature in formation of the silicon oxide film over the single-crystalline semiconductor substrate by chemical vapor deposition is equal to or less than 350° C., and
wherein the second heat treatment is conducted at equal to or greater than 400° C.

* * * * *